(12) United States Patent
Hayashi et al.

(10) Patent No.: US 6,541,375 B1
(45) Date of Patent: *Apr. 1, 2003

(54) DC SPUTTERING PROCESS FOR MAKING SMOOTH ELECTRODES AND THIN FILM FERROELECTRIC CAPACITORS HAVING IMPROVED MEMORY RETENTION

(75) Inventors: Shinichiro Hayashi, Osaka (JP); Koji Arita, Colorado Springs, CO (US)

(73) Assignee: Matsushita Electric Industrial Co., Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 43 days.

(21) Appl. No.: 09/128,249

(22) Filed: Aug. 3, 1998

Related U.S. Application Data

(60) Provisional application No. 60/091,329, filed on Jun. 30, 1998.

(51) Int. Cl.$^7$ ................................................. H01L 21/44
(52) U.S. Cl. ........................................ 438/679; 438/686
(58) Field of Search ........................ 257/3; 204/298.01, 204/192.11; 438/679, 650, 686

(56) References Cited

U.S. PATENT DOCUMENTS

| | | | | |
|---|---|---|---|---|
| 4,354,910 A | * | 10/1982 | Rordorf | 204/192 |
| 4,719,442 A | * | 1/1988 | Bohara et al. | 338/25 |
| 4,943,362 A | * | 7/1990 | Schlamp et al. | 204/298.13 |
| 5,254,217 A | * | 10/1993 | Maniar et al. | 156/656 |
| 5,322,716 A | * | 6/1994 | Takahashi et al. | 427/535 |
| 5,478,610 A | * | 12/1995 | Desu et al. | 427/573 |
| 5,495,438 A | | 2/1996 | Omura | 365/145 |
| 5,500,386 A | * | 3/1996 | Matsumoto et al. | 438/396 |
| 5,519,234 A | | 5/1996 | Paz de Araujo et al. | 257/295 |

(List continued on next page.)

FOREIGN PATENT DOCUMENTS

| | | |
|---|---|---|
| EP | 0 415 750 A1 | 3/1991 |
| EP | 0 587 990 A2 | 3/1994 |
| EP | 0 766 319 A2 | 4/1997 |
| EP | 0 883 167 A2 | 12/1998 |
| JP | 5-251258 | 9/1993 |
| JP | 8-167702 | 6/1996 |
| JP | 9-97883 | 4/1997 |
| JP | 10-326755 | 12/1998 |

OTHER PUBLICATIONS

R.F. Bunshah, "Handbook of Deposition Technologies for Films and Coatings", 2nd Edition, Noyes Publications, NJ, USA, pp. 260–261, 1994.*

R.F. Bunshah, "Handbook of Deposition Technologies for Films and Coatings", 2nd Edition, Noyes Publications, NJ, USA, 1994.*

Ahn Et Al., "Preparation and Properties of (Ba,Sr)TiO3 Thin Films with Various Bottom Electrodes," Journal of the Korean Physical Society, p. S1513–S1516 (Feb., 1998).

Joo et al.; "Improvement of leakage currents of Pt/(Ba,Sr)TiO$_3$/Pt capacitors"; Appl. Phys. Lett. 70 (22); Jun. 2, 1997; pp. 3053 to 3055, inclusive.

Nakamura et al.; "Preparation of Pb(Zr,Ti)O$_3$ Thin Films on Ir and IrO$_2$ Electrodes"; Jpn. J. Appl. Phys. vol. 33 (1994) pt. 1, No. 9B; pp. 5207 to 5210, inclusive.

Smolenskii et al.; "Ferroelectrics and Related Materials"; vol. 3, Ferroelectricity and Related Phenomena; Gordon and Breach Science Publishers; pp. 670 to 733, inclusive.

*Primary Examiner*—Olik Chaundhuri
*Assistant Examiner*—Ginette Peralta
(74) *Attorney, Agent, or Firm*—Patton Boggs LLP

(57) ABSTRACT

A ferroelectric thin film capacitor has smooth electrodes permitting comparatively stronger polarization, less fatigue, and less imprint, as the ferroelectric capacitor ages. The smooth electrode surfaces are produced by DC reactive sputtering.

71 Claims, 32 Drawing Sheets

U.S. PATENT DOCUMENTS

| | | | |
|---|---|---|---|
| 5,539,279 A | 7/1996 | Takeuchi et al. | 365/145 |
| 5,592,409 A | 1/1997 | Nishimura et al. | 365/145 |
| 5,592,410 A | 1/1997 | Verhaeghe et al. | 365/145 |
| 5,600,587 A | 2/1997 | Koike | 365/145 |
| 5,612,229 A * | 3/1997 | Yoshida | 438/72 |
| 5,708,302 A | 1/1998 | Azuma et al. | |
| 5,728,603 A * | 3/1998 | Emesh et al. | 438/3 |
| 5,751,540 A | 5/1998 | Lee et al. | |
| 5,753,945 A * | 5/1998 | Chivukula et al. | 257/295 |
| 5,763,063 A * | 6/1998 | Pass et al. | 428/216 |
| 5,825,057 A * | 10/1998 | Watanabe et al. | 257/295 |
| 5,834,357 A | 11/1998 | Kang | |
| 5,835,314 A * | 11/1998 | Moodera et al. | 360/113 |
| 5,838,605 A * | 11/1998 | Bailey | 365/145 |
| 5,886,867 A * | 3/1999 | Chivukula et al. | 361/311 |
| 5,943,256 A * | 8/1999 | Shimizu et al. | 365/145 |
| 5,985,713 A * | 11/1999 | Bailey | 438/241 |

* cited by examiner

TEM OF SS10-7: 75% O₂

DC SPUTTERING PROCESS FOR MAKING SMOOTH ELECTRODES AND THIN FILM FERROELECTRIC CAPACITORS HAVING IMPROVED MEMORY RETENTION

This application relates back to U.S. Provisional Application No. 60/091,329, filed Jun. 30, 1998.

BACKGROUND OF THE INVENTION

1. Field of the Invention

The present invention pertains to methods and apparatus involving smooth electrodes and thin film ferroelectrics for use in integrated circuits. More particularly, a bottom electrode is DC-sputter deposited in a special carrier gas mixture to improve the memory retention characteristics of a ferroelectric capacitor.

2. Statement of the Problem

Thin film ferroelectric materials are used in a variety of nonvolatile random access memory devices. For example, U.S. Pat. No. 5,600,587 issued to Koike teaches a ferroelectric nonvolatile random access memory using memory cells consisting of a ferroelectric capacitor and a switching transistor. U.S. Pat. No. 5,495,438 issued to Omura teaches a ferroelectric memory that is formed of ferroelectric capacitors connected in parallel. The capacitors have ferroelectric materials of different coercive field values and, consequently, can use or store multi-value data. U.S. Pat. No. 5,592,409;issued to Nishimura et al. teaches a nonvolatile memory including a ferroelectric layer that is polarized by the impressed voltage between two gates. The polarization or memory storage state is read as a high or low current flow across the ferroelectric layer, which permits nondestructive readout. U.S. Pat. No. 5,539,279 issued to Takeuchi et al. teaches a high speed one transistor one capacitor ferroelectric memory that switches between two modes of operation including a dynamic random access memory ("DRAM") mode and a ferroelectric random access memory ("FERAM") mode.

Ferroelectric memories are nonvolatile because the ferroelectric materials polarize in the presence of an applied field and retain the polarization even after the applied field is removed. FIG. 1 depicts an ideal polarization hysteresis curve 100 for ferroelectric thin films. Side 102 of curve 100 is produced by measuring the charge on a ferroelectric capacitor while changing the applied field from a positive value to a negative value. Side 104 of curve 100 is produced by measuring the charge on the ferroelectric capacitor while changing the applied field E from a negative value to a positive value. The points $-E_c$ and $E_c$ are conventionally referred to as the coercive field that is required to bring polarization P to zero. Similarly, the remanent polarization Pr or –Pr is the polarization in the ferroelectric material at a zero field value. The Pr and –Pr values ideally have the same magnitude, but the values are most often different in practice. Thus, polarization measured as 2Pr is calculated by adding the absolute values of the actual Pr and –Pr values even though these values may differ in magnitude. The spontaneous polarization values Ps and –Ps are measured by extrapolating a linear distal end of the hysteresis loop, e.g., end 106, to intersect the polarization axis. In an ideal ferroelectric, Ps equals Pr, but these values differ in actual ferroelectrics due to linear dielectric and nonlinear ferroelectric behavior. A large, boxy, substantially rectangular central region 108 shows suitability for use as a memory by its wide separation between curves 102 and 104 with respect to both coercive field and polarization.

Ferroelectric memories are fast, dense, and nonvolatile. Even so, ferroelectric memories do not enjoy widespread commercial use, in part, because the polarization of a thin film ferroelectric material degrades with repeated use. Actual thin film ferroelectrics do not perform as ideal ferroelectrics. Deviation from the ideal behavior of FIG. 1 is observed as ferroelectric imprint and fatigue. These deviations are so common and severe that it is nearly impossible to find thin film ferroelectrics which meet commercial requirements. The best materials for integrated ferroelectric devices are switched using a coercive field that can be obtained from conventional integrated circuit operating voltages, i.e., three to five volts ("V"). The materials should have a very high polarization, e.g., one exceeding twelve to fifteen micro coulombs per square centimeter ("$\mu C/cm^2$") determined as 2Pr, to permit the construction of memories having sufficient densities. Polarization fatigue should be very low or nonexistent over hundreds of millions of switching cycles. Furthermore, the ferroelectric material should not imprint, i.e., the hysteresis curve should not shift to favor a positive or negative coercive field.

FIG. 2 depicts the effects of environmental stress on hysteresis curve 100. Curve 200 shows the effect of fatigue on curve 100. Fatigue reduces the separation between curves 102 and 104 defining central region 108. Central region 108 progressively becomes smaller and smaller with additional fatigue. This change in separation is primarily due to the creation of point charge defects arising in the ferroelectric material as a consequence of polarization switching together with the associated screening effect of the charge defects on the applied field. Thus, fatigue causes the ferroelectric material to wear out over time due to repeated polarization switching.

U.S. Pat. No. 5,519,234 issued to Araujo et al. teaches that the fatigue problem of curve 200 is substantially overcome by the use of layered superlattice materials, such as the "layered perovskite-like" materials described in Smolenskii et al. "Ferroelectrics and Related Materials," Gordon and Breach (1984). The use of thin film layered superlattice materials in integrated circuits was unknown prior to Dr. Araujo's work. The layered superlattice materials are reported to provide a thin film ferroelectric material wherein the polarization state may be switched up to at least $10^9$ times with less than thirty percent fatigue. This level of fatigue endurance provides a significant advance in the art because it is at least about three orders of magnitude better than the fatigue endurance of other ferroelectrics, e.g., lead zirconium titanate ("PZT") or lead lanthanum zirconium titanate ("PLZT"). Prior layered superlattice material work has been done primarily with the use of a Pt/Ti bottom electrode and layered superlattice material films on the order of 1800 Å thick. The titanium is used as an adhesion layer to prevent peeling of the electrode from the substrate.

According to section 15.3 of the Smolenskii book, the layered perovskite-like materials or layered superlattice materials can be classified under three general types:

(A) compounds having the formula $A_{m-1}Bi_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size, and $M=Ti^{4+}$, $Nb^{5+}$, $Ta^{5+}$, $Mo^{6+}$, $W^{6+}$, $Fe^{3+}$ and other ions that occupy oxygen octahedra;

(B) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (C) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii observed that the perovskite-like layers may have different thicknesses, depending on the value of m, and that the perovskite $AMO_3$ is in principal the limiting example of any type of layered perovskite-like structure with m=infinity. Smolenskii also noted that if the layer with minimum thickness (m=1) is denoted by P and the bismuth-oxygen layer is denoted by B, then the type I compounds may be described as . . . $BP_m BP_m$. . . . Smolenskii further noted that if m is a fractional number then the lattice contains perovskite-like layers of various thicknesses, and that all the known type I compounds are ferroelectrics.

Despite the tremendous improvements in low fatigue ferroelectrics attributable to layered superlattice materials, there remains an imprint problem that is typified by curve 202 of FIG. 2. Curve 202 shows that environmental stresses can imprint curve 100 by shifting it to the right or left. This imprinting occurs when the ferroelectric material is subjected to repetitive unidirectional voltage pulses. Some imprinting also occurs as a result of normal hysteresis switching, especially at a high temperature. The ferroelectric material retains a residual polarization or bias that shifts sides 102 and 104 in a positive or negative direction with respect to the applied field. Thus, curve 202 has been shifted in a positive direction 204 by repeated negative pulsing of a ferroelectric capacitor. A shift in the opposite direction could also occur due to repetitive pulsing by opposite voltage. This type of pulsing represents what happens to the ferroelectric materials as a consequence of repeated unidirectional voltage cycling, such as the sense operations in FERAMs. Imprint can be so severe that the ferroelectric material can no longer retain a polarization state corresponding to a logical 1 or 0 value, i.e., imprint degradation eventually makes the ferroelectric unsuitable for use in a memory.

U.S. Pat. No. 5,592,410 issued to Verhaeghe refers to the ferroelectric imprint phenomenon as 'compensation.' The '410 patent teaches that imprint can be reversed by pulsing voltage during the write cycle to return the hysteresis loop towards the unimprinted position of curve 100, as compared to curve 202. Thus, the imprint problem is reversed by special write operations in which the pulsed voltage is opposite the switching voltage. Despite the teaching of Verhaeghe '410, the reverse voltage pulsing does not address the entire problem because the imprint phenomenon is a partially irreversible one. The observed imprinting reflects corresponding changes in microstructure of the ferroelectric crystal, e.g., the creation of point charge defects with associated trapping of polarized crystal domains. Many of these microstructural changes are not reversible.

FIG. 3 depicts the deleterious effects of fatigue and imprinting on ferroelectric memory read/write control operations. Memory control logic circuits require a minimum polarization separation window, i.e., a programming window, which is represented by region 300. Region 300 must be large enough to produce a sufficient read-out charge for memory operations, e.g., for the operation of memory sense amplifier circuits. An initial 2Pr separation window 302 declines over the lifetime of the ferroelectric memory device along tracks 304 and 306 until, after about ten years or so of constant normal use, the separation between tracks 304 and 306 is too small for conducting memory operations. This lifetime of normal use follows stress time line 308. Curve 310 is a polarization hysteresis curve from the same material that produced curve 100, but is measured on decline at a point in time along tracks 304 and 306. The remanent polarization values Rms and Rmn correspond to +Pr and −Pr for the fatigued and imprinted material. Rms and Rmn are defined as remanent polarization at zero field in the fatigued and imprinted hysteresis curve 310. Arrow 312 shows a quantity of positive polarization retention loss, which is primarily due to fatigue. Arrow 314 shows a quantity of negative polarization retention loss, which is primarily caused by imprint shifting of curve 312 relative to curve 100. Arrow 316 shows a quantity of voltage center shifting of curve 312 relative to curve 100. This voltage center shifting indicates imprintation of the ferroelectric material.

Not all prior research efforts have focused upon the development of new ferroelectric materials to overcome the fatigue and imprint problems. Nakamura, "Preparation of $Pb(Zr, Ti)O_3$ Thin Films on Ir and $IrO_2$ Electrodes" 33 Jpn. J. Appl. Phys. 5207–5210 (September 1994), teaches the use of RF magnetron reactive sputtering to produce Pt, Ir and $IrO_2$ electrodes. The substrate temperature was held at 450° C. while the RF sputtering occurred,, and the films were subjected to a post-deposition anneal of 400° C. A PZT thin film was deposited atop the RF-sputter deposited bottom electrodes. The polarization ("Pr") of PZT on a conventional Pt/Ti electrode decreased by 50% after $10^8$ cycles. In comparison, a device including PZT between $IrO_2$ top and bottom electrodes fatigued only 5% after $10^8$ cycles. The article hypothesizes that the improvement in fatigue endurance was due to incompletely oxidized $IrO_2$, which partially reacted with the PZT at the electrode-ferroelectric boundary.

Oxygen carrier gasses have been used in RF-magnetron reactive sputtering to prevent accelerated sputtering gases from generating point charge defects by striking a dielectric thin film of barium strontium titanate. Joo et al., "Improvement of leakage currents of $Pt/(Ba,Sr)TiO_3/Pt$ capacitors", 70 Appl. Phys. Lett. 3053–3055 (June 1997) shows RF-magnetron reactive sputtering to deposit platinum top electrodes over thin film barium strontium titanate dielectric material. RF-magnetron deposition was performed using a mixed $Ar/O_2$ carrier gas. Oxygen ions in the carrier gas compensated oxygen vacancies in the barium strontium titanate dielectric to provide a significant reduction in leakage current. The RF-sputter deposited platinum had a columnar structure, which was believed to facilitate the transport of oxygen ions across the top platinum electrode. The use of oxygen carrier gas $Ar/O_2$ (35/15) for twenty seconds resulted in the deposition of a 5 nm thick platinum film, while the use of Ar gas alone for forty seconds resulted in the deposition of a 95 nm thick platinum film. Thus, the article determined that it was sufficient to reduce leakage current by introducing oxygen gas only at an initial stage of sputtering of the top electrode. The deposition rate could, accordingly, be enhanced in subsequent stages through the use of pure Ar carrier gas.

There remains a need to provide a bottom electrode structure for thin film ferroelectric layered superlattice material capacitors that improves the fatigue endurance of the layered superlattice materials and makes the layered superlattice materials substantially free of imprint. Furthermore, there is a need to improve sputtering processes by increasing the deposition rates of sputtered metals when a reactive carrier gas mixture is used in the sputtering chamber.

SOLUTION

It has been discovered that the imprint phenomenon represented as curve 202 in FIG. 2 is affected by surface irregularities on the ferroelectric film and defects in the ferroelectric film, e.g., those corresponding to hillocks on the bottom electrode in a thin film ferroelectric capacitor device or similar surface irregularities on the top of the ferroelectric film and clusters or porosity inclusions in the ferroelectric film. In particular, the prior art Pt/Ti bottom electrodes form sharp hillocks that are especially prone to increase the amount of imprinting and the prior art spun-on ferroelectric films include defects that are prone to degrade the fatigue endurance and memory retention. Thus, ferroelectric capacitors having electrodes with sharp irregularities offer inferior electronic performance in integrated memories. Furthermore, it has been discovered that the use of oxygen carrier gas while sputtering top electrodes can improve the fatigue endurance, polarization, memory retention, and imprint characteristics of thin film layered superlattice materials while at the same time yielding an essentially smooth top electrode.

The present invention overcomes the problems outlined above by providing a DC-magnetron reactive sputtering process that utilizes a reactive carrier gas mixture to yield electrodes that are essentially smooth or hillock-free. The smooth electrodes are used in combination with ferroelectrics, especially the layered superlattice materials. Ultra thin films of layered superlattice materials less than about 500 Å or 800 Å thick offer significant and surprising advantages in ferroelectric performance that have not previously been suspected.

The smooth electrodes are produced according to a novel DC sputtering process. A carrier gas mixture for use in the DC-sputter deposition includes a mixture of a noble gas and a reactive gas species for the sputtering of conductive metals and conductive metal oxides. The ferroelectric materials may be specially processed using liquid source misted chemical deposition ("LSMCD") and rapid thermal processing ("RTP") after deposition of the bottom electrode to present a similarly smooth surface for receipt of a top electrode on the ferroelectric layer. The LSMCD is the deposition technique to use a single stoichiometrically correct liquid precursor which has precisely controlled amounts of strontium-, bismuth-, tantalum-, and niobium-precursors to form strontium bismuth tantalum niobate film. After converting the liquid precursor into an aerosol, the atomize aerosol is injected, along with an inert carrier gas, into a vacuum chamber, and deposited evenly over a rotating substrate. The RTP is accomplished by conventional means using a halogen lamp or other high energy radiative thermal transfer device. The top electrode is also DC-magnetron-sputter deposited using a carrier gas mixture including a noble gas and a reactive gas species.

Reactive ionic species produced by the glow discharge of a DC-magnetron are available to compensate point charge defects that are formed by the impact of accelerated ions upon the substrate. The reactive gas species of the carrier gas mixture are preferably a gaseous species of a reagent that reacts to yield a preexisting material on the substrate or a material that will subsequently be deposited on the substrate. Alternatively, the reactive gas can be any gas that reacts to compensate lattice defects. For example, the charge reactive gas species are oxygen where the electrode is sputtered over a metal oxide, and the oxygen compensates oxygen defects. Similarly, the charge compensation portion is nitrogen where the electrode is sputtered over a nitride, or nitrogen may be used in an attempt to overcompensate oxygen defects in a metal oxide.

Where the DC-sputtered electrodes are used in combination with layered superlattice materials, the layered superlattice materials resist fatigue well and their conformity to the smooth bottom electrode improves their imprint performance in integrated ferroelectric memories, such as FERAMs. A corresponding reduction in point charge defects in the layered superlattice materials also improves the fatigue endurance and resistance to fatigue.

Smooth electrodes advantageously permit the use of increasingly thinner films of layered superlattice materials without shorting of the ferroelectric capacitors. The thin films show a surprising improvement in their memory retention windows because memory retention windows in the thinner materials can have a greater magnitude than exists in comparable thicker materials. One would expect just the opposite effect because a greater number of oriented ferroelectric domains in the thicker materials should provide a greater cumulative polarization effect, but this greater cumulative polarization effect is not observed in practice. Thus, the use of smooth electrodes and thin films permits the construction of much better ferroelectric memories.

A preferred thin film ferroelectric capacitor according to the present invention includes a bottom electrode having a first smooth surface, a ferroelectric thin film layered superlattice material without any clusters or porosity inclusions, and a top electrode having a second smooth surface. The most preferred layered superlattice materials are strontium bismuth tantalate and strontium bismuth niobium tantalate. The ferroelectric thin film layered superlattice material contacts the smooth surfaces of the electrodes and has a thickness ranging from 300 Å to 2500 Å. A smooth surface on one of the electrodes is hereby defined as one in which all surface irregularity features protruding towards the thin film ferroelectric layered superlattice material protrude a distance less than twenty percent of the thickness in the ferroelectric thin film layered superlattice material thickness. It is also preferred that substantially all of the surface irregularities on the smooth electrode are rounded and essentially free of acute angles. Another way of defining a smooth surface is that the surface is smoother, i.e., having surface irregularities that are less sharp, less tall, and less numerous, than the surface irregularities of a comparable 2000 Å/200 Å thick Pt/Ti stacked electrode deposited on silicon which has been annealed while exposed to oxygen at 700° C. to 800° C. for one hour.

Ferroelectric thin film layered superlattice materials for use in the invention typically have thicknesses ranging from 300 Å to 2500 Å. Thicknesses above this range are also useful, though they are seldom needed. A more preferred range of layered superlattice material thickness is from 300 Å to 1100 Å. This range is even more preferably from 400 Å to 1000 Å, and is most preferably from 500 Å to 800 Å. The prior art does not show layered superlattice materials having these small thicknesses, which are less than about 1300 Å.

Ferroelectric capacitors of the invention demonstrate superior electrical performance. For example, select ferroelectric thin film layered superlattice materials are capable of providing a 1.5 V polarization or charge separation window of at least 7 $\mu C/cm^2$ after being stored for a hundred hours at 75° C. These 75° C. storage is very severe, as compared to normal integrated circuit operating temperature and, consequently, tend to accelerate retention. The 7 $\mu C/cm^2$ separation window is sufficient for proper interaction with conventional integrated memory control logic circuits. The separation window increases as film thickness decreases down to about 300 Å. Layered superlattice material films thinner than about 300 Å crystallize differently and show porosity along grain or domain boundaries, which makes them unsuitable for use in ferroelectric capacitors.

Another aspect of superior electronic performance in the ferroelectric thin film layered superlattice materials according to the invention is superior resistance to imprintation. Select ferroelectric thin film layered superlattice materials demonstrate a hysteresis shift of less than 0.0163 V corresponding to the 3 V polarization separation window after $10^{10}$ cycles of 6 V square wave fatigue endurance switching, as described above.

Yet another aspect of superior electronic performance is the development of ultra thin ferroelectric layered superlattice material films that are essentially fatigue free. The use of smooth electrodes permits the use of ferroelectric thin films having less than about 2% of 2Pr degradation after being switched $10^{10}$ cycles using a 1 V triangular wave at 10,000 Hz. This exceptional ferroelectric performance comes from ultra thin films, e.g., those ranging from 300 Å to 1100 Å in thickness.

The smooth electrode structures can be produced through use of a DC glow discharge. In a preferred embodiment, the bottom electrode includes a platinum layer. This platinum layer is preferably deposited on an iridium layer. Other preferred bottom electrode structures produced using the DC glow discharge include a platinum layer deposited on an iridium oxide layer, a platinum layer deposited on a titanium nitride layer, a platinum layer deposited on a titanium oxide layer, a platinum layer deposited on a tantalum nitride layer, a platinum layer deposited on a tantalum oxide layer, a platinum layer deposited on a tungsten silicide layer, and a platinum layer deposited on a tungsten silicon nitride layer.

In other preferred embodiments, the platinum may be substituted by ruthenium in each of the above preferred embodiments to provide Ru, Ru/Ir, Ru/IrO$_2$, Ru/WSi, or Ru/WSiN electrodes.

In yet other preferred embodiments, the platinum may be substituted by iridium to provide Ir, Ir/IrO$_2$, Ir/WSi, or Ir/WSiN electrodes.

The process of making the ferroelectric capacitors includes careful control of thermal process conditions. A smooth bottom electrode is formed wherein substantially all surface irregularity features on a bottom electrode are rounded and essentially free of acute angles. This smoothness derives from a proper selection of electrode materials and anneal temperatures. For example, the need for smoothness requires the anneal to be performed at a temperature ranging from 180° C. to 500° C., and this temperature preferably does not exceed 450° C.

Ferroelectric capacitors for use in FeRAMs and the like are made using liquid precursors. A liquid precursor is deposited on the bottom electrode to provide a precursor film by conventional spin-on, more preferably by LSMCD. The precursor film is contains a plurality of metals that are capable of yielding a ferroelectric layered superlattice material upon drying and annealing of the precursor film. Drying of the precursor film is done at a temperature less than 400° C. to provide a dried precursor residue. The dried precursor residue is soft baked using rapid thermal processing ("RTP") at an RTP temperature ranging from 525° C. to 675° C. for a period of time ranging from thirty seconds to five minutes. The RTP temperature more preferably ranges from 625° C. to 650° C., and is most preferably 650° C., which is the highest temperature that consistently produces a smooth upper surface on the resultant soft baked precursor residue. The soft baked precursor residue is annealed in a diffusion furnace under oxygen at an anneal temperature ranging from 450° C. to 650° C. for a period of time ranging from thirty minutes to five hours. The anneal temperature more preferably ranges from 500° C. to 560° C., and is most preferably 525° C., which is just barely sufficient to crystallize the ferroelectric layered superlattice material from the soft baked precursor residue.

Other features, objects, and advantages will become apparent to those skilled in the art upon reading the detailed description below in combination with the accompanying drawings.

DETAILED DESCRIPTION OF THE PREFERRED EMBODIMENT

A Ferroelectric Capacitor Device Including DC Sputter-deposited Materials

Figure 1:
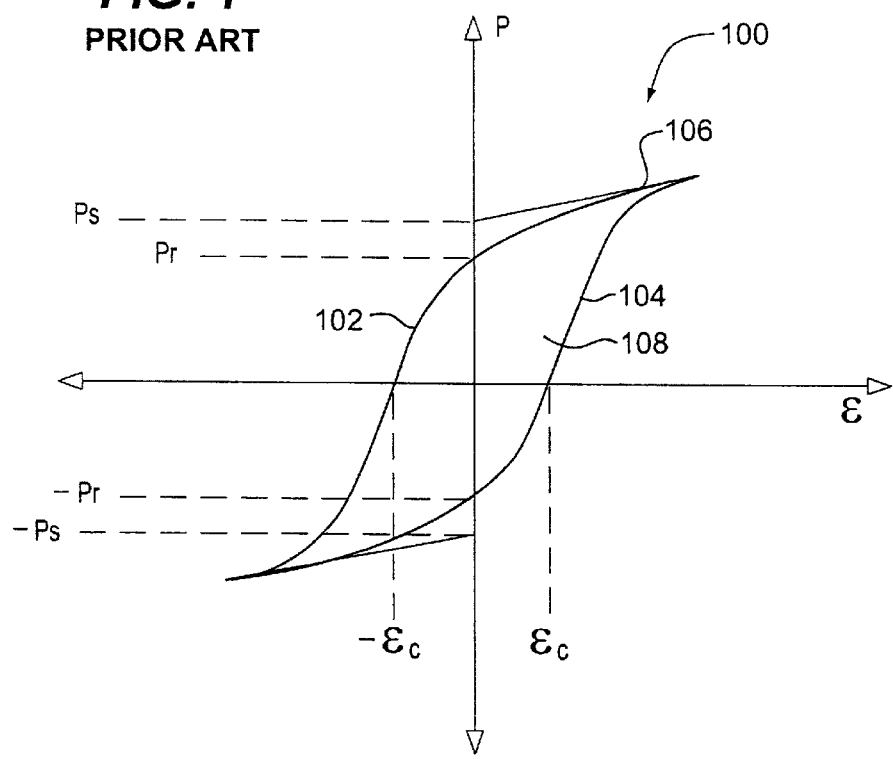
FIG. 1 depicts an idealized conventional ferroelectric polarization hysteresis curve with reference to conventional nomenclature used to describe aspects of the curve.
Figure 2:
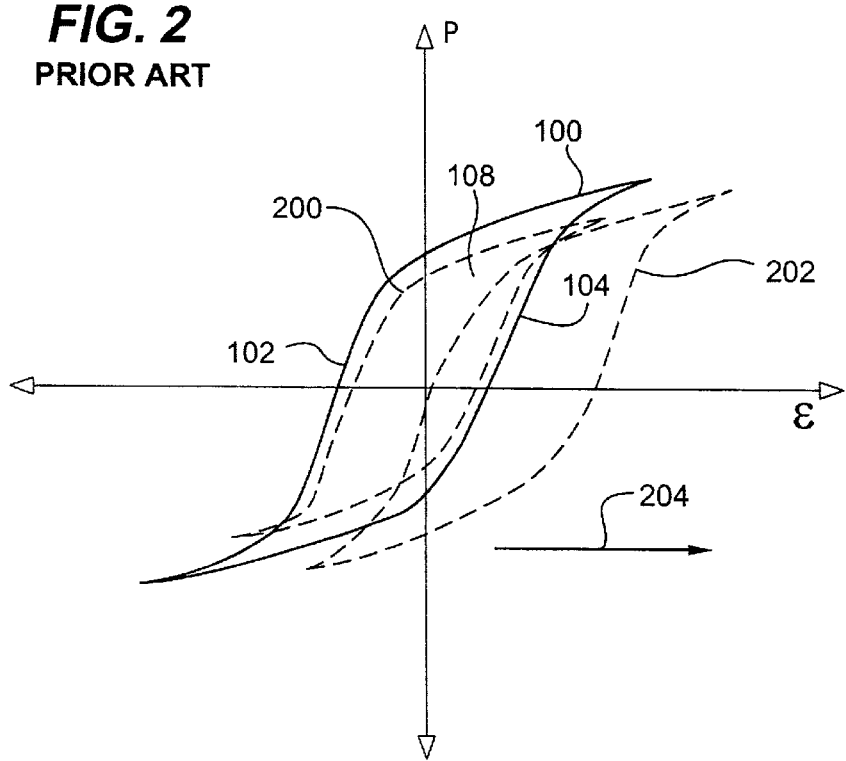
FIG. 2 depicts the idealized FIG. 1 curve adjacent other curves demonstrating polarization fatigue and polarization imprint problems in the prior art.
Figure 3:
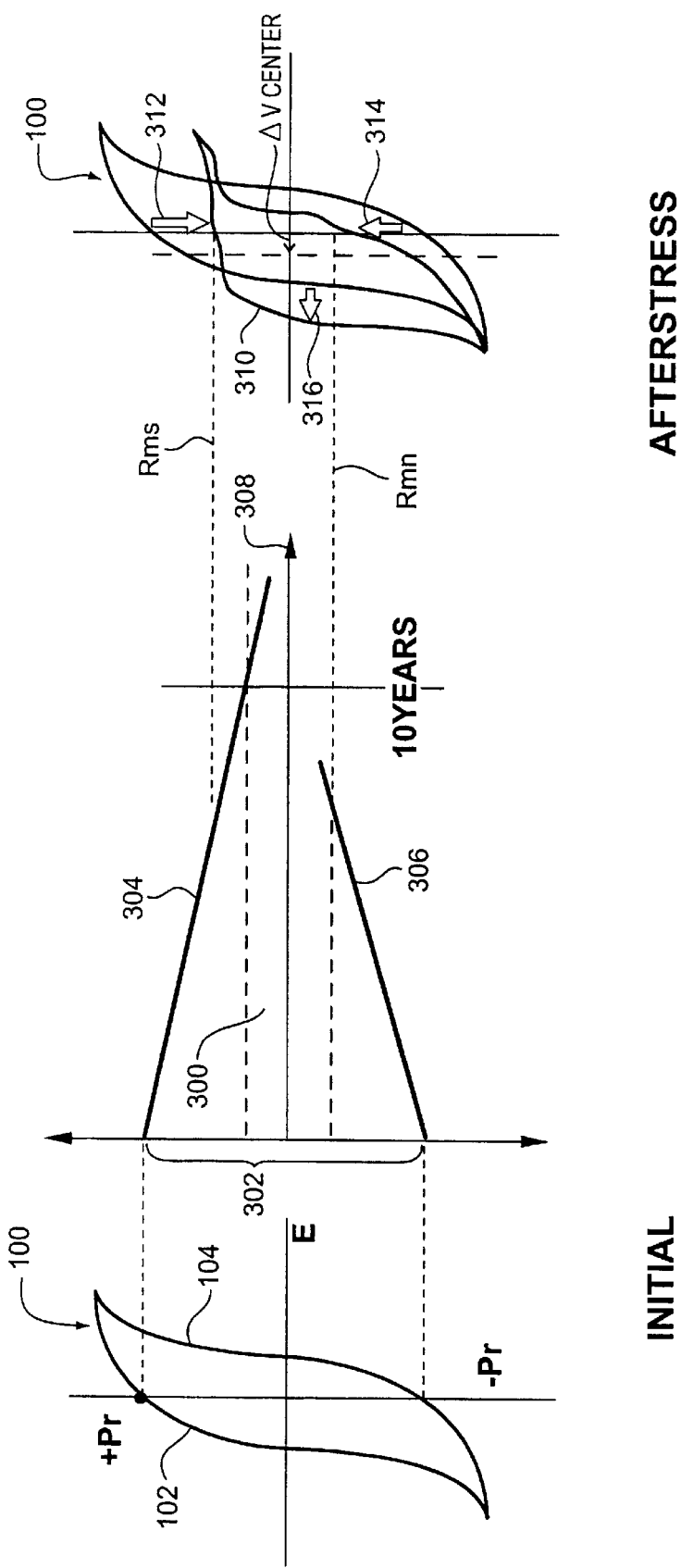
FIG. 3 depicts a schematic representation of the problems that memory control circuitry faces when the ferroelectric materials in ferroelectric memories degrades due to fatigue and imprint problems.
Figure 4:
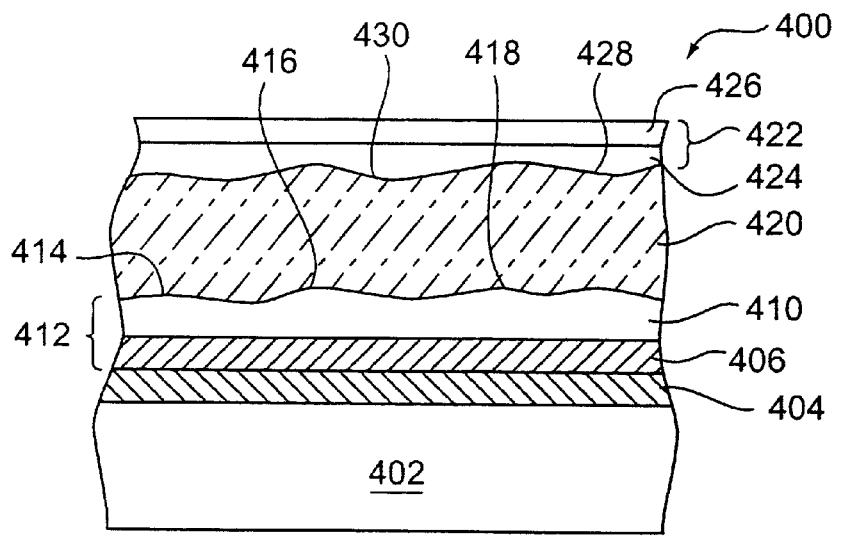
FIG. 4 depicts a planar ferroelectric capacitor having essentially smooth electrodes according to the present invention.

FIG. 4 depicts a preferred ferroelectric capacitor 400 according to the present invention. Ferroelectric capacitor 400 is used as planar memory cell. A conventional wafer 402 supports ferroelectric capacitor 400, and is preferably a silicon wafer, but may also be any other conventional material including at least indium antimonide, magnesium oxide, strontium titanate, sapphire, quartz, ruby, gallium arsenide, and combinations of these materials. A first isolation layer 404 of silicon dioxide, e.g., at least about 2000 Å thick, is preferably formed atop a silicon wafer 402. An adhesion layer 406 is made of iridium, iridium oxide, ruthenium, ruthenium oxide, tantalum, tantalum oxide, titanium, or titanium oxide which is also preferably about 1000 Å thick. A first conductive film 410 about 3000 Å thick is made of platinum, palladium, rhodium, iridium, ruthenium, platinum oxide, palladium oxide, rhodium oxide, iridium oxide, or ruthenium oxide.

Layers 406 and 410 comprise a bottom electrode 412, which presents a first smooth upper surface 414 having a plurality of surface irregularities, e.g., irregularities 416 and 418. A surface irregularity is hereby defined as a structural feature on the surface of an electrode breaking what would, otherwise, be a smooth and uninterrupted flow of the electrode according to an intended contour. Examples of surface features include sharp or acute hillocks, small rounded mounds, and small rounded pits, in what is intended to be an essentially planar electrode surface. The thin film surface features or irregularities are visible at high magnification under scanning electron microscopic observation. The surface irregularities 416 and 418 are all rounded and essentially free of acute angles of the type that may be observed in hillocks on conventional Pt/Ti electrodes. Electrode smoothness is especially needed for preventing spikes on the bottom electrode 412 from causing shorts through ferroelectric capacitor 400.

A thin film ferroelectric layered superlattice material layer 420 contacts first smooth surface 414. Substantially none of the surface irregularities 416 and 418 on first smooth surface 414 protrude vertically towards ferroelectric layer 420 a distance greater than twenty percent of the vertical thickness in the layer 420. It is even more preferable that these surface irregularities protrude less than fourteen percent.

A top electrode 422 is comprised of a second conductive film 424 and an optional adhesion layer 426. Layers 424 and 426 are each DC-sputter deposited by methods according to the present invention that provide exceptional smoothness in the top electrode. The second conductive film 424 is preferably about 2000 Å to 3000 Å thick and is preferably made of platinum, palladium, rhodium, iridium, ruthenium, platinum oxide, palladium oxide, rhodium oxide, iridium oxide, or ruthenium oxide. Adhesion layer 426 is made of titanium oxide, tantalum oxide, palladium, palladium oxide, rhodium, rhodium oxide, iridium, iridium oxide, ruthenium, or ruthenium oxide which is preferably about 1000 Å thick.

Ferroelectric layer 420 presents a second smooth surface 428 having a plurality of associated surface irregularities, e.g., irregularity 430. The surface irregularities 430 are all rounded and essentially free of acute angles of the type that may be observed in ferroelectric capacitors that are not processed by methods according to the present invention. Substantially none of the surface features 416 and 418 on first smooth surface 414 protrude vertically towards ferroelectric layer 420 a distance greater than: twenty percent of the vertical thickness in the layer 420. Ferroelectric layer 420 conforms to first surface 414 and second surface 428 at the corresponding contact interfaces between ferroelectric layer 420, bottom electrode 412 and top electrode 422.

Ferroelectric capacitor device 400 forms part of an integrated memory circuit in the intended environment of use. Those skilled in the art understand that ferroelectric capacitor devices have additional uses including use as ferroelectric transistor gates and logic circuits.

Figure 5:
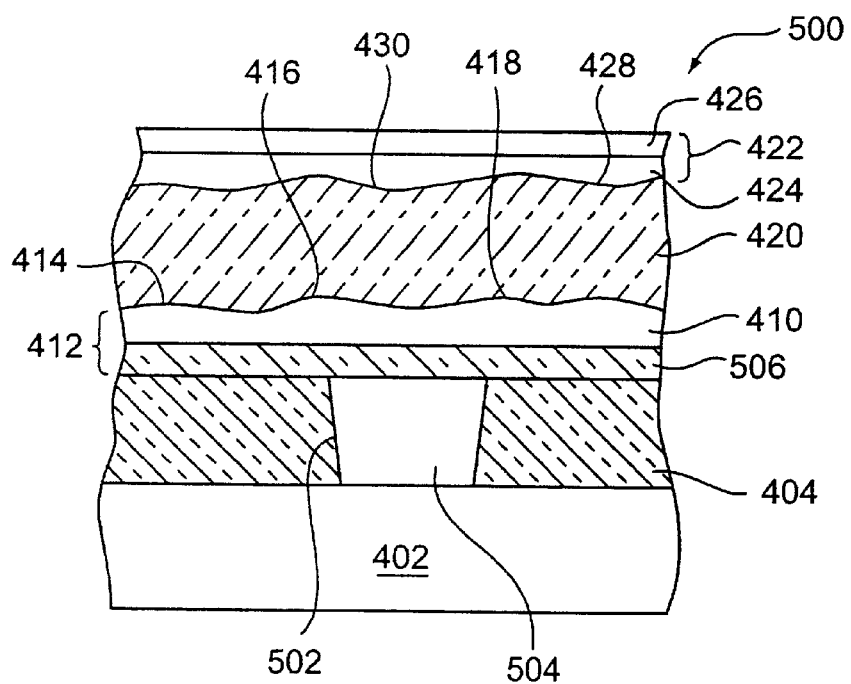
FIG. 5 depicts a stacked ferroelectric capacitor having essentially smooth electrodes according to the present invention.

FIG. 5, depicts a ferroelectric capacitor 500 is used as stacked memory cell. In FIG. 5, identical numbering has been retained for identical components with respect to FIG. 4. A contact hole 502 is formed through oxide layer 404 by ion etching or other techniques to expose wafer 402. A polysilicon plug 504 is formed to fill the contact hole by conventional chemical vapor deposition of poly-silicon and isotropic ion etching. A diffusion barrier layer 506 of about 1500 Å thick titanium nitride, tungsten silicide, tungsten silicon nitride, iridium, or iridium oxide is formed over the poly-silicon plug 504. A first conductive film 410 about 2500 Å thick is made of platinum, iridium, ruthenium, platinum oxide, iridium oxide, or ruthenium oxide.

Special Deposition of a Liquid Precursor to Eliminate Defects in the Ferroelectric Layer 420

In the process of making capacitors 400 and 500, as depicted in FIGS. 4 and 5, a liquid precursor is deposited on the bottom electrode 412 to provide a precursor film by conventional spin-on, more preferably by liquid source misted chemical deposition ("LSMCD") that is the deposition technique depositing a liquid precursor film with rotating the wafer at 15 rpm while a venturi-type atomizer is used to form mist and then introduced into deposition chamber by carrier gas of nitrogen after charging the mist by corona system using oxygen gas with 4 kV of high voltage. The precursor film by LSMCD is capable of eliminating any clusters or porosity inclusions in a ferroelectric layered superlattice material upon deposition of the precursor film. The LSMCD technique is sufficient to avoid transfer of clusters from the liquid precursor into the precursor film and to prevent porosity formation inside of the precursor film.

Special Processing of a Liquid Precursor to Enhance Smoothness of the Second Smooth Surface 428

In the process of making capacitors 400 and 500, as depicted in FIGS. 4 and 5, a liquid precursor is capable of yielding a ferroelectric layered superlattice material upon drying and annealing of the precursor film. Drying of the precursor film is done at a temperature less than 400° C. to provide a dried precursor residue. The dried precursor residue is soft baked using rapid thermal processing ("RTP") at an RTP temperature ranging from 525° C. to 675° C. for a period of time ranging from thirty seconds to five minutes. The RTP temperature more preferably ranges from 625° C. to 650° C., and is most preferably 650° C., which is the highest temperature that consistently produces a smooth upper surface 428 on the resultant soft baked precursor residue. The soft baked precursor residue is annealed in a diffusion furnace under oxygen at an anneal temperature ranging from 450° C. to 650° C. The anneal temperature more preferably ranges from 500° C. to 560° C., and is most preferably 525° C., which is just barely sufficient to crystallize the ferroelectric layered superlattice material from the soft baked precursor residue.

Dimensional Restrictions on Surface Irregularities

There are two main reasons why the surface irregularities 416, 418, and 430 should not protrude into ferroelectric layer 420 a distance greater than twenty percent of the thickness in the ferroelectric layer 420. The first reason involves breakdown voltage. The layered superlattice materials that have been studied thus far have breakdown voltages of about one MV/cm, i.e., from 0.9 MV/cm to 1.1 MV/cm. Thus, about 100 Å of layered superlattice material are needed to withstand 1 V without breakdown. It follows that two irregularities could be superposed over one another between the electrodes, e.g., as surface irregularity 430 in substantial alignment with surface irregularity 416. Complete polarization of ferroelectric layer 420 cannot happen if breakdown occurs. Thus, at least 150 Å of layered superlattice material are needed to withstand a 1.5 V potential between electrodes 412 and 422. A 500 Å thick ferroelectric layer 420 that is designed to operate at 3 V requires a 300 Å thickness. Thus, a hillock can protrude only 200 Å into ferroelectric layer 420. The 200 Å equals forty percent (200/500=40%) of the 500 Å thickness in layer 420. About half of this value, i.e., twenty percent, is required for each electrode because the surface irregularities may be in vertical alignment across the respective electrodes.

Another example is a 400 Å thick ferroelectric layer 420 that is designed to operate at 1.5 V requires a 150 Å thickness. Thus, a hillock can protrude only 250 Å into ferroelectric layer 420. The 150 Å dimension equals thirty eight percent (150/400=38%) of the 400 Å thickness in layer 420. About half of this value, i.e., twenty percent, is required for each electrode because the surface irregularities may be in vertical alignment across the respective electrodes.

Yet another example is a 300 Å thick ferroelectric layer 420 that is designed to operate at 1 V requires a 100 Å thickness. Thus, a hillock can protrude only 200 Å into ferroelectric layer 420. The 100 Å equals thirty three percent (100/300 =33%) of the 300 Å thickness in layer 420. About half of this value, i.e., twenty percent, is required for each electrode because the surface irregularities may be in vertical alignment across the respective electrodes.

The second reason or need for dimensional restrictions on surface irregularites involves a need to avoid imprinting ferroelectric layer 420. It has been determined from qualitative scanning electron microscopic data that surface irregularities of larger height have a greater effect in imprinting ferroelectric layers, such as ferroelectric layer 420, which contact electrodes having these large surface irregularities. Thus, the requirement that surface irregularities on each electrode protrude less than twenty percent into ferroelectric layer 420 is more preferably less than fourteen percent and even more preferably less than seven percent, though it is difficult to make seven percent electrodes for use with 300 Å and 400 Å thick ferroelectric layers 420.

Ferroelectric Memory Devices Including the Ferroelectric Capacitors of FIGS. 4 or 5

Figure 6:
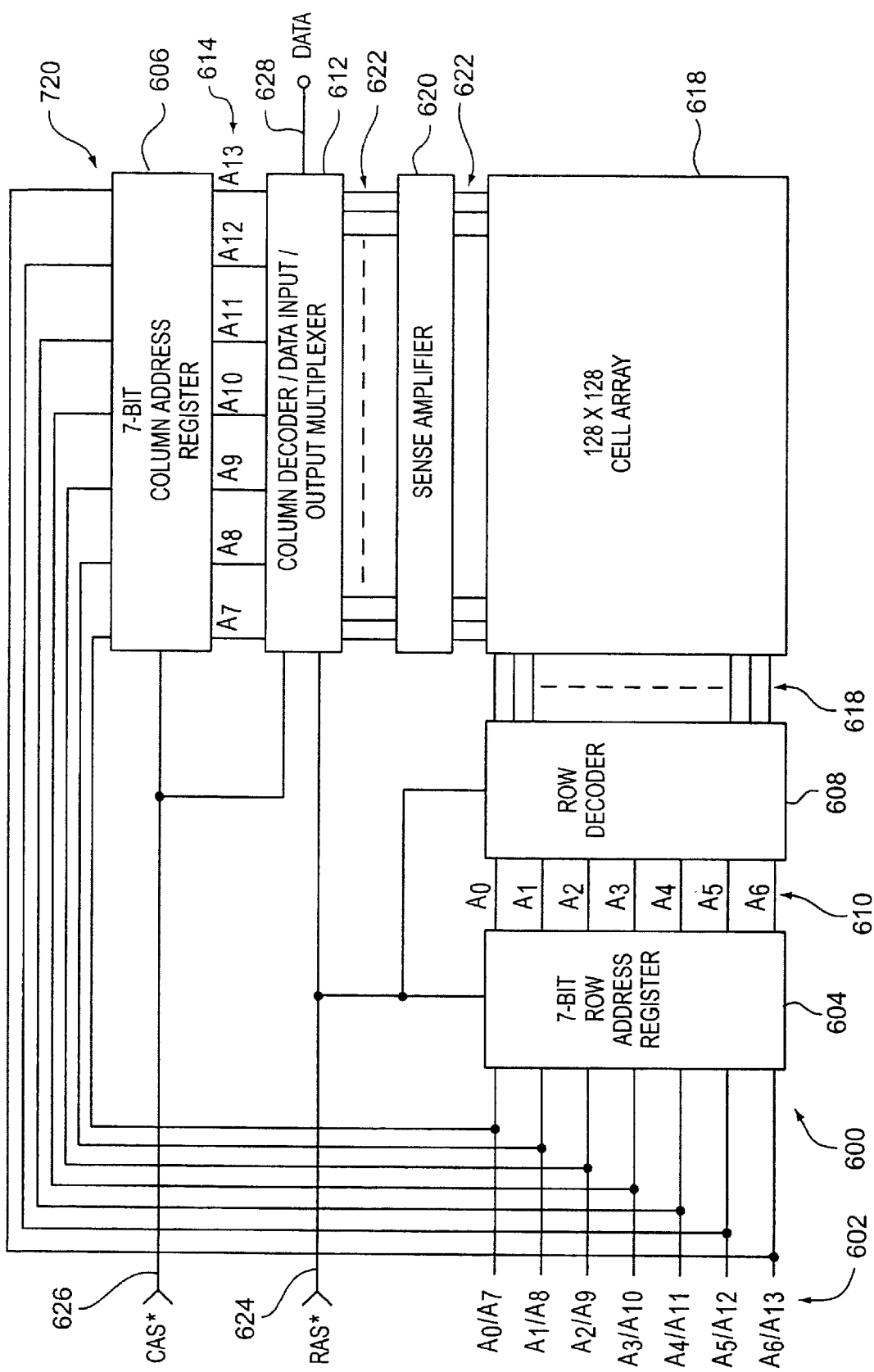
FIG. 6 depicts a circuit diagram of an integrated circuit memory which is a preferred use of the ferroelectric capacitors shown in FIGS. 4 or 5.

FIG. 6 is a block diagram illustrating an exemplary integrated circuit memory 600 in which ferroelectric switching capacitors made with the materials of the invention are utilized. For simplicity, the embodiment shown is for a 16 kilobit ("16 K") FERAM; however the material may be utilized in a wide variety of sizes and types of memories, both destructive read-out and non-destructive read-out. In the 16K embodiment shown, there are seven address input lines 602 which connect to a row address register 604 and a column address register 606. The row address register 604 is connected to a row decoder 608 via seven lines 610, and the column address register 606 is connected to a column decoder/data input/output multiplexer 612 via seven lines 614. The row decoder 608 is connected to a 128×128 memory cell array 616 via 128 lines 618, and the column decoder/data input/ output multiplexer 612 is connected to the sense amplifiers 620 and memory cell array 616 via 128 lines 622. A RAS*3 signal line 624 is connected to the row address register 604, row decoder 608, and column decoder/data input/output multiplexer 612, while a CAS* signal line 626 is connected to the column address register 606 and column decoder/data input/output multiplexer 612. (In the discussion herein, a * indicates the inverse of a signal.) An input/output data line 628 is connected to the column decoder/data input/output multiplexer 612. Memory cell array 616 contains 128 ×128=16,384 memory cells, which are conventionally designated as 16K. These cells are ferroelectric switching capacitor-based cells according to the present invention.

Figure 7:
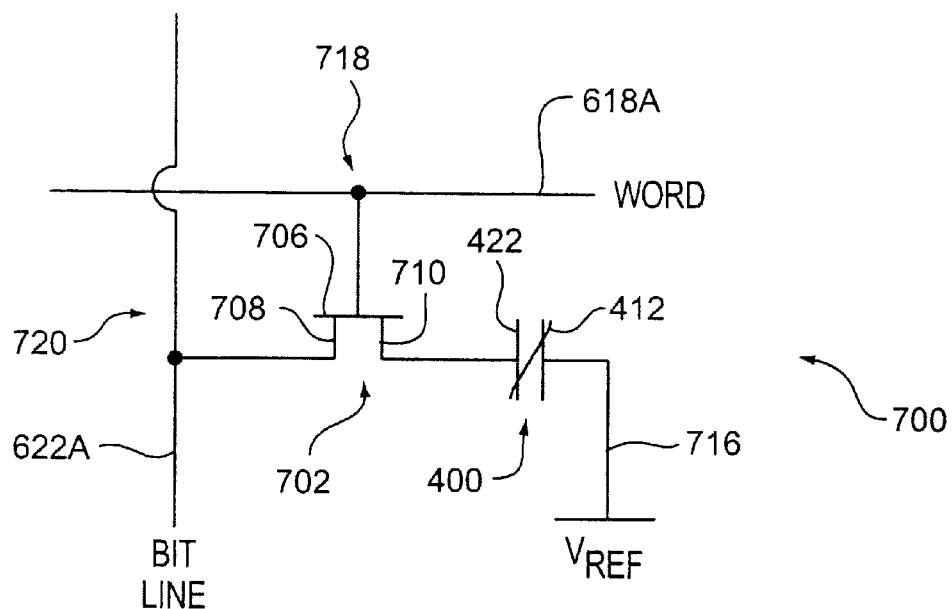
FIG. 7 depicts a circuit diagram of an individual integrated circuit nonvolatile memory cell such as may be used in the memory of FIG. 6 and utilizing the ferroelectric capacitor of FIG. 4.

FIG. 7 depicts a ferroelectric planar capacitor-based switching cell 700. Cell 700 includes two electrically interconnected electrical devices, namely, a transistor 702 and a ferroelectric switching capacitor 400. The gate 706 of transistor 702 is connected to line 618A that is generally called "word line", which is connected to one of the lines 618 (see FIG. 6). Source/drain 708/710 of transistor 702 is connected to line 622A that is generally called "bit line", which is connected to one of the lines 622.

In FIG. 7 where planar-type memory cells are used as shown in FIG. 4, the source/drain 710 of transistor 702 is connected to top electrode 422 of switching capacitor 400 and the bottom electrode 412 of switching capacitor 400 is connected to line 716 which is connected to a reference voltage $V_{ref}$.

Figure 8:
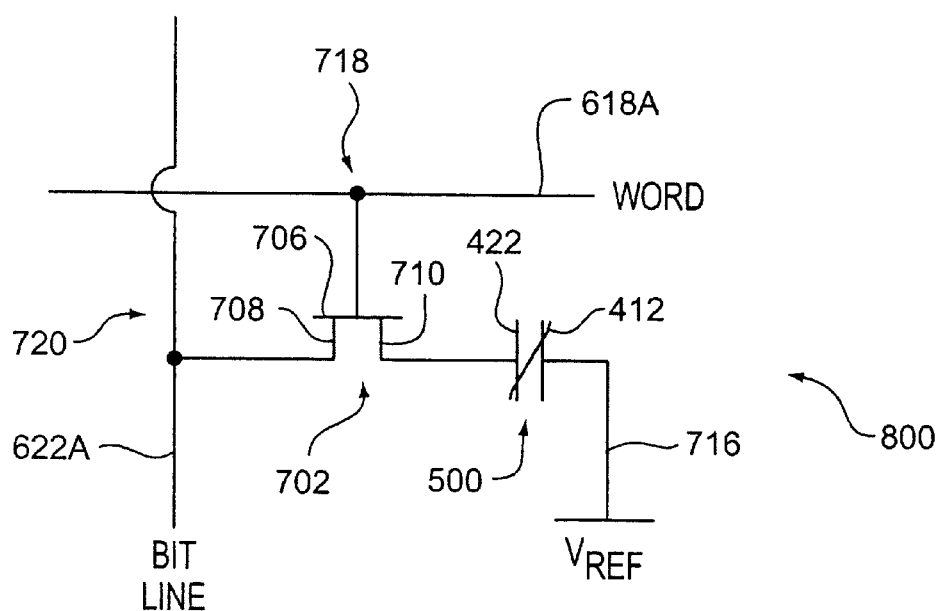
FIG. 8 depicts a circuit diagram of an individual integrated circuit nonvolatile memory cell such as may be used in the memory of FIG. 6 and utilizing the ferroelectric capacitor of FIG. 5.

FIG. 8 depicts a ferroelectric stacked-type capacitor-based switching cell 800 incorporating a stacked capacitor 500 of the type shown in FIG. 5. In FIG. 8, identical numbering has been retained for identical features with respect to FIG. 7. According to FIG. 8, source/drain 710 of transistor 602 is connected to bottom electrode 412 of switching capacitor 500 and the top electrode 422 of switching capacitor 500 is connected to line 716 which is connected to a reference voltage $V_{ref}$. Thus, the positions of electrodes 412 and 422 are inverted in FIG. 8 with respect to those electrodes in FIG. 7.

Figure 9:
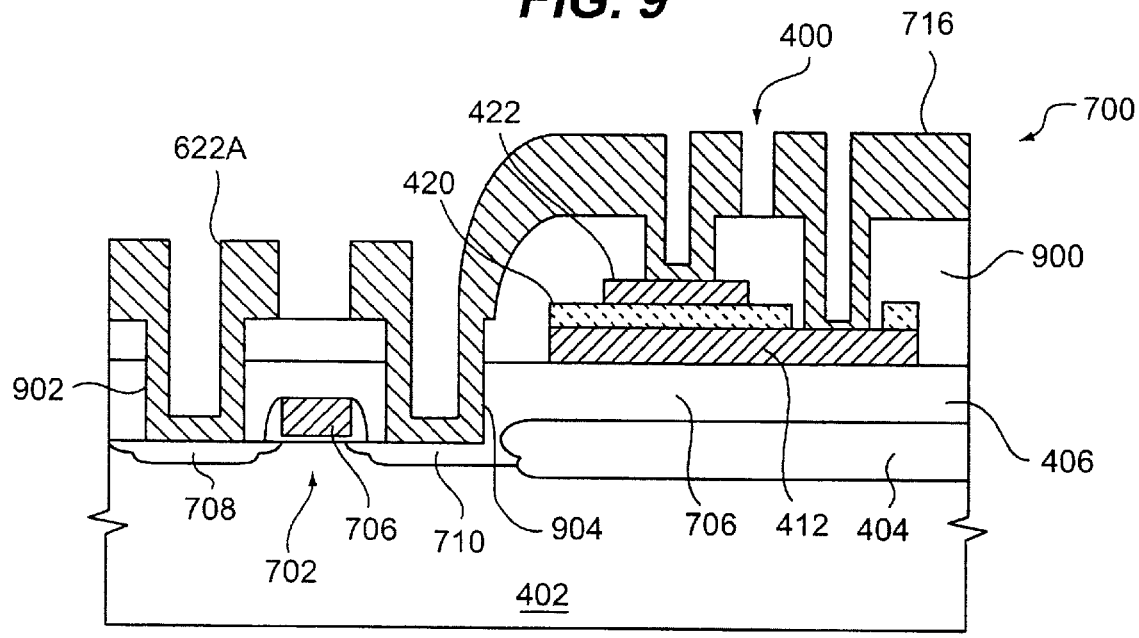
FIG. 9 depicts a layered construction showing an individual planar ferroelectric memory cell implemented in an integrated circuit memory corresponding to FIG. 7.

FIG. 9 depicts memory cell 700 fabricated as an integrated circuit FERAM according to a midsectional view of the thin film structure. In FIG. 9, like numbering of identical items has been retained with respect to FIGS. 4, 6, and 7. A planar capacitor 400 includes a thin film ferroelectric layer 420, as shown in FIG. 4. Wafer 402 is doped by conventional means to provide source/drain regions 708 and 710. Layers 406 and 900 are additional isolation layers that are preferably made of spin-on glass, or other phosphorous-doped, borophosphorous-doped or non-doped silicon dioxide. Bottom electrode 412 is constructed as described in the discussion of FIG. 4. Bit line 622A and word line 618A connected to gate 706 (not depicted in FIG. 9) are each preferably made of aluminum, more preferably aluminum over stacked diffusion barrier metal of titanium nitride atop titanium (Al/TiN/Ti stacked layer), or most preferably aluminum, over stacked diffusion barrier metal of titanium nitride atop titanium, and covered by anti-reflective layer titanium nitride for photo mask processing (300 Å/8000 Å/1500 Å/250 Å thick TiN/Al/TiN/Ti stacked layer). Bit line 622A is partially within corresponding contact holes 902.

Figure 10:
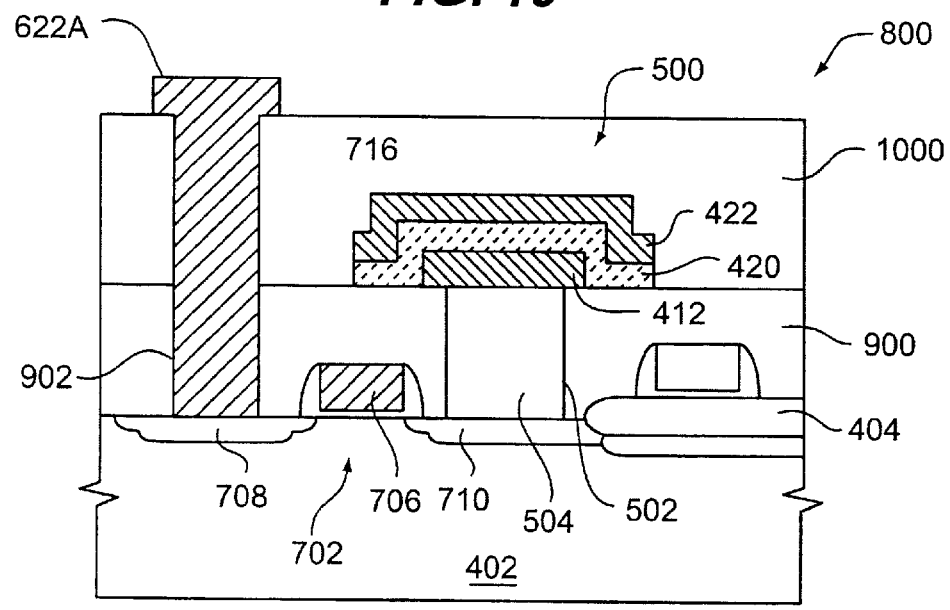
FIG. 10 depicts a layered construction showing how individual stacked ferroelectric memory cells may be implemented in an integrated circuit memory corresponding to FIG. 8.

FIG. 10 depicts the stacked memory cell 800 fabricated as an integrated circuit FERAM according to a midsectional view of the thin film structure. In FIG. 10, like numbering of identical items has been retained with respect to FIGS. 5, 6, 7, 8, and 9. Layer 1000 is an isolation layer that is preferably made of the same material as layer 900.

Memory Read, Write, and Sense Operations

Figure 48:
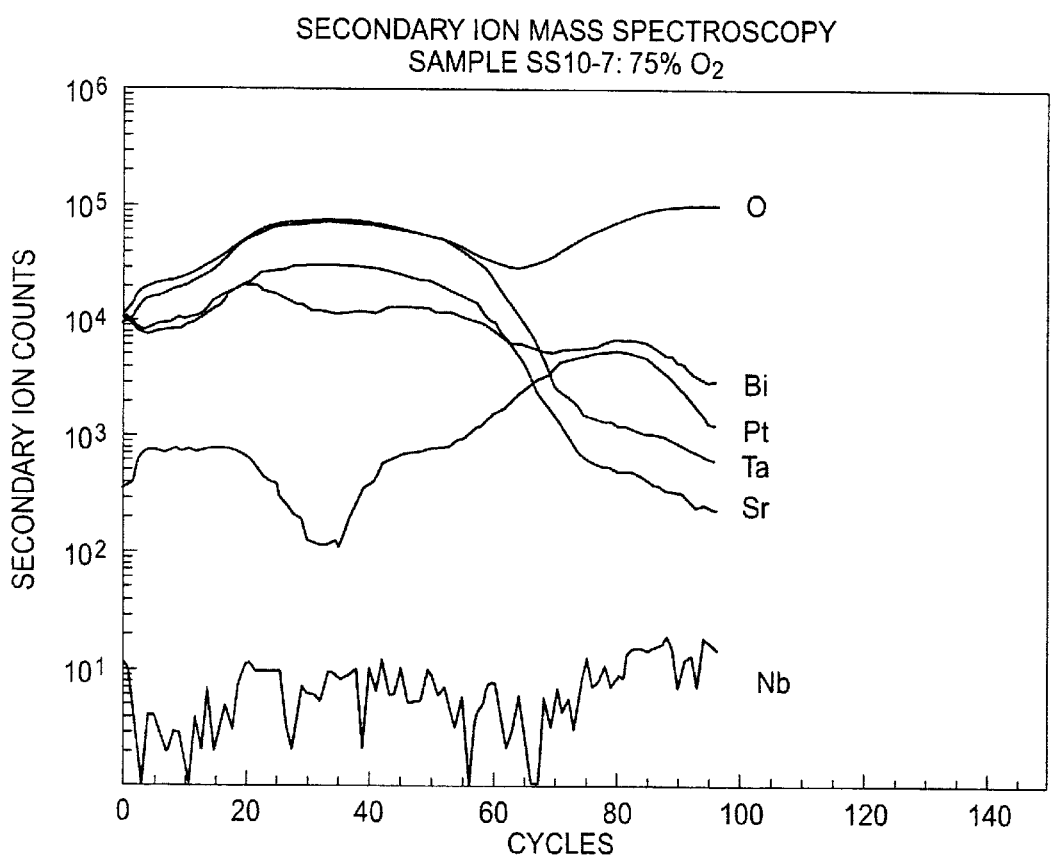
FIG. 48 presents secondary ion mass spectroscopic data taken from a sample corresponding to the sample of FIG. 34.

The operation of the memory in FIG. 48 is as follows. Row address signals $A_0$ through $A_6$ (see FIG. 6) and column address signals $A_7$ through $A_{13}$ placed on lines 602 are multiplexed by address registers 604 and 606 utilizing the RAS* and CAS* signals via lines 624 and 626, and passed to the row decoder 608 and column decoder/data input/output multiplexer 612, respectively. The row decoder 608 places a high signal on the one of the word lines 618 that is addressed. The column decoder/data input/output multiplexer 612 either places the data signal which is input on line 628 on the one of the bit lines 622 corresponding to the column address, or outputs on the data line 628 the signal on the one of the bit lines 622 corresponding to the column address, depending on whether the function is a write or read function. As is known in the art, the read function is triggered when the RAS* signal precedes the CAS signal, and the write function is triggered when the CASE signal comes before the RAS* signal. The transistors 702 in the respective cells 700 and 800 connected to the word line that is driven to high voltage turn on, permitting the data signal on the bit line 622A to be read into the capacitors 400 or 500 or the signal on the capacitors 400 or 500 to be output on the bit line 622A, depending on whether the read or write function is implemented. As is well-known in the art, the sense amplifiers 620 are located along lines 622 to amplify the signals on the lines. Other logic required or useful to carry out the functions outlined above, as well as other known memory functions, is also included in the memories 700 or 800, but is not shown or discussed as it is not directly applicable to the invention.

As outlined above, the RAS* and CAS lines 624 and 626; registers 604 and 606; the decoder 608; column decoder/data input/output multiplexer 612; and the transistor 702 comprise an information write means 718 (see FIGS. 7 and 8) for placing the memory cells 700 and 800, respectively, in a first memory state or a second memory state depending upon information input to the memory on data line 628. The first memory cell state corresponds to layer 420 of ferroelectric material being in a first polarization state, and the second memory cell state corresponds to the layer 420 being in a second polarization state. These components plus the sense amplifier 620 comprise an information read means 720 for sensing the state of memory cells 700 and 800 and providing an electrical signal corresponding to the sensed state. The necessity of sensing the polarization state of thin film ferroelectric layer 420 causes information read means 720 to subject thin film ferroelectric layer 420 to repeat unidirectional voltage pulses.

A Generalized Process Schematic for Making a Ferroelectric Memory Device

Figure 11:
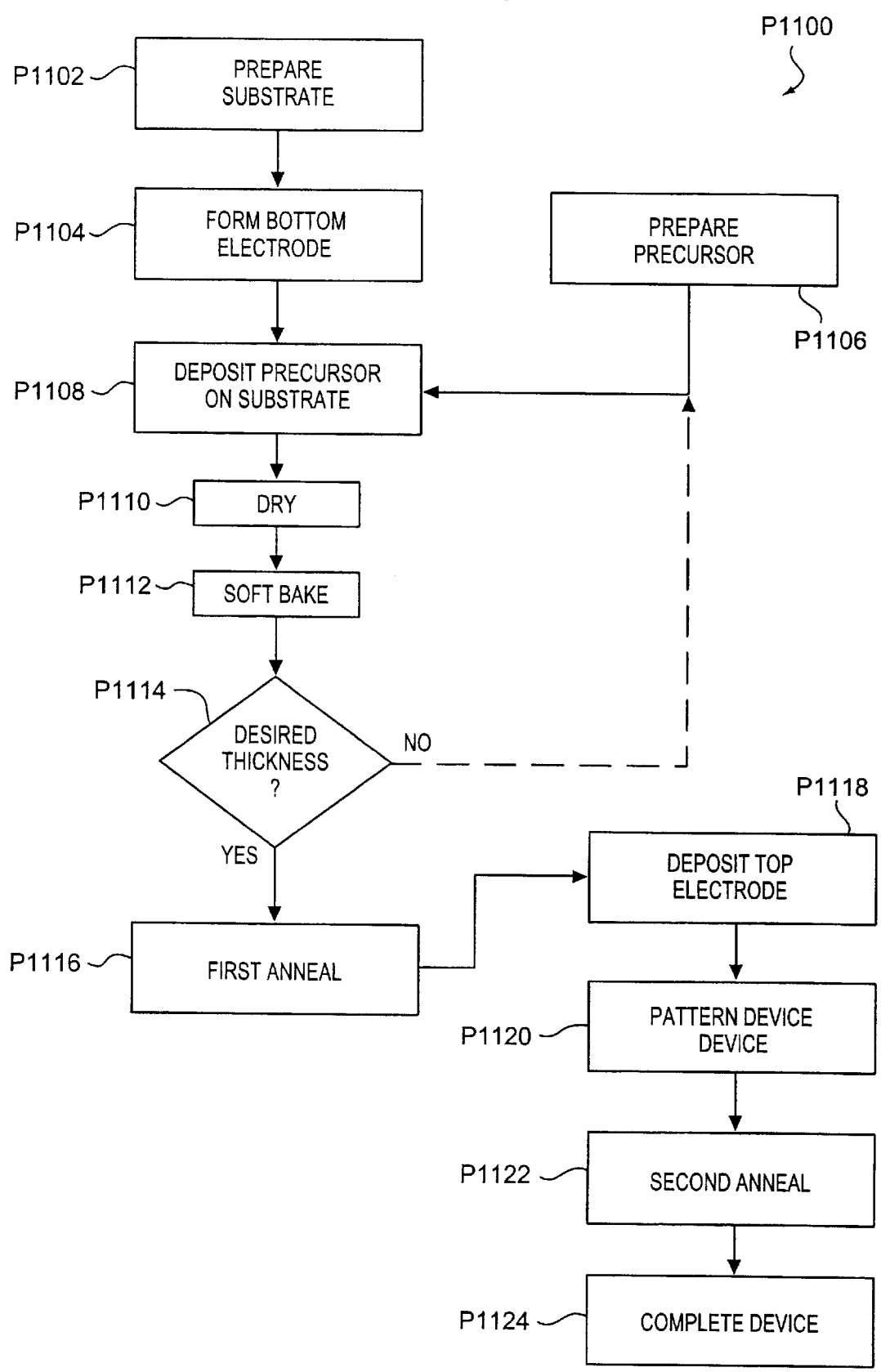
FIG. 11 depicts a schematic process diagram for use in making a memory cell corresponding to the layered construction of FIGS. 9 and 10.

FIG. 11 depicts a schematic process diagram of process P1100 for fabricating memory cells 700 or 800 according to the present invention. In step P1102, wafer 402 (see FIGS. 4 and 5) is made ready by conventional means to receive bottom electrode 412. Accordingly, a silicon wafer 402 may be heated in an oxygen diffusion furnace to grow oxide layer 404. A diffusion or contact hole 502 may be formed through oxide layer 404 by ion etching or other techniques to expose wafer 402, which is then n or p-doped by conventional means to provide source/drain regions 708 and 710. Transistor gate 706 is formed by conventional means. Isolation layer 406 may be deposited as spin-on glass or other borophosphorous-doped, phosphorous-doped or non-doped silicon dioxide by conventional chemical vapor deposition.

Only for a stacked-type ferroelectric memory cell 800 shown in FIG. 10, contact holes 502 and 902 may be formed through isolation layer 900 by ion etching or other techniques to expose wafer 402. Bit line 622A and poly-silicon plug 504 are formed in the contact holes 502 and 902 by conventional means.

Bottom electrode 412 is formed in step P1104. Adhesion layer 406 is formed by DC sputtering iridium, iridium oxide, ruthenium, ruthenium oxide, tantalum, tantalum oxide, titanium, or titanium oxide, to a thickness ranging from 500 Å to 1500 Å in cases where planar ferroelectric cells 400 are used as shown in FIGS. 4 and 9. The sputter deposited material is optionally treated by an oxygen anneal in a diffusion furnace at 500° C. to 700° C. for a minimum of one hour including a twenty two minute ramp into the furnace and a twenty two minute ramp out of the furnace.

In case that stacked ferroelectric cells 500 are used, as shown in FIGS. 5 and 10, diffusion barrier layer 408 is formed by DC-sputtering titanium nitride, titanium tungsten, tungsten silicide, tungsten silicon nitride, tantalum silicide, tantalum silicon nitride, palladium, palladium oxide, rhodium, rhodium oxide, iridium, iridium oxide, ruthenium, or ruthenium oxide to a thickness ranging from 1000 Å to 1500 Å. The sputter deposited material may be subjected to a nitrogen or oxygen anneal in a diffusion furnace at 400° C. to 700° C. for a minimum of two hours including a twenty two minute ramp into the furnace and a twenty two minute ramp out of the furnace.

The first conductive film 410 is deposited atop the corresponding isolation layer 406 or the barrier layer 408. Deposition preferably occurs by DC-sputtering of platinum, palladium, rhodium, iridium, ruthenium, platinum oxide, palladium oxide, rhodium oxide, iridium oxide, or ruthenium oxide to a thickness of 3000 Å.

By way of example, suitable sputtering equipment for use in step P1104 includes sputtering equipment made by UNI-FILM TECHNOLOGY, of which the model number is PVD-300. Conventional DC-magnetron sputtering manufactured by ANELVA CORPORATION (model number; ILC-1051 or equivalent) or APPLIED MATERIALS, INC (model number; Endura 5500-PVD or equivalent) are more preferred.

The DC-magnetron sputtering process uses a reactive plasma carrier gas mixture comprising a combination of a noble gas and a reactive gas species at pressure less than $10^{-2}$ Torr. The most preferred noble gas is argon due to its low reactivity and relatively low cost. The most preferred reactive gas species are nitrogen and oxygen. Nitrogen may be used at a partial pressure of up to seventy percent of the carrier gas mixture. It is more preferred to use a partial pressure of nitrogen ranging from ten to fifty percent. Oxygen may be used at up to one hundred percent of the carrier gas mixture, but better results are obtained when the partial pressure of oxygen is equal to or less than seventy five percent. It is most preferred to use a partial pressure of oxygen ranging from five to sixty percent.

Step P1106 includes the preparation of a liquid precursor. Thin film ferroelectric layer 420 (see FIGS. 4 and 5) is preferably formed using a liquid deposition process, such as the process described in U.S. Pat. No. 5,423,285, which is hereby incorporated by reference to the same extent as though fully disclosed herein. It is preferred to use a metal alkoxycarboxylate precursor that is prepared according to the reactions:

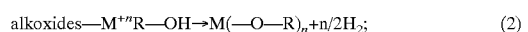

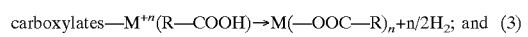

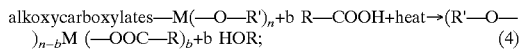

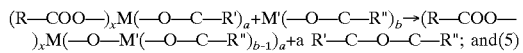

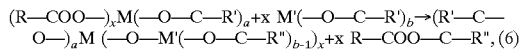

where M is a metal cation having a charge of n; b is a number of moles of carboxylic acid ranging from 0 to n; R' is preferably an alkyl group having from 4 to 15 carbon atoms; R is an alkyl group having from 3 to 9 carbon atoms; R" is an alkyl group preferably having from about zero to sixteen carbons; and a, b, and x are integers denoting relative quantities of corresponding substituents that satisfy the respective valence states of M and M'. M and M' are preferably selected from the group consisting of strontium, bismuth, niobium and tantalum. The exemplary discussion of the reaction process given above is generalized and, therefore, non-limiting. The specific reactions that occur depend on the metals, alcohols, and carboxylicacids used, as well as the amount of heat that is applied.

A reaction mixture including an alcohol, a carboxylic acid, and the metals, is refluxed at a temperature ranging from about 70° C. to 200° C. for one to two days, in order to facilitate the reactions. The reaction mixture is then distilled at a temperature above 100° C. to eliminate water and short chain esters from solution. The alcohol is preferably 2-methoxyethanol or 2-methoxypropanol. The carboxylic acid is preferably 2-ethylhexanoic acid. The reaction is preferably conducted in a xylene or nectane solvent. The reaction products are diluted to a molarity that will yield from 0.1 to 0.3 moles of the desired layered superlattice material per liter of solution. The most preferred solutions have a molarity ranging from 0.10 to 0.13 moles per liter.

The layered superlattice materials that derive from step P1106 work best in their intended environment of use if the liquid precursor solutions are mixed to include an excess bismuth amount of at least five to ten percent. Some bismuth volatilization losses occur during the anneal steps P1116 and P1120. Other advantages of excess bismuth include the compensation of lattice defects. Thin film ferroelectric layered superlattice materials for use in ferroelectric layer 420 have been prepared to include stoichiometric excess bismuth amounts of 100 percent and more. These materials are ferroelectric, but can show reduced polarization unless the excess bismuth amounts are kept within the range from about 5% to 10% of the amount of bismuth that is required to satisfy the Smolenskii class A formula which is shown above. The solutions yield layered superlattice materials having metals in proportion to the metals in the precursor solution less volatilization losses from the anneal. Accordingly, the precursor solutions may be prepared with more or less than a stoichiometric mixture of A-site and B-site materials according to the Smolenskii formula. For example, a solution may be prepared with excess bismuth and excess tantalum B-site metal. The solutions may also include mixtures of multiple A-site and multiple B-site metals, e.g., as in strontium bismuth niobium tantalate.

Other ferroelectric materials including barium strontium titanate and lead zirconium titanate may be produced from liquid precursor for use in the present invention; however, these other ferroelectrics typically cannot be used in ultra thin layers due to the formation of defects or other problems that develop in ultra thin configurations less than about 1000 Å thick. Furthermore, these other materials can show decreasing polarization and fatigue endurance with decreasing thickness, but the opposite case of increasing polarization with decreasing thickness can be true of layered superlattice materials. Therefore, the ability to produce smooth electrodes by DC sputtering processes according to the present invention is less critical for other ferroelectrics than for layered superlattice materials.

In step P1108, the precursor solution from step P1106 is applied to the substrate from step P1104, which presents the uppermost surface 414 of bottom electrode 412 for receipt of thin film ferroelectric layer 420. Application of the liquid precursor is preferably conducted by dropping two to five ml of the liquid precursor solution at ambient temperature and pressure onto the uppermost surface of electrode 412 and then spinning wafer 402 to remove any excess solution and leave a thin-film liquid residue. For spin-on depositions, it is possible to vary the spin rate and the solution molarity to adjust the thickness of the liquid precursor solution film that resides on the bottom electrode 412. A detailed example of step P1106 is provided below as Example 1. Preferably, the liquid precursor is applied by a liquid source misted chemical deposition ("LSMCD") technique.

Particularly preferred methods of liquid deposition include deposition of misted aerosols with ultraviolet curing of the resultant liquid thin film on the substrate, as described in McMillan et al. U.S. Pat. No. 5,456,945, or as may be accomplished through commercially available liquid source misted chemical deposition machines, such as the Primaxx2F Standalone LSMCD System made by Submicron Systems Incorporation of Allentown, Pa. These machines use a single source liquid having a stoichiometrically correct representation of metals corresponding to the desired metal oxide. The liquid is misted into colloidal size particles to form an aerosol mist in an inert carrier gas. The mist particle diameters preferably have a normal distribution between about 50 to 500 nm with a mode at about 170 nm coinciding with about $5.5 \times 10^7$ particles. The mist is transferred into a vacuum deposition chamber and deposited evenly over a rotating substrate. Ultraviolet radiation is used to facilitate decomposition of the liquid precursor mist and the liquid precursor film on the rotating substrate. It has been observed that ferroelectric films that are formed using liquid source misted chemical deposition have fewer defects, better step coverage, and smoother upper surfaces than films formed using spin-on deposition. Alternatively, the liquid precursor may be applied by a chemical vapor deposition technique with metal organic source materials.

In step P1110, the precursor film from step P1108 is dried to remove solvent and other volatile organics. The precursor is dried on a hot plate in a dry air atmosphere and at a temperature of from about 150° C. to 400° C. for a sufficient time duration to remove substantially organic materials from the liquid thin film and leave a dried precursor residue. This period of time is preferably from about one minute to about thirty minutes. The most preferred drying conditions provide a two stage drying that is performed first at 150° C. for two minutes then at 260° C. for four minutes.

Step P1112 includes soft baking the dried precursor residue from step P1110 at a greater temperature than was used in step P1110. The soft bake preferably includes placement of the wafer under a conventional RTP halogen lamp at 525° C. to 675° C. for a time duration of from thirty seconds to five minutes. The most preferred RTP condition is 650° C. for sixty seconds. These RTP conditions assure that the soft-baked precursor residue will have a smooth uppermost surface prior to deposition of top electrode 422. In contrast, photomicrographs of precursor residue that was soft-baked at 725° C. show an unacceptably rough upper surface having a large proportion of hillock structures and large-scale surface irregularities greater than 400 Å in height.

As an alternative to 650° C. RTP in step P1112, the wafer may be soft baked in a diffusion furnace at 650° C. for ten minutes or so including four minute ramps into and out of the furnace, but this method sometimes produces an unsatisfactory or rough soft baked residue. The soft bake step P1112 is essential in obtaining predictable or repeatable electronic properties in the crystalline compositions to be derived from process P1100.

The following working example shows the parameters that were used to develop the ideal conditions for spin-on deposition. It was determined that 1300 rpm was the ideal rate for deposition of a 0.12 moles per liter precursor solution made of metal 2-ethylhexanoates and xylenes.

EXAMPLE 1

Materials Thickness Derived from Spin-on Process

A 0.2 moles per liter solution was prepared on commercial order from Hughes Technical Services of Vienna, Va., to yield $SrBi_{2.61}(Nb_{0.66}Ta_{1.63})O_{10.64}$ and included strontium, bismuth, niobium, and tantalum 2-elthyhexanaotes in xylenes. An eyedropper was used to place a 2 ml aliquot of this solution onto a wafer spinning at 1300 rpm to provide a film of the precursor solution. The resultant film was dried first on a 150° C. hot plate for two minutes, then on a 260° C. hot plate for four minutes to leave a 2399 Å thick residue that shrank to a thickness of 1600 Å when soft-baked under RTP at 650° C. for sixty seconds. Thicknesses were measured using an ellipsometer made by Gaertner Scientific Corporation, of which model number is L-104SA. The solution was diluted with n-butyl acetate to 0.12 moles per liter and other spin-on velocities were tried. Table 1 below includes a summary of spin-on conditions for other films together with an -indication of whether the films cracked when exposed to 650° C. RTP for sixty seconds.

TABLE 1

| Sample | RPM | Solution Molarity | Thickness after drying Å | Thickness After RTP Å | Cracked? (Yes/No) |
|---|---|---|---|---|---|
| A | 1300 | 0.2 | 2399 | 1600 | Yes |
| B | 1000 | 0.2 | 2527 | 1773 | Yes |
| C | 800 | 0.2 | 2590 | 1969 | Yes |
| D | 700 | 0.2 | 2592 | 2013 | Yes |
| E | 1300 | 0.16 | 1633 | Not measured | No |
| F | 1300 | 0.14 | 1452 | Not measured | No |
| G | 1300 | 0.12 | 1314 | Not measured | No |

In step P1114, if the resultant soft baked precursor residue from step P1112 is not the desired thickness, then steps P1108, P1110 and P1112 are repeated until the desired thickness is obtained. A thickness of about 1500 Å to 1800 Å typically requires two coats of a 0.12 moles per liter solution under the parameters disclosed herein.

In step P1116, the soft-baked precursor residue is annealed to form ferroelectric thin film layer 420 (see FIGS. 4 and 5). This annealing step is referred to as the first anneal to distinguish it from a later annealing step. The first anneal is preferably performed in oxygen at a temperature of from 450° C. to 650° C. for a time from 30 minutes to 2 hours. Step P1116 is more preferably performed at from 500° C. to 560° C. for 120 minutes, with the most preferred anneal temperature being about 525° C. This low temperature anneal is now made possible because X-ray diffraction analysis of thin film layered superlattice materials of the Smolenskii class A type crystallize from the soft-baked precursor residues of the preferred liquid metal 2-ethylhexanoate precursor solutions when the soft-baked precursor residues are annealed in oxygen at minimum temperatures ranging from 500° C. to 560° C. The low temperature anneal reduces the amount of roughness from thermally induced stresses within thin film ferroelectric layered superlattice material layer 420. The first anneal of step P1116 most preferably occurs in an oxygen atmosphere using a 120 minute process including at least twenty two minutes for the "push" into the furnace and an identical time for the "pull" out of the furnace. All of these indicated anneal times include the time that is used to create thermal ramps into and out of the furnace.

In step P1118, the top electrode 422 is deposited by DC sputtering. The deposition of adhesion layer 426 is preferably accomplished under conditions that are identical to the deposition conditions for adhesion layer 406. Similarly, the deposition of second conductive film 424 is preferably accomplished under conditions that are identical to the deposition conditions for first conductive film 410.

The device is then patterned in step P1120 by a conventional reactive ion etching process including the application of a photoresist followed by ion etching, as will be understood by those skilled in the art. This patterning preferably occurs before the second annealing step P820 so that the second anneal will serve to remove patterning stresses from memory cell 400 and correct any defects that are created by the patterning procedure.

The second annealing step, P1122, is preferably performed at from 650° C. to 850° C. for 120 minutes, with the most preferred anneal temperature being about 800° C. The second anneal of step P1122 most preferably occurs in an oxygen atmosphere using a 120 minute process including at least twenty two minutes for the "push" into the furnace and an identical time for the "pull" out of the furnace. The time for the second anneal is preferably the same as for the first anneal P1116.

Finally, in step P1124, the device is completed and evaluated. The completion may entail the deposition of additional layers, ion etching of contact holes, and other conventional procedures, as will be understood by those skilled in the art. Wafer 402 may be sawed into separate units to separate a plurality of integrated circuit devices that have been simultaneously produced thereon.

The following non-limiting examples set forth preferred materials and methods for practicing the invention hereof.

EXAMPLE 2

Sensitivity of DC Sputter-deposited Iridium to Oxygen Content of the Carrier Gas Used in DC Sputtering Process step P1102 (see FIG. 11) was commenced by placing a commercially available silicon wafer placing in a diffusion furnace to grow oxide layer 404 (see FIGS. 4 and 5). The substrate including oxide layer 404 with an adhesion layer 406 of titanium oxide layer, was placed in a DC magnetron sputtering equipment of PVD-300 made by Unifilm Technology Corporation for completion of step P1104.

An iridium metal layer or an iridium oxide layer corresponding to a first conductive film 410 was DC sputtered to a thickness ranging from 447 Å to 1376 Å. The carrier gas mixture in the vacuum chamber included a 5.7 E-3 Torr partial pressure of oxygen ($O_2$) and a 5.7 E-3 Torr partial pressure of argon, i.e., a 50% partial pressure of oxygen to stabilize the plasma. These conditions are at relatively high pressures compared to sputtering with typical argon only plasma. Sputtering was performed using DC power source with 0.53 A of fixed current and the equipment automatically determined the sputtering voltage system over one and half minutes.

Table 2 shows the deposition rates of these films and this process improvement offers a significant advantage over prior RF-sputtering techniques because the inclusion of oxygen in the RF-carrier gas mixture significantly diminishes the deposition rate to about ten percent of the rate using a pure argon carrier gas. This diminished deposition rate advantageously results in the formation of correspondingly smoother electrodes, as confirmed by scanning electron microscopy.

The data shown in this Table 2 as deposition rate per input power per minute distinguished the reported results on page 3054 of the Joo article.

TABLE 2

DC reactive sputtered Iridium with Argon and oxygen mixture gas

| Sample | Volts | Amps | Depo. Time (min.) | Thickness (Å) | Depo. Rate per Input power · min. (Å/W · min.) |
|---|---|---|---|---|---|
| A-0% $O_2$ Total:9.0E-3 Ar:9.0E-3 | 124 | 0.53 | 1.5 | 601 | 6.10 |
| B-25% $O_2$ Total:9.0E-3 Ar:8.1E-3 $O_2$:2.7E-3 | 163 | 0.53 | 1.5 | 1376 | 10.4 |
| C-50% $O_2$ Total:9.2E-3 Ar:5.7E-3 $O_2$:5.7E-3 | 167 | 0.53 | 1.5 | 1375 | 10.4 |
| D-75% $O_2$ Total:9.2E-3 Ar:2.9E-3 $O_2$:8.0E-3 | 158 | 0.53 | 1.5 | 1120 | 8.92 |
| E-100% $O_2$ Total:9.2E-3 $O_2$:9.2E-3 | 131 | 0.53 | 1.5 | 447 | 4.29 |

Figure 12:
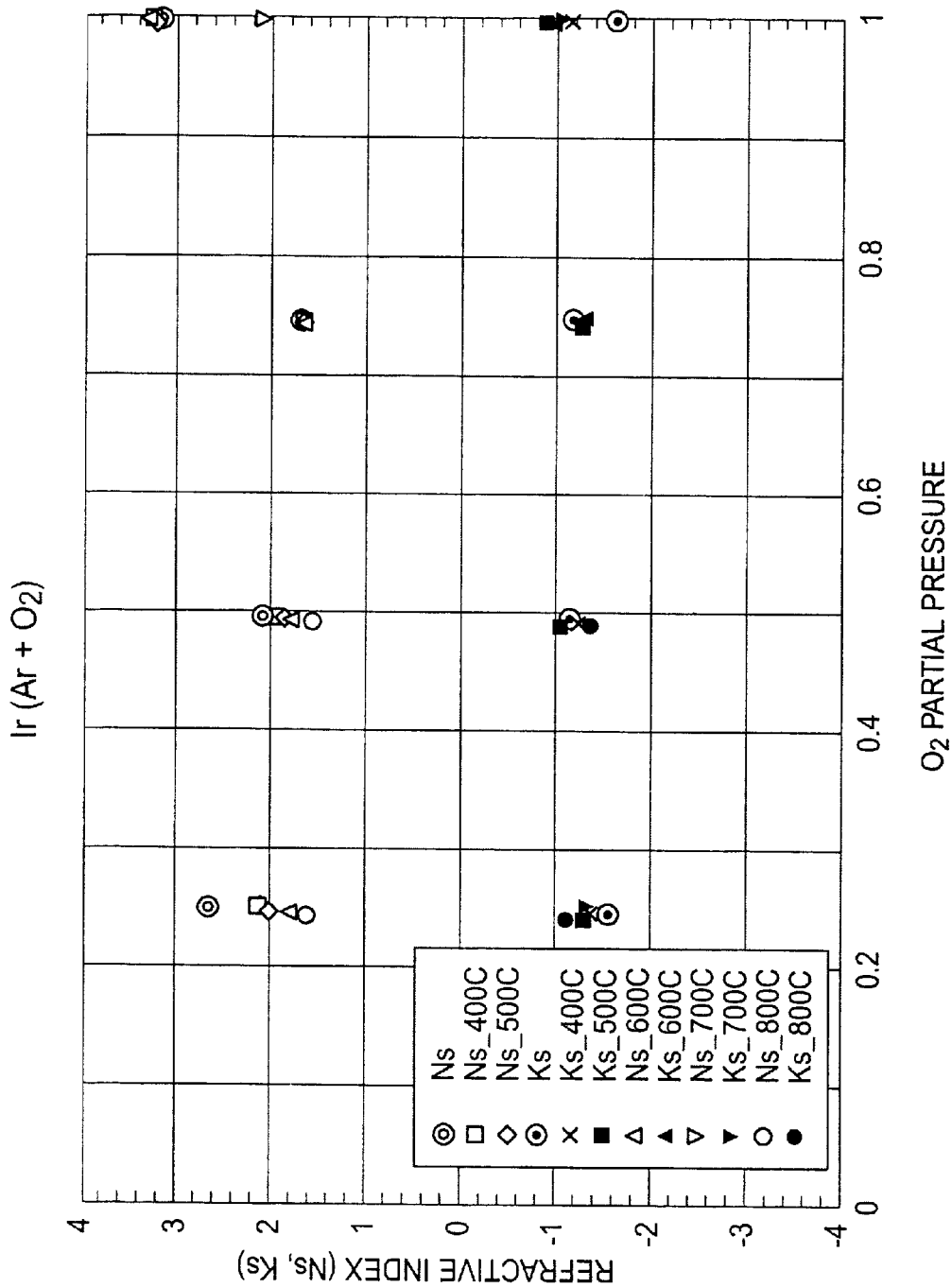
FIG. 12 depicts refractive index data obtained from samples of DC magnetron sputter-deposited iridium using a carrier gas mixture including argon and oxygen of which oxygen partial pressure is 25%, 50%, 75%, and 100% for the respective samples with additional comparison of the effects due to variations in anneal temperature from 400° C. to 800° C.

FIG. 12 shows that the refractive index of the deposited iridium oxide stayed relatively constant over the range of 25% to 50% and mostly around 50% in the partial pressure of oxygen carrier gas. This stability in the refractive index shows that DC sputtering deposition does not form a semi-oxidized film with an oxygen reactive gas species in the carrier gas mixture and bears comparison with prior RF sputtering techniques.

Figure 13:
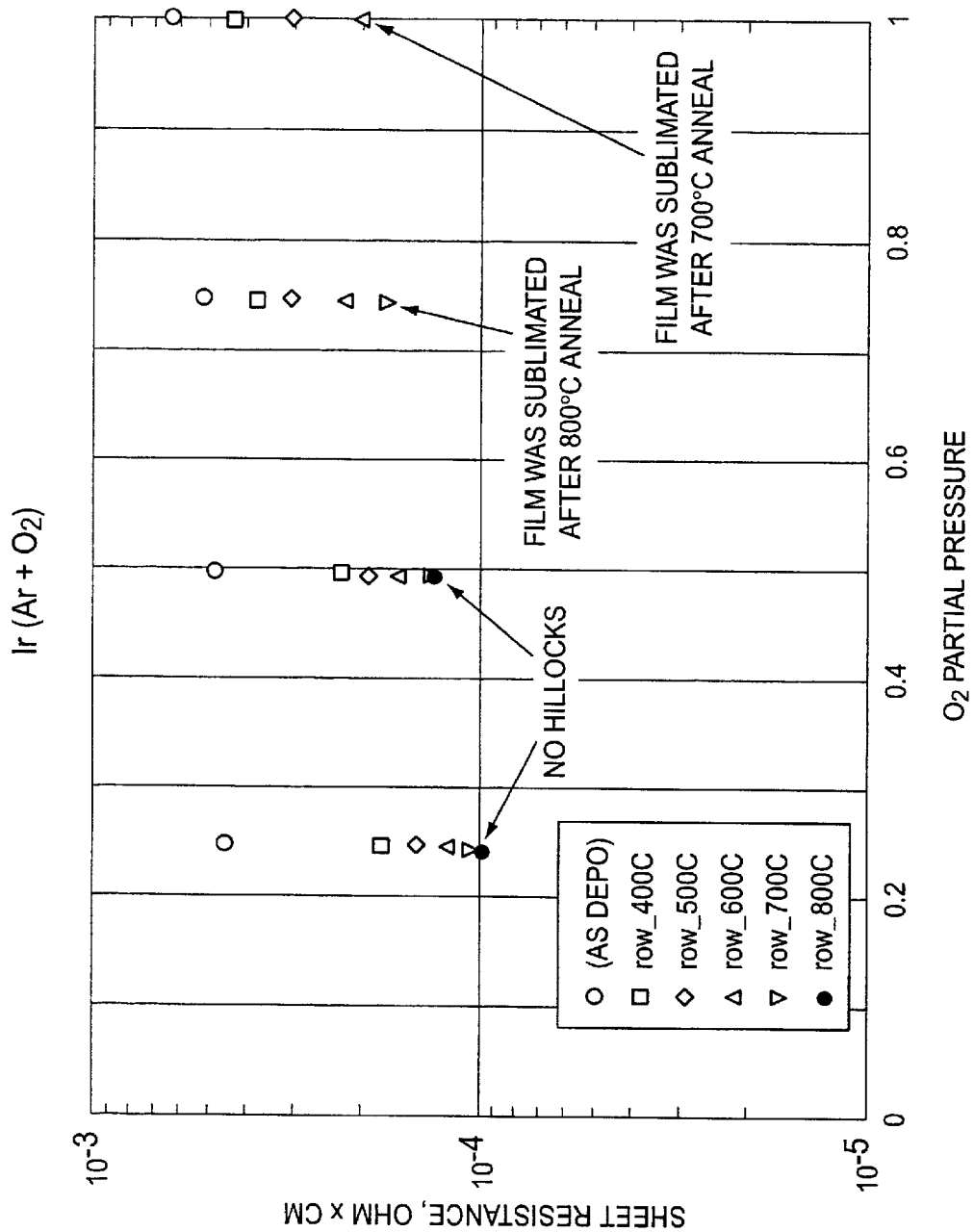
FIG. 13 depicts data including sheet resistance measurements and morphology observations on the DC-sputter deposited films corresponding to the 25%, 50%, 75%, and 100% oxygen samples of FIG. 12 with additional comparison of the effects due to variations in anneal temperature from 400° C. to 800° C.

FIG. 13 shows results for sheet resistance measurements and morphology observation that were taken using a conventional picoampmeter and microscope on the DC-sputter deposited films corresponding to the 25%, 50%, 75%, and 100% oxygen samples of FIG. 12 after thermal anneal stress from 400° C. to 800° C. subsequent to deposition. Films that were obtained using 25% to 50% oxygen contents had relatively lower resistance and no hillocks even up to 800° C. annealing. The increasing resistance corresponds to increasing oxidation of the iridium metal.

EXAMPLE 3

Sensitivity of DC Sputter-deposited Iridium to Nitrogen Content of the Carrier Gas Used in DC Sputtering The procedure of EXAMPLE 2 was repeated with substitution of nitrogen for the oxygen portion of the carrier gas mixture to investigate the possibility of forming iridium oxide or iridium oxy-nitride films via the intermediate formation of iridium nitride films.

Figure 14:
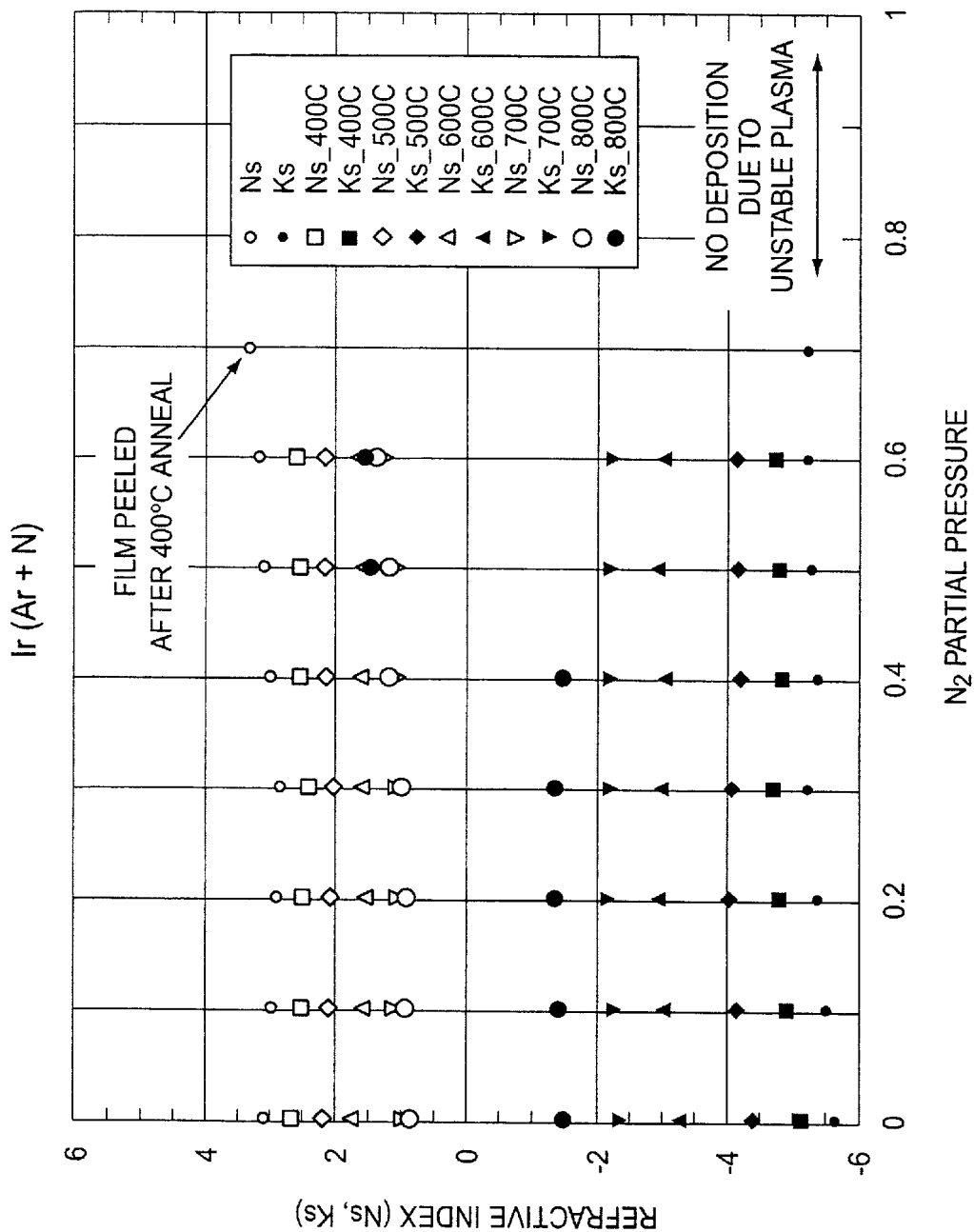
FIG. 14 depicts refractive index data obtained from DC magnetron sputter-deposited iridium using a carrier gas mixture including argon and nitrogen of which nitrogen partial pressure is 0%, 10%, 20%, 30%, 40%, 50%, 60%, 70%, 80%, 90%, and 100% for the respective samples with additional comparison of the effects due to variations in anneal temperature from 400° C. to 800° C.

FIG. 14 depicts the results of refractivity index measurements along thermal stress curves for a comparison between the oxygen-deposition data shown in FIG. 13 and the nitrogen-deposition data. As in the case of oxygen deposition, film stability remained relatively poor for partial pressure nitrogen at deposition values greater than 50%. No deposition occurred for partial pressure nitrogen values greater than 70% due to unstable plasma. Hillocks were observed in all samples that were annealed at temperatures greater than 600° C. Formation from iridium nitride to iridium oxide occurs with intermediate iridium metal formation, and the hillocks were formed when this metallic iridium was oxidized.

EXAMPLE 4

Preparation of Ferroelectric Capacitor Devices

A plurality of ferroelectric capacitor devices 400 were prepared on a single wafer 402 using a 0.2 moles per liter layered superlattice material precursor solution that was purchased on commercial order from Kojundo Chemical Corporation of Saitama, Japan. Chemical analysis of the solution confirmed that it contained metal hexanoates in n-octanes with the metals being in proportions corresponding to the metals in an empirical formula $SrBi_{2.53}(Nb_{0.38}Ta_{1.71})O_{10.02}$. Thus, the solution had a stoichiometric excess amount of bismuth and a stoichiometric excess amount of Nb and Ta B-site metals, as compared to a Class A Smolenskii formula (see above) wherein m=2. The discussion below makes reference to FIGS. 4 and 11.

Process step P1102 (see FIG. 11) was commenced by placing a commercially available silicon wafer placing in a diffusion furnace to grow oxide layer 404 (see FIG. 4). The substrate including oxide layer 404 was placed in a DC-magnetron sputtering equipment Model Number PVD-300 made by Unifilm Technology Corporation for completion of step P1104. An iridium oxide layer having both functions of adhesion layer 406 and a first conductive film 410 was formed as a bottom electrode 412 in step P1104. The iridium oxide layer was DC sputtered to a thickness of 3025 Å. The carrier gas mixture in the vacuum chamber included a 5.7 E-3 Torr partial pressure of oxygen ($O_2$) and a 5.7 E-3 Torr partial pressure of argon, i.e., a 50% partial pressure of oxygen to stabilize plasma, and total pressure from these conditions is relatively high pressure compared to typical argon only plasma. Sputtering was performed using 166 V and 0.53 A over 3.2 minutes.

Step P1108 was performed by placing the wafer in a conventional spin-coat machine and spinning the wafer at 500 rpm while an eyedropper was used to place 4 ml of solution onto the spinning wafer for five seconds. The rotational speed was increased to 1300 rpm for forty seconds and 3000 rpm for five seconds to provide a uniform film of precursor liquid coating the substrate.

In step P1110, the wafer was placed on a 150° C. hot plate for two minutes in air then removed and immediately placed on a second hot plate at 260° C. for four minutes to dry the liquid precursor. In step P1112, the dried liquid precursor residue was exposed in air to a conventional rapid thermal processing lamp at 650° C. for sixty seconds to soft bake the dried precursor residue.

As a consequence of step P1114, the steps of applying the liquid precursor solution, drying, and soft baking were repeated a second time to build layer thickness of the soft baked material up to about 2000 Å.

A first anneal P1116 of the soft baked precursor residue was conducted in a diffusion furnace under an oxygen flow at 525° C. for one hundred and four minutes including a twenty-two minute ramp into the furnace and a twenty-two minute ramp out of the furnace. The wafer was removed from the furnace and stood to room temperature.

An iridium oxide layer was DC sputtered to a thickness of about 3000 Å thick during step P1118. The resultant iridium oxide material functioned as top electrode 422 including both the second conductive film 424 and the adhesion layer 426. Sputtering was performed using a carrier gas mixture including 5.7 E-3 Torr Ar and 5.7 E-3 Torr $O_2$. DC sputtering conditions included the use of 166 V and 0.53 A for 3.2 minutes to obtain a 3025 Å thickness.

In step P1120, the top electrode 422 was covered with a conventional spin-on negative photoresist. The wafer including the resist was baked in air on a hot plate at 100° C. for five minutes, after which time the wafer was exposed to ultraviolet radiation under mask for 1.8 seconds to pattern the resist. The resist was developed for 1.5 minutes in an n-butyl acetate rinse under nitrogen atmosphere. The developed pattern was hard baked on a hot plate at 140° C. for five minutes. The wafer was next subjected to ion mill etching. The resist was removed by conventional plasma stripping.

Step P1122 included annealing the top electrode in an oxygen diffusion furnace at 800° C. for two hours including a twenty two minute ramp into the furnace and a twenty two minute ramp out of the furnace.

As a result of this process, the final wafer held a plurality of planar-type ferroelectric capacitors 400 each having a 6940 $\mu m^2$ surface area and a structure of stacked iridium oxide/ferroelectric layer/iridium oxide/silicon oxide atop the silicon substrate from the surface. The final wafer was designated sample AA.

EXAMPLE 5

Variations on Capacitor Structure

A plurality of wafers were prepared in an identical manner with respect to the first wafer (AA) of Example 4, except that steps P1104 and P1118 were varied to sputter different metals and metal oxides. Capacitors 400 on a second wafer (AB) contained platinum for first conductive film 410 and iridium oxide for adhesion layer 406 to form bottom electrode 412. Capacitors on the second wafer (AB) contained iridium oxide for adhesion layer 426 and platinum for second conductive film 424 to form top electrode 422, i.e., the overall capacitor structure (AB) contained iridium oxide/ platinum/ferroelectric layer/platinum/iridium oxide/silicon oxide atop the silicon substrate.

Sample (AC) was prepared to consist of iridium for first conductive film 410 and iridium oxide for adhesion layer 406 to form bottom electrode 412, as well as and iridium oxide for adhesion layer 426 and iridium of second conductive film 424 to form top electrode 422, i.e., the overall capacitor structure (AC) contained iridium oxide/iridium/ ferroelectric layer/iridium/iridium oxide/silicon oxide atop the silicon substrate. In addition, this sample (AC) is believed to have converted to a structure including iridium oxide/iridium/functionally oxidized iridium/ferroelectric layer/functionally oxidized iridium/iridium/iridium oxide/ silicon oxide atop silicon substrate structure due to oxidation reaction at surfaces between ferroelectric layer and iridium. The structural differences do not exist as a result of the sputter-deposited materials, but the formation process leads to interlayer surface oxidation with the resultant formation of metal oxides, e.g., iridium oxide composition in an oxidized iridium metal system with an oxidation gradient from the ferroelectric layer into the iridium metal.

While the "A" samples were prepared having the structure of capacitor 400, a corresponding series of "B" electrode samples were prepared in the same manner including the capacitors 500 from FIG. 5 including the polysilicon plug 504 beneath a diffusion barrier layer 506.

EXAMPLE 5

Comparative Test Measurements

A representative test capacitor was selected from each the wafer that was produced in Example 4, i.e., samples AA, AB, AC, BA, BB, and BC. An elipsometer was used to calculate thickness of the ferroelectric layer 420 at 2220 Å for samples M and BA, 2295 Å A for samples AB and BB, and 2400 Å for samples AC and BC. A Hewlett Packard 8115A function generator and a Hewlett Packard 54502A digitizing oscilloscope were operably connected to a 9.91 nF load capacitor for conducting remanent polarization measurements on the samples having a constant temperature maintained at 25° C. Probes were used to contact the capacitors, and remanent polarization was commenced using a triangular waveform at 10,000 Hz at 25° C. having an amplitude of 125 kV/cm.

Figure 15:
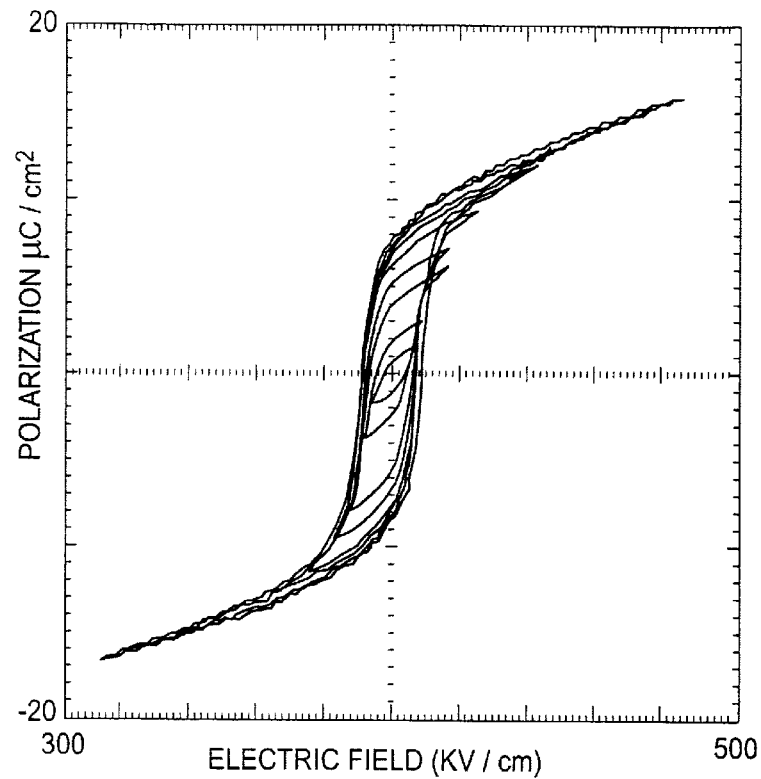
FIG. 15 depicts polarization hysteresis data obtained from a sample including iridium oxide/ferroelectric layer/iridium oxide/silicon oxide atop a silicon substrate.
Figure 16:
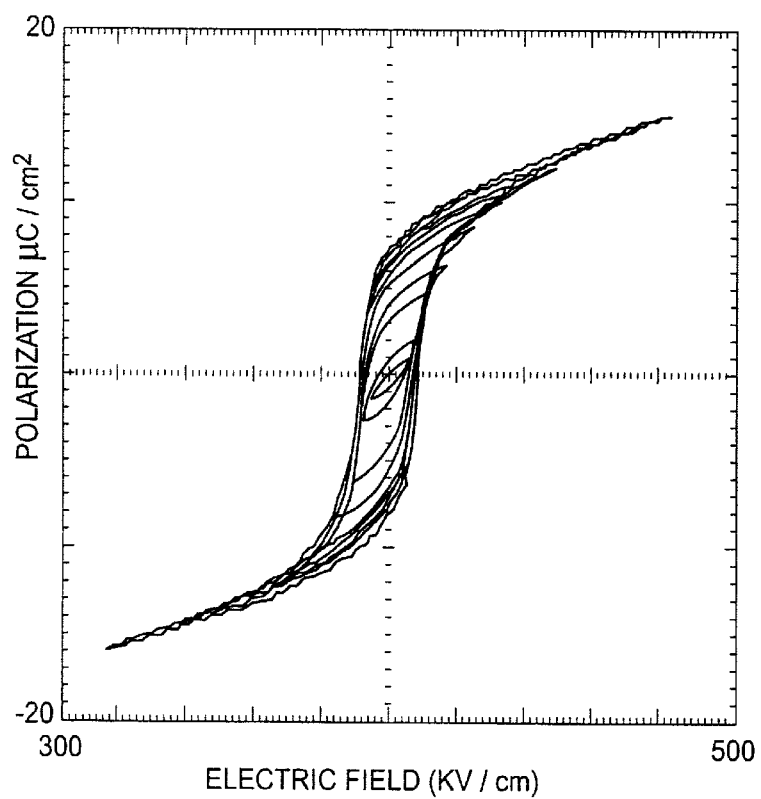
FIG. 16 depicts polarization hysteresis data obtained from a sample including iridium oxide/platinum/ferroelectric layer/platinum/iridium oxide/silicon oxide atop a silicon substrate.
Figure 17:
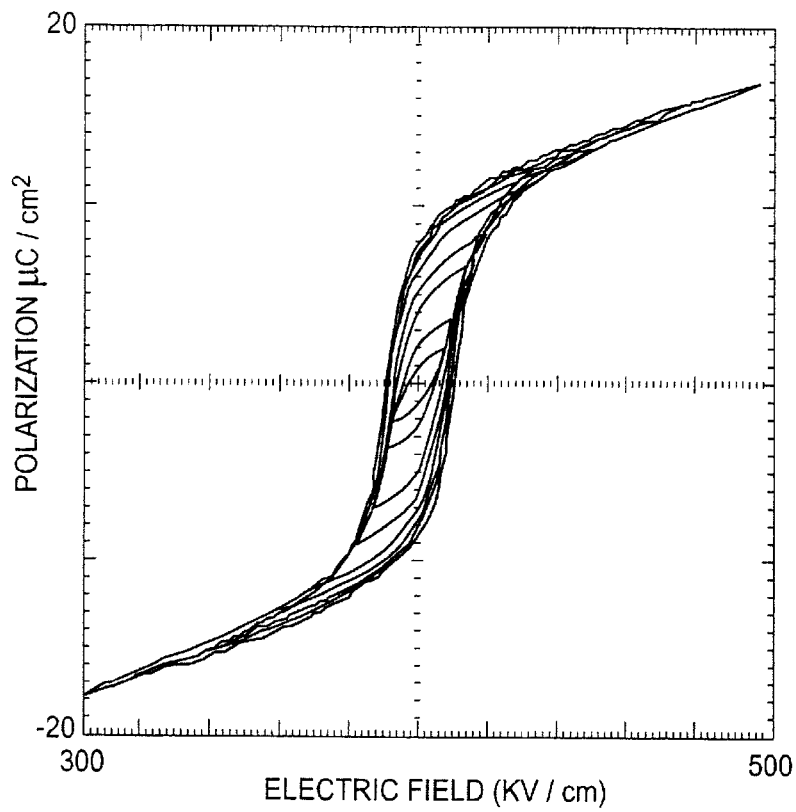
FIG. 17 depicts polarization hysteresis data obtained from a sample including iridium oxide/iridium/ferroelectric layer/iridium/iridium oxide/silicon oxide atop silicon substrate.

FIG. 15 shows the hysteresis measurement for the sample AA (iridium oxide electrodes), FIG. 16 for the sample AB (iridium oxide/platinum/ferroelectric layer/platinum/iridium oxide/silicon oxide atop the silicon substrate), and FIG. 17 for the sample AC (iridium oxide/iridium/ferroelectric layer/ iridium/iridium oxide/silicon oxide atop the silicon substrate).

Figure 18:
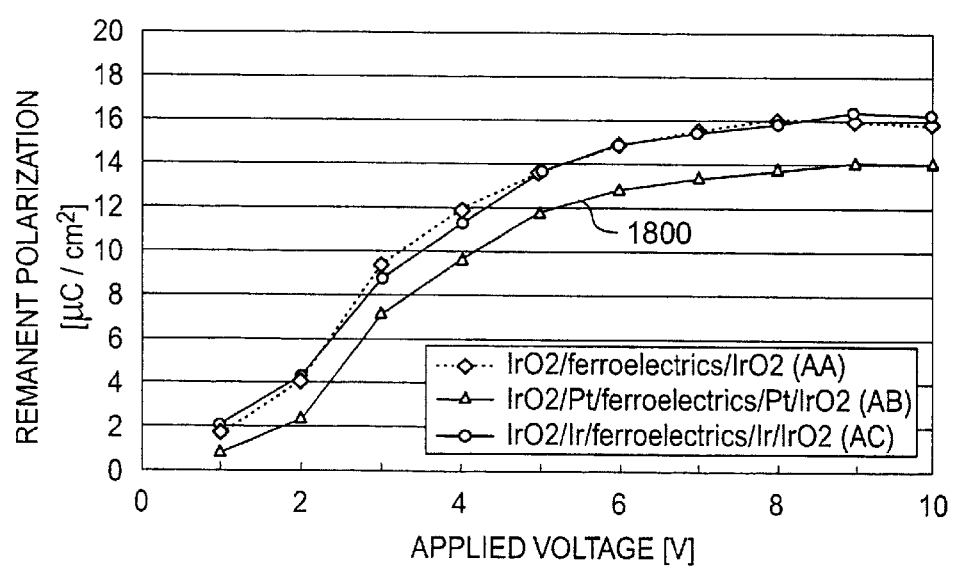
FIG. 18 depicts a summary of the remanent polarization data obtained from the three samples corresponding to FIGS. 15, 16, and 17.

FIG. 18 shows a summary of remanent polarization data for the three samples AA, AB, and AC corresponding to FIGS. 15, 16, and 17. A comparison of SEM micrographs between the samples AA and AB, or AC and AB, shows that iridium oxide or functionally oxidized iridium is better material for an oxide barrier than platinum, due to granular-like structure of iridium and iridium oxide, while platinum has a columnar structure that is believed to be more permeable to oxygen. This indication was confirmed by the curve 1800 corresponding to the $IrO_2$/Pt sample where increased oxidation at the platinum/ferroelectric boundary has impaired the remanent polarization of the ferroelectric material. There are no appreciable differences between the iridium and iridium oxide sequences of samples AA and AC.

FIGS. 19, 20, 21, 22, 23, and 24 show the hysteresis fatigue endurance measurement results with the samples AA, AB, and AC respectively. The switching curves of FIGS. 19, 20 and 21 each include an initial hysteresis curves and a final hysteresis curve after $10^{10}$ cycles. The initial polarization curve was measured using a 3 V triangular waveform having an amplitude of 125 kV/cm, as were polarization curves at $10^6$, $10^7$, $10^8$, $10^9$, and $10^{10}$ cycles. Switching cycles without polarization measurement data being collected were performed using 6 V a square wave at 1,000,000 Hz. In each case, remanent polarization at $10^{10}$ cycles stayed within ten percent of the polarization value for virgin material while imprint determined as the shifting of the center of the hysteresis curves relative to zero voltage improved with age and did not prohibit use of the ferroelectric materials in electronic memories.

Figure 19:
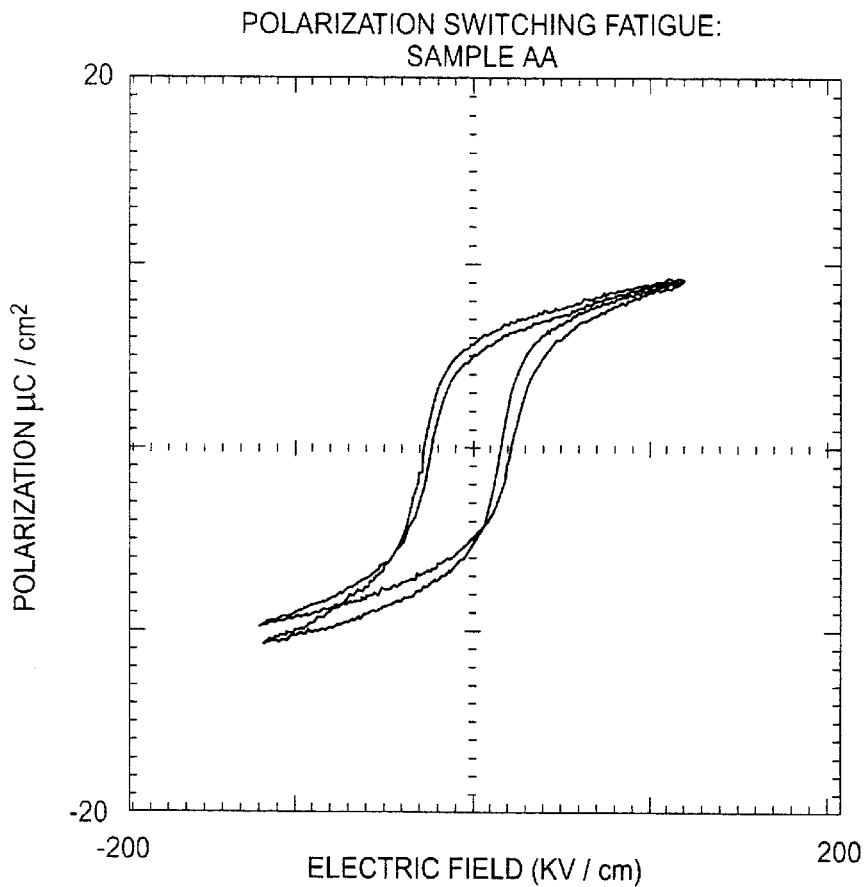
FIG. 19 depicts an overlay comparison of polarization hysteresis curves that were obtained from the sample of layered superlattice material corresponding to FIG. 15 at one switching cycle and $10^{10}$ cycles, respectively.
Figure 20:
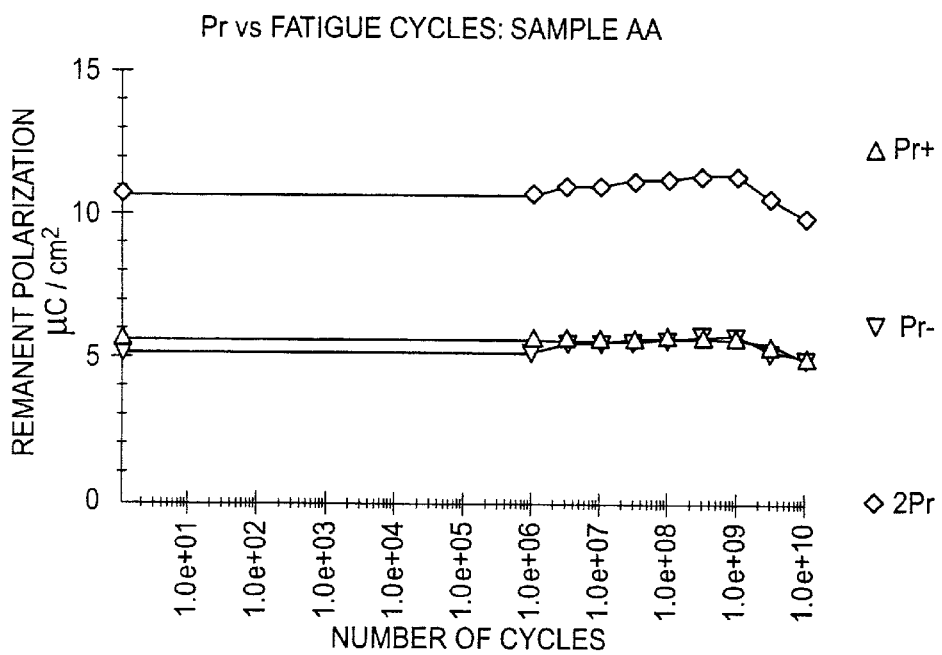
FIG. 20 depicts a polarization fatigue endurance curve that was obtained from the sample corresponding to FIG. 15 between one and $10^{10}$ cycles.

For FIG. 19, the virgin ferroelectric capacitor at one cycle at 125° C. under an applied voltage of 2.78 V for 2220 Å film, i.e., under an applied electrical field of 125 kV/cm had a 2Pr polarization of 10.75 $\mu C/cm^2$. Polarization grew to a maximum value of 11.41 $\mu C/cm^2$ after $10^9$ cycles, and then declined to 9.92 $\mu C/cm^2$ after $10^{10}$ cycles. The final 2Pr value at $10^{10}$ cycles was 7.7% smaller than the initial 2Pr value, as shown in FIG. 20. A $V_{center}$ value for imprint of the virgin curve was calculated by adding together the Ec– and Ec+ values and dividing by two to arrive at a value of –5.80 KV/cm. A comparable $V_{center}$ value after $10^{10}$ cycles was –0.65 KV/cm. Amount of $V_{center}$ shift is +5.15 kV/cm for 2220 Å film, i.e., 0.114 V.

Figure 21:
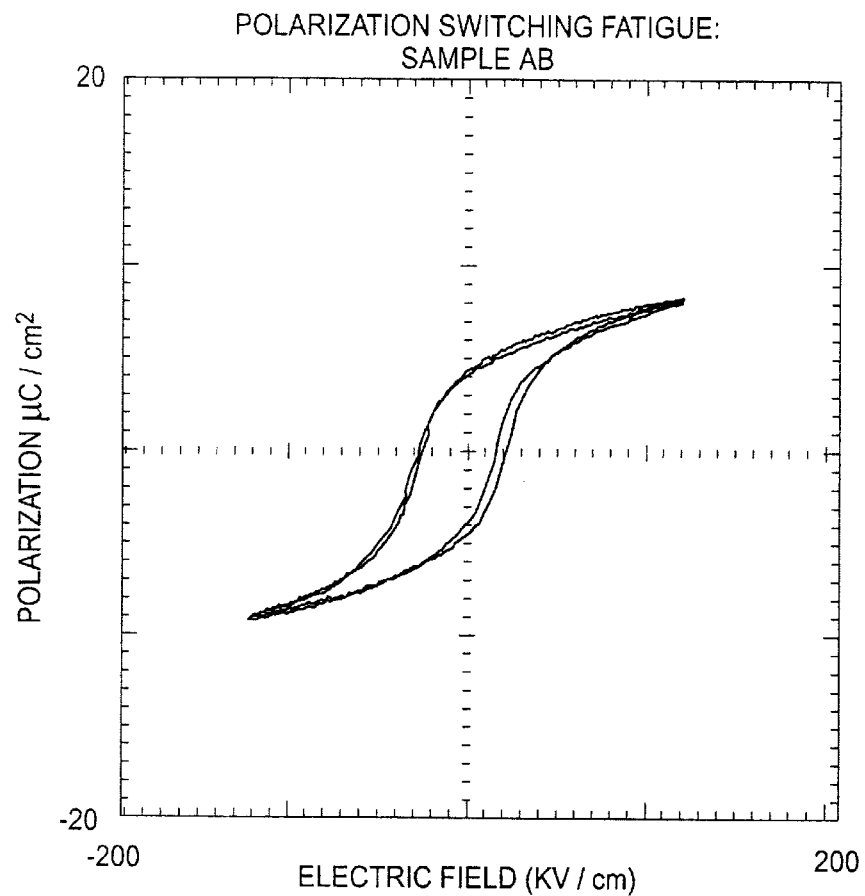
FIG. 21 depicts an overlay comparison of polarization hysteresis curves that were obtained from the sample of layered superlattice material corresponding to FIG. 16 at one switching cycle and $10^{10}$ cycles, respectively.
Figure 22:
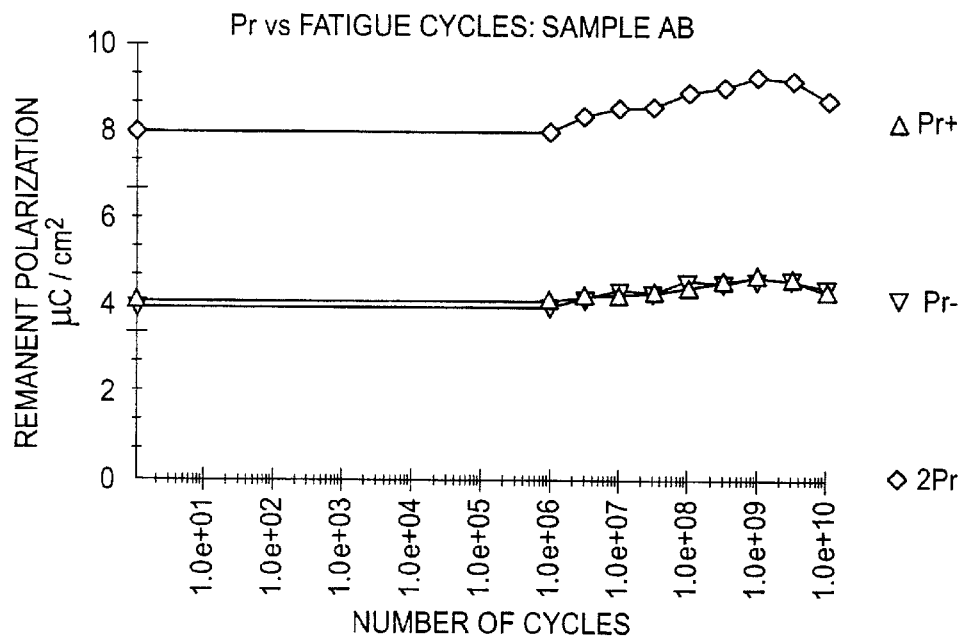
FIG. 22 depicts a polarization fatigue endurance curve that was obtained from the sample corresponding to FIG. 16 between one and $10^{10}$ cycles.

For FIG. 21, the virgin ferroelectric capacitor at one cycle at 125° C. under an applied voltage of 2.87 V for 2295 Å film, i.e., under an applied electrical field of 125 kV/cm had a 2Pr polarization of 8.06 $\mu C/cm^2$. Polarization grew to a maximum value of 9.34 $\mu C/cm^2$ after $10^9$ cycles, and then declined to 8.77 $\mu C/cm^2$ after $10^{10}$ cycles. The final 2Pr value at $10^{10}$ cycles was 8.8% greater than the initial 2Pr value, as shown in FIG. 22. A $V_{center}$ value for the initial curve was calculated by adding together the Ec– and Ec+ values to arrive at a value of –5.33 KV/cm. A comparable $V_{center}$ value after $10^{10}$ cycles was –1.67 KV/cm. Amount of $V_{center}$ shift is +3.66 kV/cm for 2295 Å film, i.e., 0.084 V.

Figure 23:
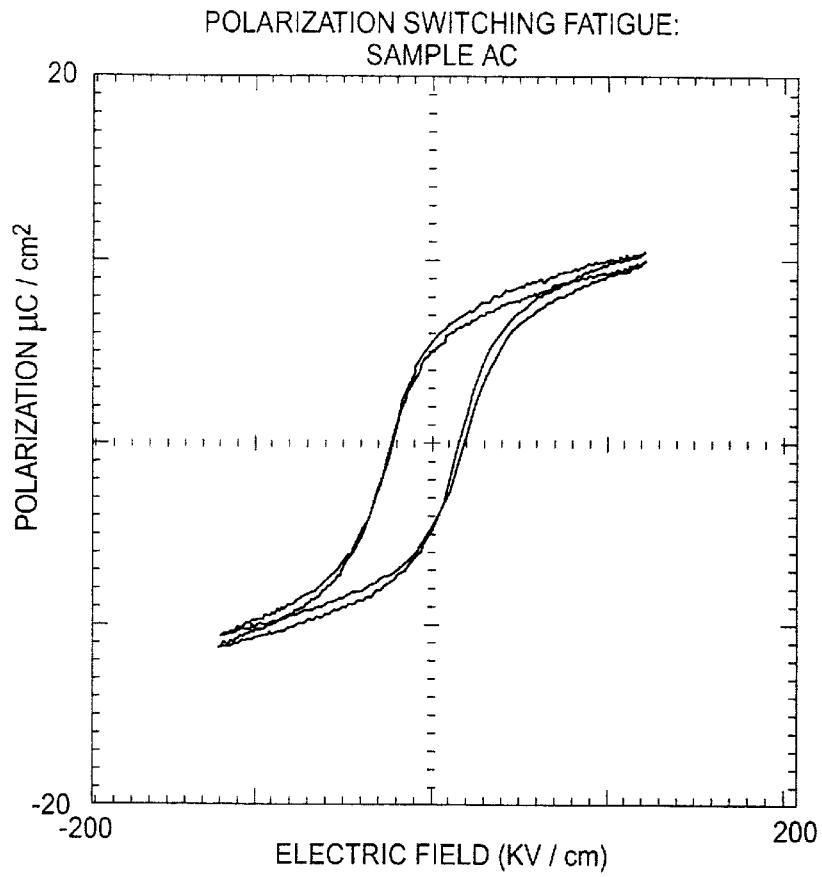
FIG. 23 depicts an overlay comparison of polarization hysteresis curves that were obtained from the sample of layered superlattice material corresponding to FIG. 17 at one switching cycle and $10^{10}$ cycles, respectively.
Figure 24:
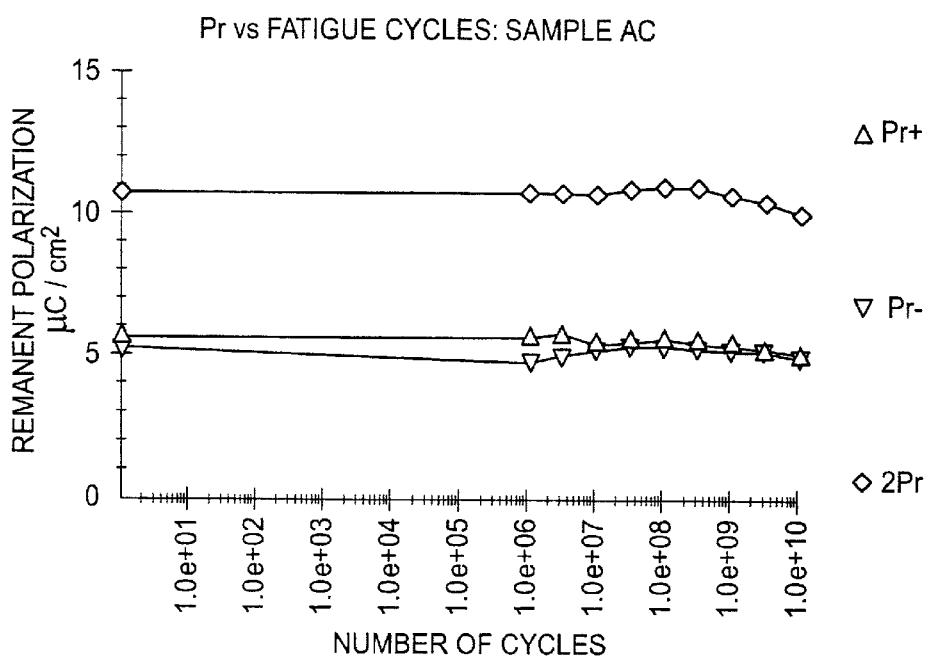
FIG. 24 depicts a polarization fatigue endurance curve that was obtained from the sample corresponding to FIG. 17 between one and $10^{10}$ cycles.

For FIG. 23, the virgin ferroelectric capacitor at one cycle at 125° C. under an applied voltage of 3.00 V for 2400 Å film, i.e.., under an applied electrical field of 125 kV/cm had a 2Pr polarization of 10.7 $\mu C/cm^2$. Polarization stayed or slightly grew around a value of 10.8 $\mu C/cm^2$ until $3.16 \times 10^8$ cycles, and then declined to 9.95 $\mu C/cm^2$ after $10^{10}$ cycles. The final 2Pr value at $10^{10}$ cycles was 7.0% smaller than the initial 2Pr value, as shown in FIG. 24. A $V_{center}$ value for the initial curve was calculated by adding together the Ec– and Ec+ values to arrive at a value of –3.33 KV/cm. A comparable $V_{center}$ value after $10^{10}$ cycles was +0.97 KV/cm. Amount of $V_{center}$ shift is +5.15 kV/cm for 2400 Å film, i.e., 0.023 V.

Figure 25:
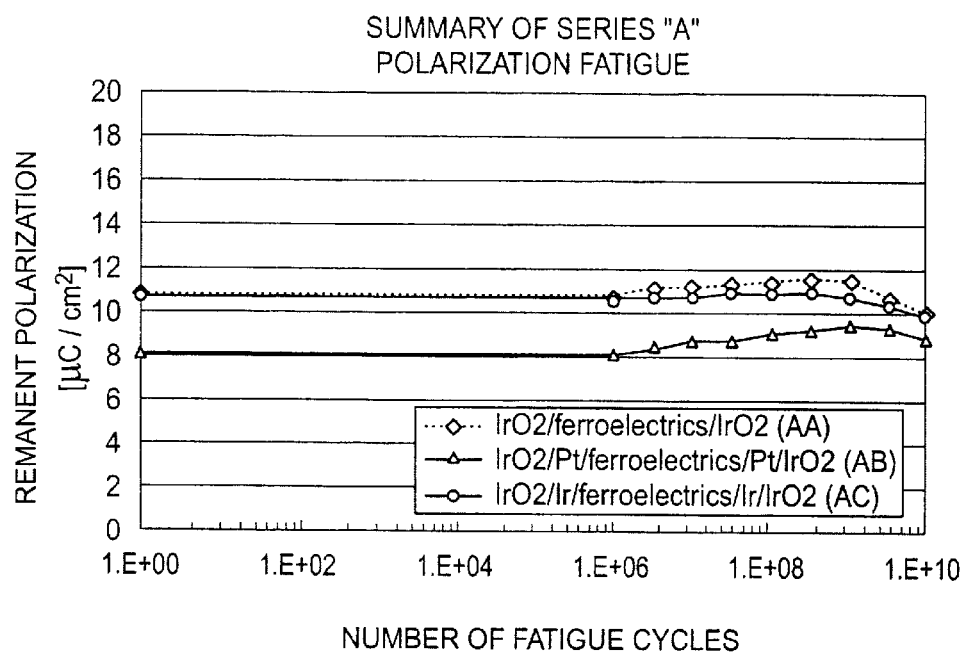
FIG. 25 depicts a summary of remanent polarization data obtained from the three samples corresponding to FIGS. 20, 22, and 24.

FIG. 25 shows a summary of remanent polarization data for the three samples AA, AB, and AC. The sample AC of iridium oxide/iridium/ferroelectric layer/iridium/iridium oxide/silicon oxide atop silicon substrate is the most stable and has the highest remanent polarization value of 9.95 $\mu C/cm^2$ after $10^{10}$ cycles.

Figure 26:
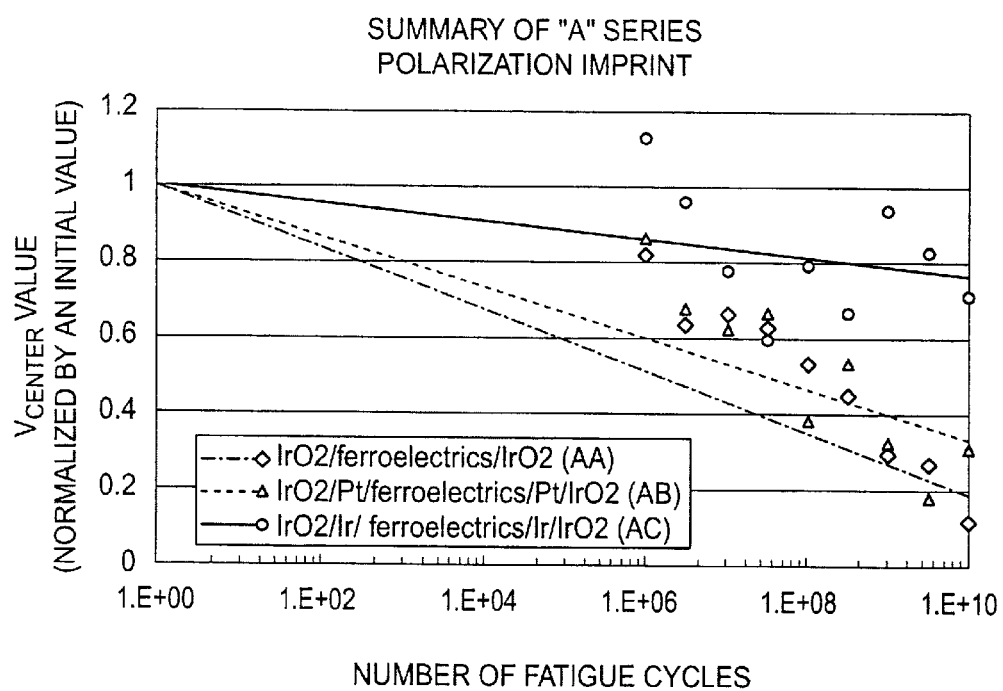
FIG. 26 depicts a summary of $V_{center}$ values representing imprint that have been normalized by an initial value of coercive field for three samples corresponding to FIGS. 19, 21, and 23.

FIG. 26 provides a linear regression analysis as a summary of "A" series $V_{center}$ values calculated by adding together the Ec– and Ec+ values along fatigue endurance stress up to $10^{10}$ cycles. The sample AC was less imprinted than other samples, as determined by a shift relative to $V_{center}$ values that were normalized to a value of one for the initial $V_{center}$ value.

Hysteresis fatigue endurance measurement were also completed in an identical manner for the "B" series samples BA, BB, and BC respectively. The "B" series study evaluated the diffusion barrier efficacy of barrier layer 506 in preventing diffusion from the low dielectric polysilicon plug 502. Among these three samples, only sample BC including iridium oxide/iridium/ferroelectric layer /iridium/iridium oxide/poly-silicon plug/silicon oxide atop silicon substrate stood the severe fatigue stress. The resultant data is shown in FIGS. 27 and 28.

Figure 27:
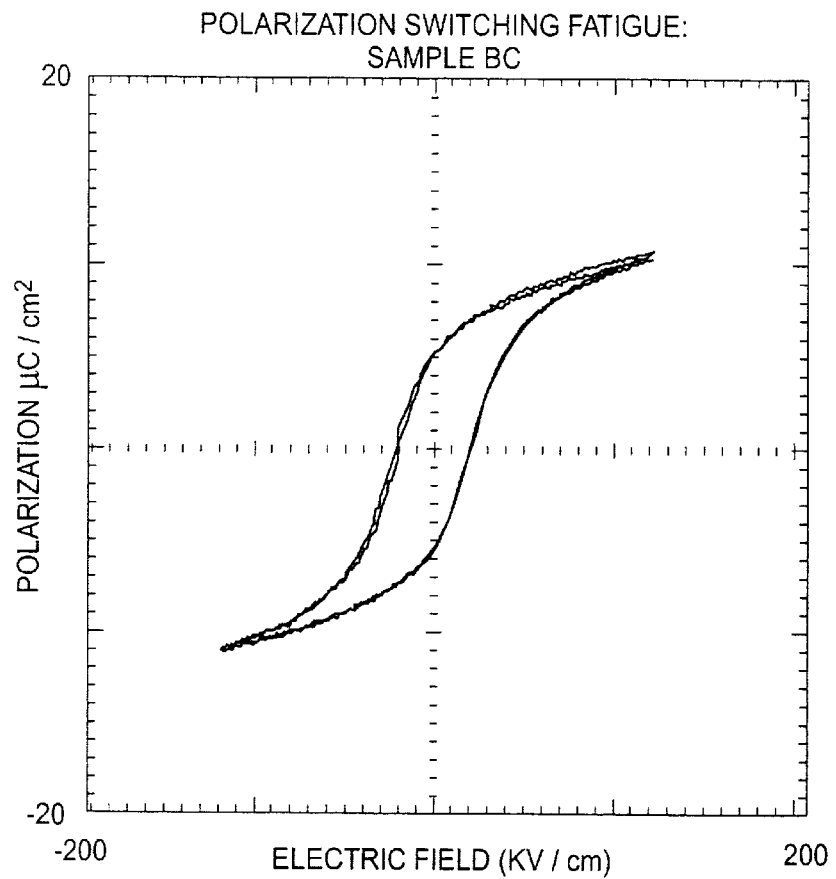
FIG. 27 depicts an overlay comparison of polarization fatigue endurance curve obtained from stacked sequence including iridium oxide/iridium/ferroelectric layer/iridium/iridium oxide/poly-silicon/silicon oxide atop a silicon substrate at one switching cycle and $10^{10}$ cycles.
Figure 28:
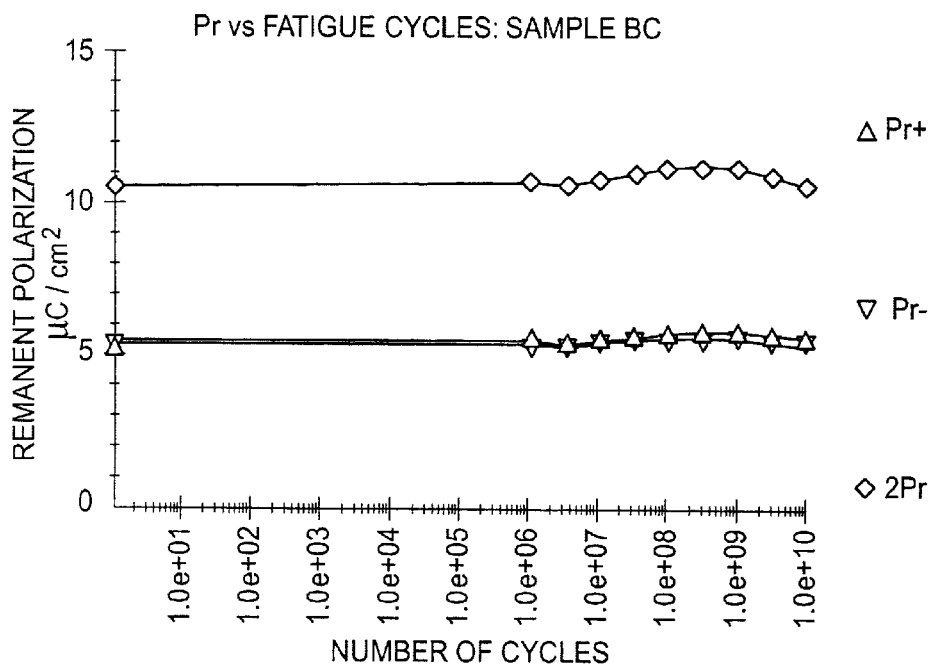
FIG. 28 depicts a polarization fatigue endurance switching curve obtained from the sample of layered superlattice material corresponding to FIG. 27 between one and $10^{10}$ cycles.

For FIG. 27, the virgin ferroelectric polarization had a 2Pr polarization of 10.53 $\mu C/cm^2$. Polarization grew to a maximum value of 11.25 $\mu C/cm^2$ after $10^9$ cycles, and then declined to 10.63 $\mu C/cm^2$ after $10^{10}$ cycles under an applied fatigue endurance field of 250 kV/cm as shown in FIG. 28. The final 2Pr value at $10^{10}$ cycles was 0.9% smaller than the initial 2Pr value. A $V_{center}$ value for the initial curve was calculated by adding together the Ec– and Ec+ values to arrive at a value of –0.92 KV/cm. A comparable $V_{center}$ value after $10^{10}$ cycles was –1.57 KV/cm. Amount of $V_{center}$ shift is 0.65 kV/cm for 2400 Å film, i.e., 0.016 V.

These improvements in polarization hysteresis were heretofore unheard of in thin film ferroelectrics, i.e., improvements in the magnitude of polarization after $10^{10}$ cycles and less imprint after $10^{10}$ cycles.

EXAMPLE 6

Sensitivity of Polarization Improvements to Oxygen Content of the Carrier Gas Used in DC Sputtering A plurality of ferroelectric capacitor devices 400 were prepared on a single wafer 402 using a 0.2 moles per liter layered superlattice material precursor solution that was purchased on commercial order from Kojundo Chemical Corporation of Saitama, Japan. Chemical analysis of the solution confirmed that it contained metal hexanoates in n-octanes with the metals being in proportions corresponding to the metals in an empirical formula $SrBi_{2.53}(Nb_{0.38}Ta_{1.71})O_{10.02}$. Thus, the solution had a stoichiometric excess amount of bismuth and a stoichiometric excess amount of Nb and Ta B-site metals, as compared to a Class A Smolenskii formula (see above) wherein m=2. The discussion below makes reference to FIGS. 4 and 5.

Process step P1102 (see FIG. 11) was commenced by placing a commercially available silicon wafer placing in a diffusion furnace to grow oxide layer 404 (see FIG. 4). The substrate including oxide layer 404 was placed in a DC magnetron sputtering equipment model PVD-300 made by Unifilm Technology Corporation for completion of step P804. An adhesion layer 406 of titanium oxide was formed in step P1104. A platinum metal layer 410 was DC sputtered to a thickness of 2793 Å. The carrier gas mixture in the vacuum chamber included a 1.3 E-3 Torr partial pressure of oxygen ($O_2$) and a 9.0 E-3 Torr partial pressure of argon, i.e., a 12.5% partial pressure of oxygen to stabilize plasma, and total pressure of these conditions is relatively high pressure compared to typical argon only plasma. Sputtering was performed using 153 V and 0.53 A over 3.8 minutes.

Step P1108 was performed by placing the wafer in a conventional spin-coater machine and spinning the wafer at 500 rpm while an eyedropper was used to place 4 ml of solution onto the spinning wafer for five seconds. The rotational speed was increased to 1300 rpm for forty seconds and 3000 rpm for five seconds to provide a uniform film of precursor liquid coating the substrate.

In step P1110, the wafer was placed on a 150° C. hot plate for two minutes in air then removed and immediately placed on a second hot plate at 260° C. for four minutes to dry the liquid precursor. In step P1112, the dried liquid precursor residue was exposed in air to a conventional rapid thermal processing lamp at 650° C. for sixty seconds to soft bake the dried precursor residue.

As a consequence of step P1114, the steps of applying the liquid precursor solution, drying, and soft baking were repeated a second time to build layer thickness of the soft baked material up to about 2000 Å. The final layer is spun-on at 6000 rpm to have about 500 Å to cover surface roughness.

A first anneal P1116 of the soft baked precursor residue was conducted in a diffusion furnace under an oxygen flow at 800° C. C for fifty-four minutes including a twenty-two minute ramp into the furnace and a twenty-two minute ramp out of the furnace. The wafer was removed from the furnace and stood to room temperature. The initial anneal stage anneal was followed by a second stage of one hundred and four minutes at 800° C. including a twenty-two minute ramp into the furnace and a twenty-two minute ramp out of the furnace. A third stage anneal was performed at 650° C. for one hundred and four minutes including a twenty-two minute ramp into the furnace and a twenty-two minute ramp out of the furnace.

About 2000 Å thick platinum was sputtered into place during step P1118. DC sputtering was performed to deposit second conductive film 424 without depositing adhesion layer 426 to form top electrode 422. Platinum metal was DC sputtered using a carrier gas mixture including 9.0 E-3 Torr Ar and 1.3 E-3 Torr $O_2$. DC sputtering conditions included the use of 151 V and 0.53 A for 2.6 minutes to obtain a 1911 Å thickness of the sputter-deposited metal.

In step P1120, the top electrode 422 was covered with a conventional spin-on negative photoresist. The wafer including the resist was baked in air on a hot plate at 100° C. for five minutes, after which time the wafer was exposed to ultraviolet radiation under mask for 1.8 seconds to pattern the resist. The resist was developed for 1.5 minutes in an n-butyl acetate rinse under nitrogen atmosphere. The developed pattern was hard baked on a hot plate at 140° C. for five minutes. The wafer was next subjected to ion mill etching. The resist was removed by conventional plasma stripping.

Step P1122 included annealing the top electrode in an oxygen diffusion furnace at 800° C. for one hundred and four minutes including a twenty two minute ramp into the furnace and a twenty two minute ramp out of the furnace. As a result of this process, the final wafer sample #SS10-4 held a plurality of square ferroelectric capacitors 400 each having a 6940 $\mu m^2$ surface area.

A representative test capacitor was selected from the wafer that was produced in the sample #SS10-4. An elipsometer was used to calculate thickness of the ferroelectric layer 420 at 2235 Å. A Hewlett Packard 8115A function generator and a Hewlett Packard 54502A digitizing oscilloscope were operably connected to a 9.91 nF load capacitor for conducting switching fatigue endurance measurements on a sample having a constant temperature maintained at 125° C. Probes were used to contact the capacitors, and fatigue endurance switching was commenced using a square waveform at 1,000,000 Hz having an amplitude of 5.59 V for 2235 Å film, i.e., under an applied fatigue endurance field of 250 kV/cm.

An initial polarization curve was measured using a triangular waveform having an amplitude of 2.79 V for 2235 Å film, i.e., under an applied electrical field of 125 kV/cm, as were polarization curves at $10^6$, $10^7$, $10^8$, $10^9$, and $10^{10}$ cycles.

Figure 29:
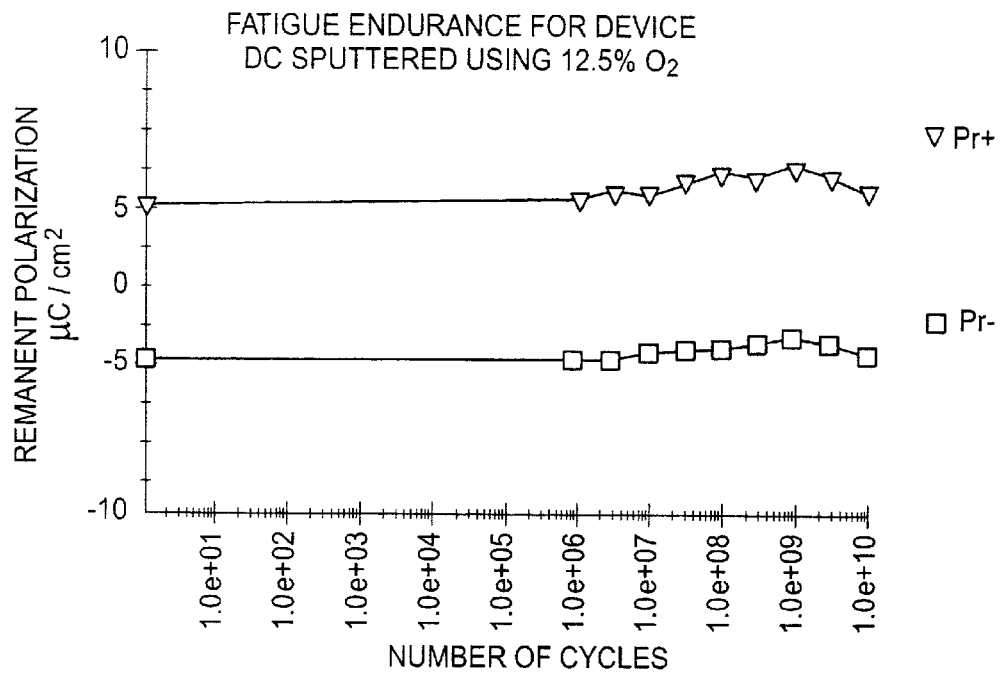
FIG. 29 depicts a polarization fatigue endurance curve obtained from a layered superlattice material interposed between a pair of platinum oxide electrodes that were deposited by DC sputtering in a reactive carrier gas mixture containing a 12.5% partial pressure of oxygen and an 87.5% partial pressure of argon.

FIG. 29 shows the hysteresis fatigue endurance measurement results. The X-axis represents the number of switching cycles. The Y-axis represents remanent polarization. Polarization actually improved out to about $10^9$ cycles, and thereafter began a slow decline out to $10^{10}$ cycles. The virgin ferroelectric capacitor at one cycle had a 2Pr polarization of 9.95 $\mu C/cm^2$. Polarization grew to a maximum value of 11.05 $\mu C/cm^2$ after $10^9$ cycles, and then declined to 10.34 $\mu C/cm^2$ after $10^{10}$ cycles. The final 2Pr value at $10^{10}$ cycles was 3.9% greater than the initial 2Pr value. A $V_{center}$ value for the initial curve was calculated by adding together the Ec– and Ec+ values to arrive at a value of –0.69 KV/cm. A comparable $V_{center}$ value after $10^{10}$ cycles was +0.04 KV/cm. Amount of $V_{center}$ shift is –0.73 kV/cm for 2235 Å film, i.e., 0.016 V.

Figure 30:
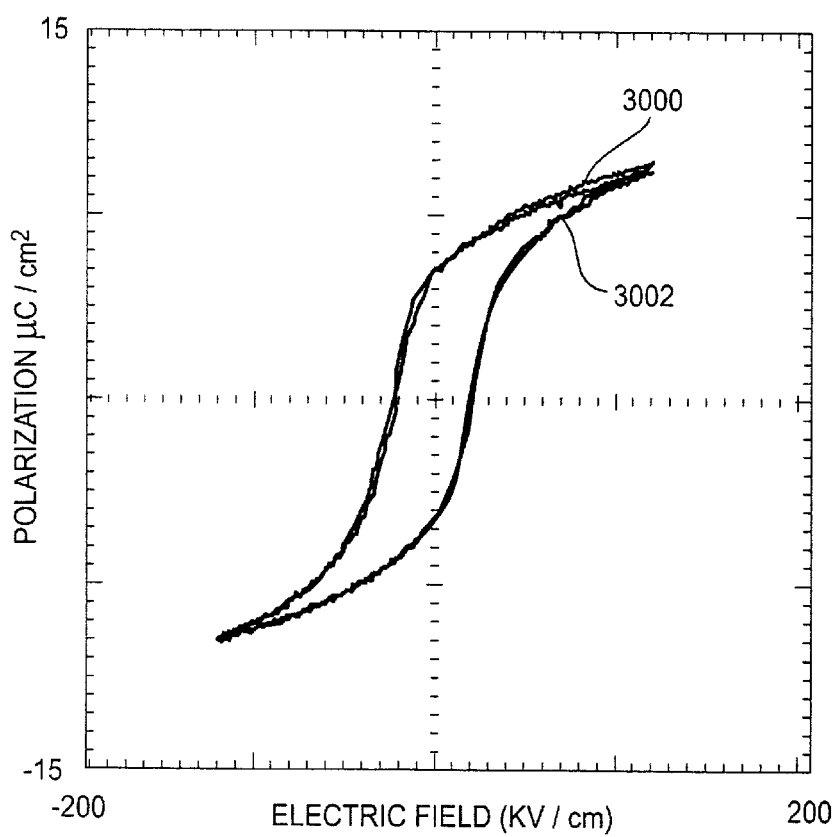
FIG. 30 depicts an overlay comparison of polarization hysteresis curves corresponding to measurements depicted in FIG. 29 at one switching cycle and $10^{10}$ cycles.

FIG. 30 depicts an overlay of the virgin polarization curve 3000 at one cycle over the polarization curve 3002 at $10^{10}$ cycles. The curves 3000 and 3002 are almost indistinguishable.

A plurality of wafers were prepared in an identical manner with respect to the sample #SS10-4, except that the oxygen content of the carrier gas used in the DC sputtering of steps P1104 and P1118 was varied to use an oxygen partial pressure of 0%, 25%, 50%, and 75% in argon. Small differences in actual sputtering conditions are noted in Table 3.

TABLE 3

| | Bottom Electrode | | | | Top Electrode | | | |
|---|---|---|---|---|---|---|---|---|
| Sample | Volts | Amps | Depo. Time (min.) | Thickness (Å) | Volts | Amps | Depo. Time (min.) | Thickness (Å) |
| #SS10-4 12.5% $O_2$ Ar:9.0E-3 $O_2$:1.3E-3 | 151 | 0.53 | 3.8 | 2793 | 151 | 0.53 | 2.6 | 1911 |
| #SS10-3 0% $O_2$ Ar:9.7E-3 | 135 | 0.53 | 5.0 | 2954 | 133 | 0.53 | 3.2 | 1891 |
| #SS10-5 25% $O_2$ Ar:8.1E-3 $O_2$:2.7E-3 | 164 | 0.53 | 3.2 | 2974 | 163 | 0.53 | 2.1 | 1952 |
| #SS10-6 50% $O_2$ Ar:5.7E-3 $O_2$:5.7E-3 | 172 | 0.53 | 2.6 | 3410 | 172 | 0.53 | 1.5 | 1967 |
| #SS10-7 75% $O_2$ Ar:2.9E-3 $O_2$:8.0E-3 | 162 | 0.53 | 3.2 | 3305 | 161 | 0.53 | 2.1 | 2169 |

Figure 31:
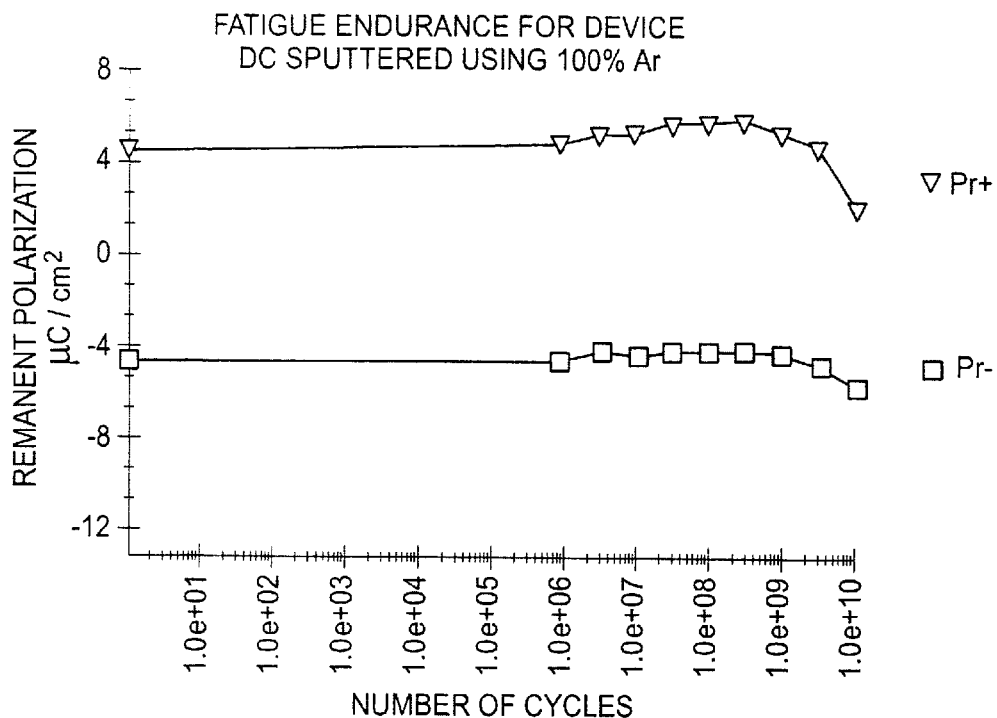
FIG. 31 depicts a polarization fatigue endurance curve obtained from a layered superlattice material interposed between a pair of platinum oxide electrodes that were deposited by DC sputtering in a reactive carrier gas mixture containing a 0% partial pressure of oxygen and a 100% partial pressure of argon.

FIG. 31 depicts a polarization hysteresis curve for a representative capacitor selected from Sample #SS10-3, which was produced under 0% oxygen, i.e., 100% Ar. Elipsometer measurements confirmed that the ferroelectric layer 420 was 2196 Å thick. Overall polarization declined 14.2% from the virgin sample at 8.75 µC/cm² to a value of 7.51 µC/cm² after $10^{10}$ cycles. The fatigued sample was more severely imprinted, as reflected by a $V_{center}$ value of −1.36 KV/cm for the virgin sample and 2.22 KV/cm after $10^{10}$ cycles. The amount of $V_{center}$ shift between zero and $10^{10}$ cycles is −3.58 kV/cm for 2196 Å film, i.e., 0.079 V.

Figure 32:
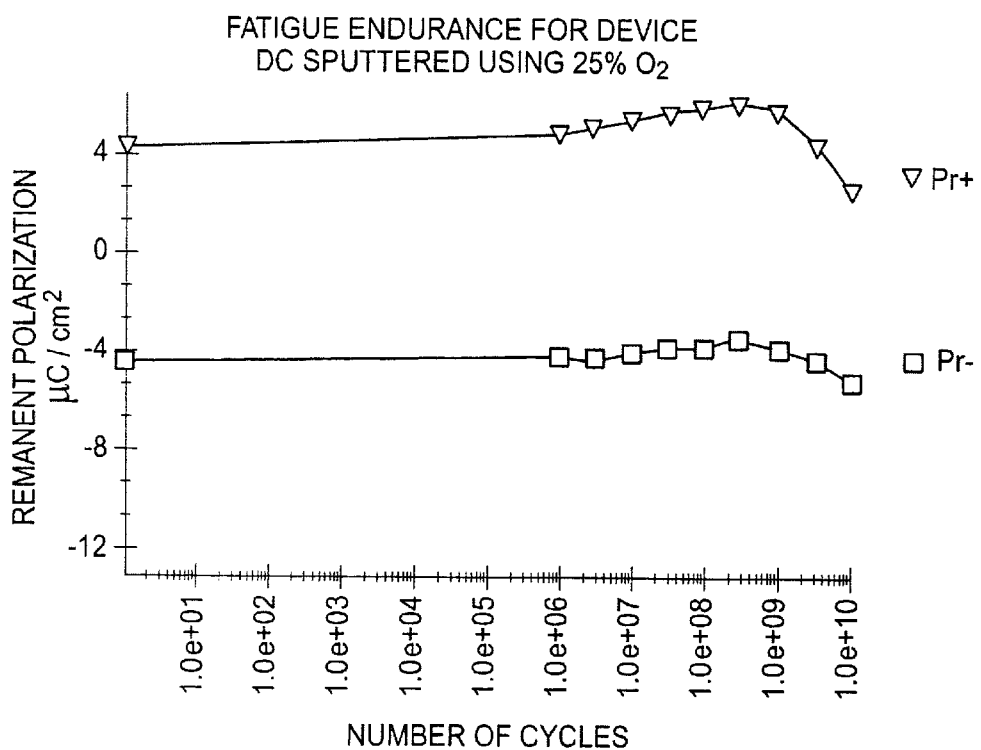
FIG. 32 depicts a polarization fatigue endurance curve obtained from a layered superlattice material interposed between a pair of platinum oxide electrodes that were deposited by DC sputtering in a reactive carrier gas mixture containing a 25% partial pressure of oxygen and a 75% partial pressure of argon.

FIG. 32 depicts a polarization hysteresis curve for a representative capacitor selected from Sample #SS10-5, which was produced under 25% oxygen. Elipsometer measurements confirmed that the ferroelectric layer 420 was 2250 Å thick. Overall polarization declined 9.0% from the virgin sample at 8.80 µC/cm² to a value of 8.01 µC/cm² after $10^{10}$ cycles. The fatigued sample was less severely imprinted, as reflected by a $V_{center}$ value of −1.58 KV/cm for the virgin sample and 0.27 KV//cm after $10^{10}$ cycles. The amount of $V_{center}$ shift between zero and $10^{10}$ cycles was −1.85 kV/cm for 2250 Å film, i.e., 0.042 V.

Figure 33:
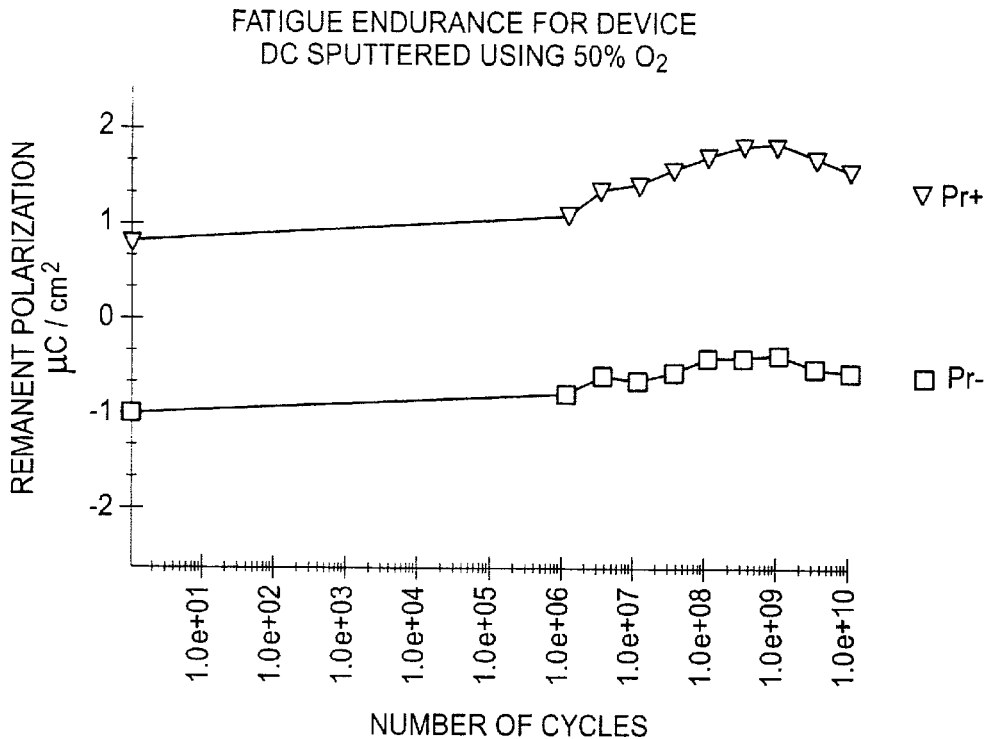
FIG. 33 depicts a polarization fatigue endurance curve obtained from a layered superlattice material interposed between a pair of platinum oxide electrodes that were deposited by DC sputtering in a reactive carrier gas mixture containing a 50% partial pressure of oxygen and a 50% partial pressure of argon.

FIG. 33 depicts a polarization hysteresis curve for a representative capacitor selected from Sample#SS10-6, which was produced under 50% oxygen. Elipsometer measurements confirmed that the ferroelectric layer 420 was 2350 Å thick. Overall polarization increased 22.3% from the virgin sample at 1.75 µC/cm² to a value of 2.14 µC/cm² after $10^{10}$ cycles. The fatigued sample was more severely imprinted, as reflected by a $V_{center}$ value of −1.64 KV/cm for the virgin sample and 3.62 KV/cm after $10^{10}$ cycles. Amount of $V_{center}$ shift is −5.26 kV/cm for 2350 Å film, i.e., 0.12 V.

Figure 34:
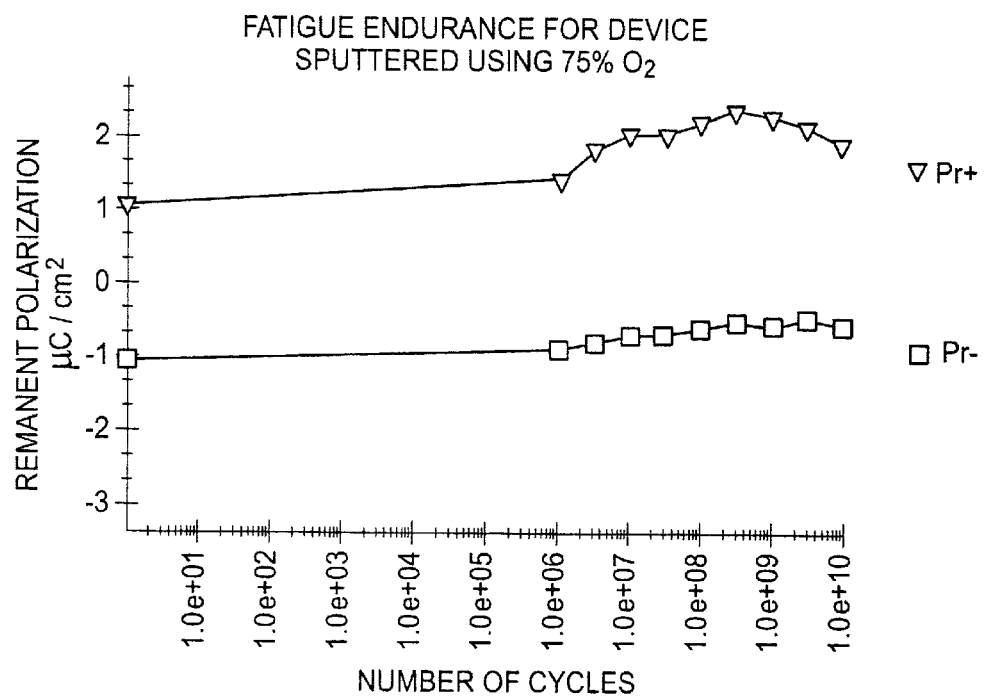
FIG. 34 depicts a polarization fatigue endurance curve obtained from a layered superlattice material interposed between a pair of platinum oxide electrodes that were deposited by DC sputtering in a reactive carrier gas mixture containing a 75% partial pressure of oxygen and a 25% partial pressure of argon.

FIG. 34 depicts a polarization hysteresis curve for a representative capacitor selected from Sample #SS10-7, which was produced under 75% oxygen. Elipsometer measurements confirmed that the ferroelectric layer 420 was 2350 Å thick. Overall polarization increased 18.4% from the virgin sample at 2.12 µC/cm² to a value of 2.51 µC/cm² after $10^{10}$ cycles. The fatigued sample was more severely imprinted, as reflected by a $V_{center}$ values of −1.07 KV/cm for the virgin sample and 3.85 KV//cm after $10^{10}$ cycles. Amount of $V_{center}$ shift is −4.92 kV/cm for 2350 Å film, i.e., 0.12 V.

The foregoing results show that DC sputter deposition with oxygen partial pressures ranging from zero to 25% result in the highest polarization, the lowest fatigue, and the lowest imprint, with 12.5 oxygen being an approximate optimum concentration.

EXAMPLE 7

Physical Analysis

Auger electron spectroscopic data was obtained from representative capacitors on each sample that is listed in Table 3 of Example 6. These measurements were performed to analyze the depth profile of major atoms observed in the capacitors to detect platinum, titanium, and oxygen content for the respective samples. Auger measurements were performed using an acceleration voltage of 3 kV and a current of 1×10⁻⁷ A. Additionally, secondary ion mass spectroscopic equipment used cesium as the primary ion to analyze the ferroelectric layer components of strontium, bismuth, niobium as secondary ions in representative capacitors from each sample listed in Table 3 of Example 6. Tunneling electron micrographs representing an approximate 200K× magnification were also prepared from each sample.

Figure 35:
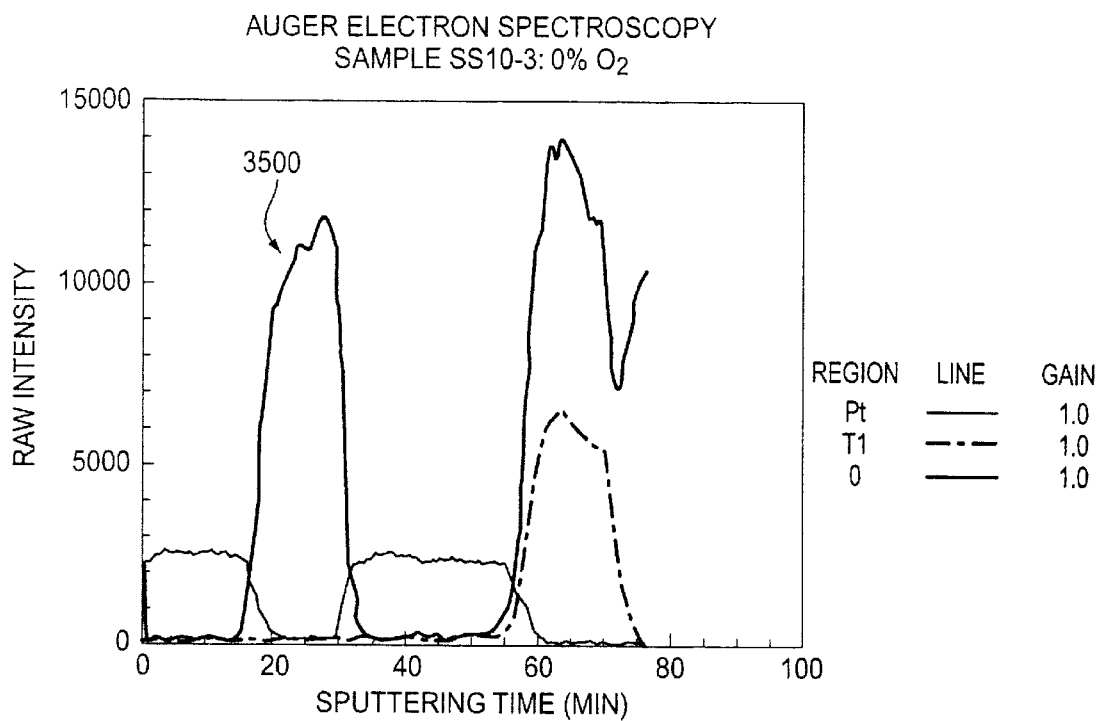
FIG. 35 presents auger electron spectroscopic data taken from a sample corresponding to the sample of FIG. 31.
Figure 36:
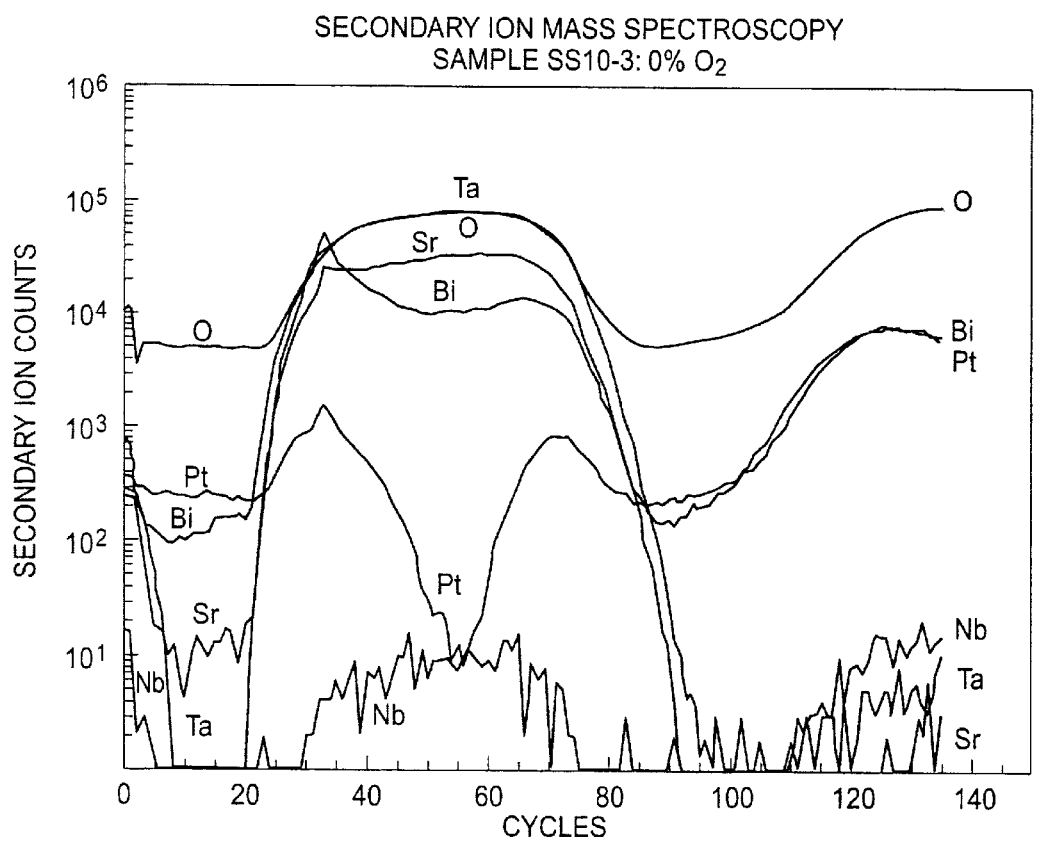
FIG. 36 presents secondary ion mass spectroscopic data taken from a sample corresponding to the sample of FIG. 31.

FIG. 35 is graph depicting auger electron spectroscopic data that was obtained from the sample #SS10-3, which was sputtered using zero percent partial pressure of oxygen. FIG. 36 provides corresponding secondary ion mass spectroscopic data for sample #SS10-3. FIGS. 35 and 36 confirm that oxygen deficiency in the ferroelectric layer is compensated by oxygen from electrodes, especially around surface region highlighted by arrows of 3500 in FIG. 35. FIGS. 35 and 35 also demonstrate that relatively little interlayer diffusion occurred at the interface between the ferroelectric layer and the platinum electrode.

Figure 37:
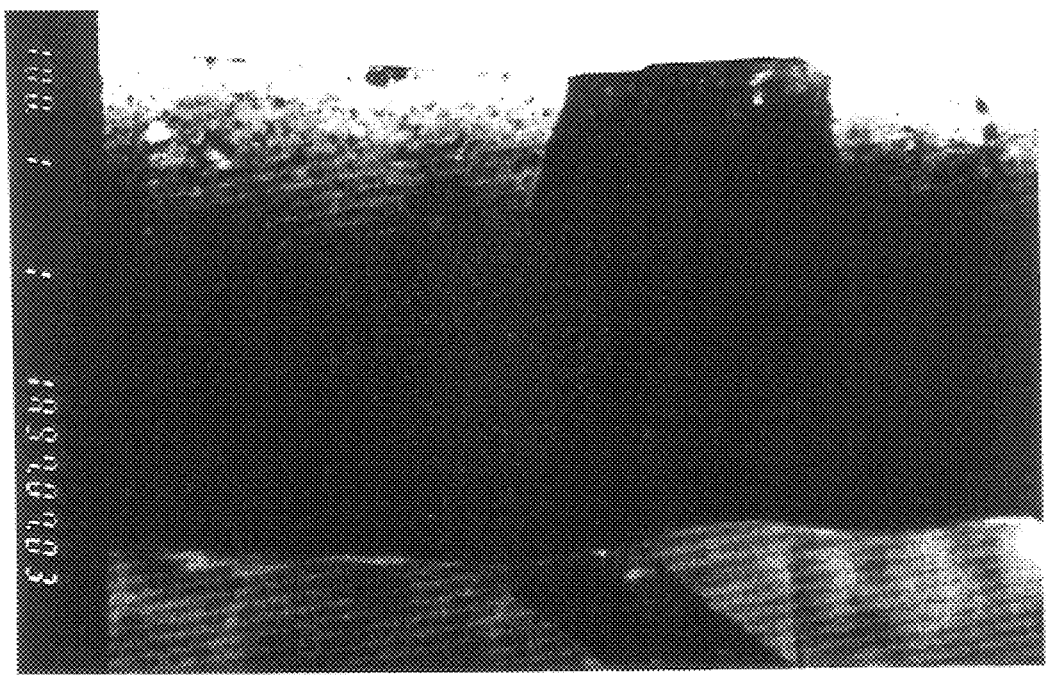
FIG. 37 presents a transmission electron microscopic photograph taken from a sample corresponding to the sample of FIG. 31.

FIG. 37 provides a transmission electron microscopic photograph (TEM) of sample #SS10-3 demonstrating that the electrode had a columnar structure that is typical of platinum electrodes in the prior art.

Figure 38:
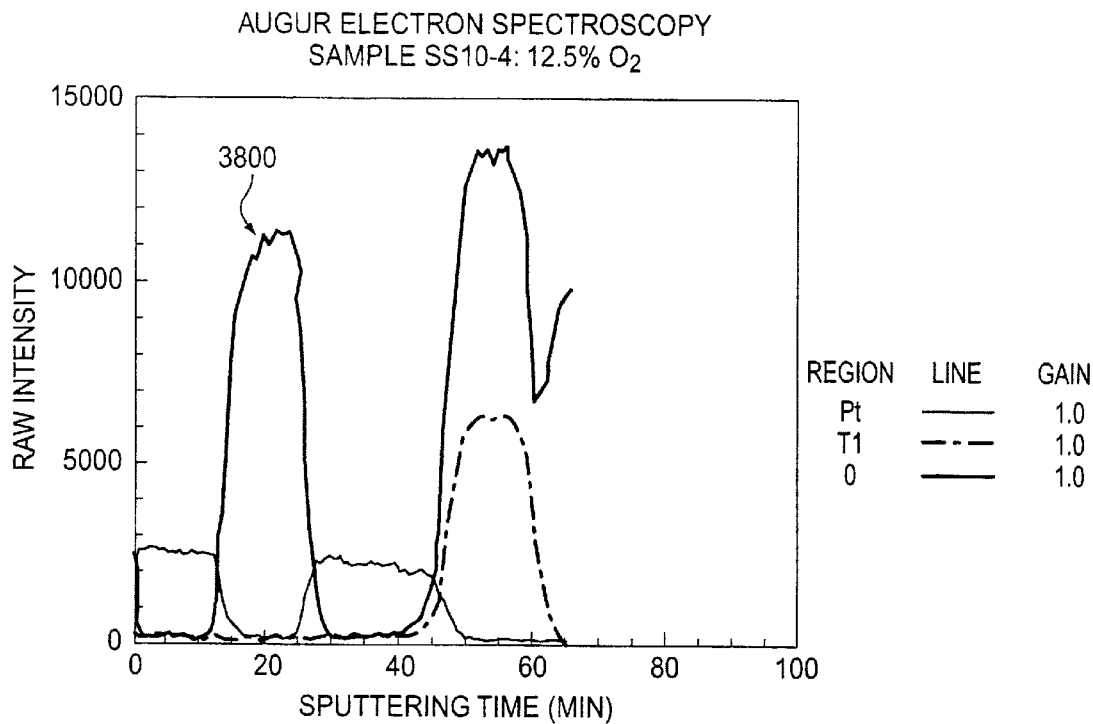
FIG. 38 presents auger electron spectroscopic data taken from a sample corresponding to the sample of FIG. 29.
Figure 39:
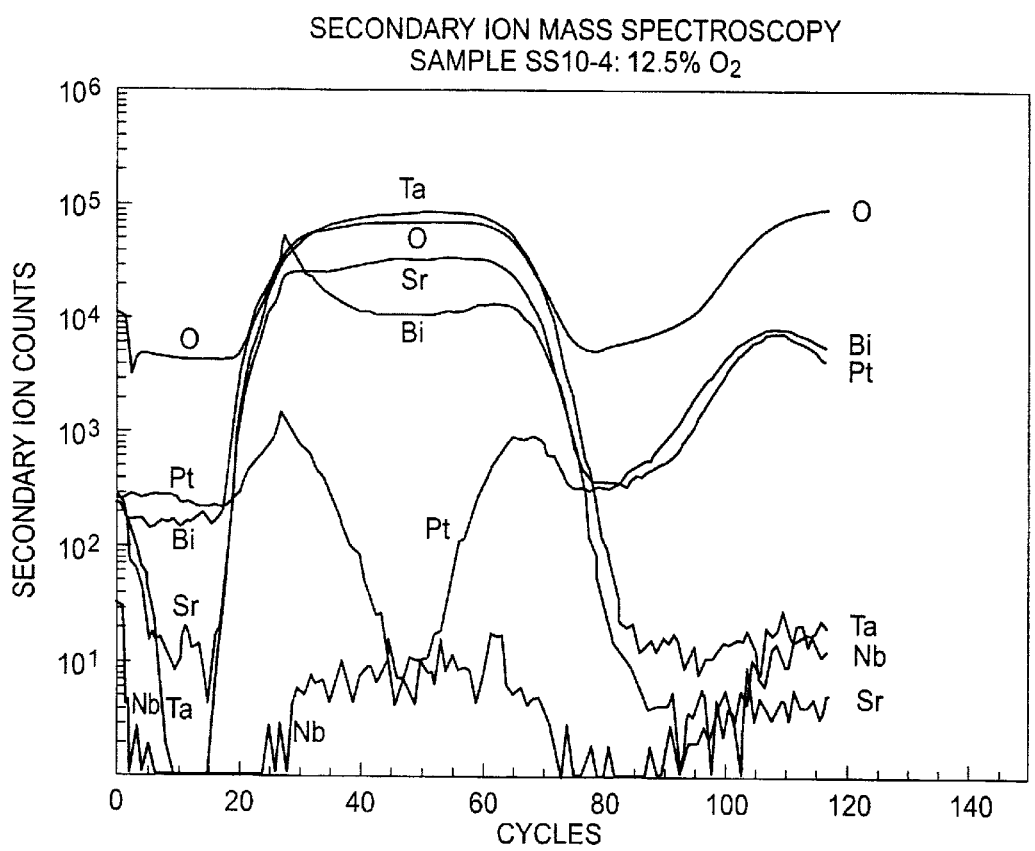
FIG. 39 presents secondary ion mass spectroscopic data taken from a sample corresponding to the sample of FIG. 29.

FIG. 38 is graph depicting auger electron spectroscopic data that was obtained from the sample #SS10-4, which was sputtered using 12.5% partial pressure of oxygen. FIG. 39 provides corresponding secondary ion mass spectroscopic data for sample #SS10-4. FIGS. 38 and 39 confirm that oxygen deficiency in the ferroelectric layer is compensated by oxygen from electrodes, especially around surface region highlighted by arrows of 3800 in FIG. 38. FIGS. 38 and 39 also demonstrate that relatively little interlayer diffusion occurred at the interface between the ferroelectric layer and the platinum electrode.

Figure 40:
FIG. 40 presents a transmission electron microscopic photograph taken from a sample corresponding to the sample of FIG. 29.

FIG. 40 provides a transmission electron microscopic photograph (TEM) of sample #SS10-4 demonstrating that the electrodes had a small grain size with few lattice defects that distinguishes these electrodes from the columnar structure of FIG. 37.

Figure 41:
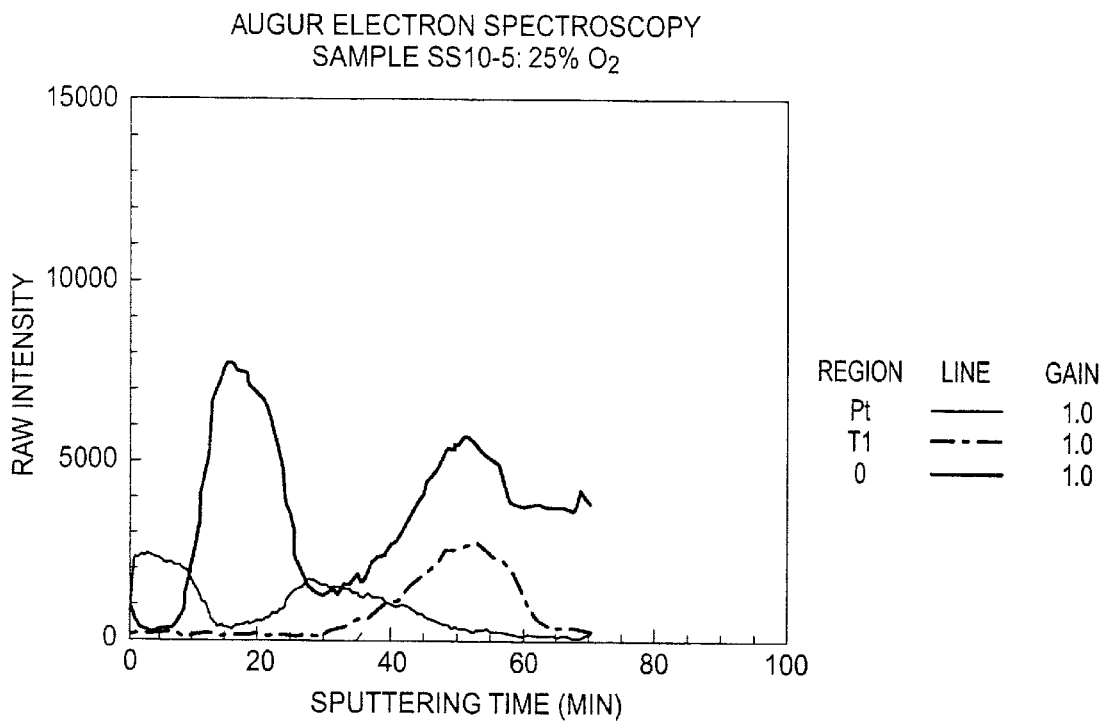
FIG. 41 presents auger electron spectroscopic data taken from a sample corresponding to the sample of FIG. 32.
Figure 42:
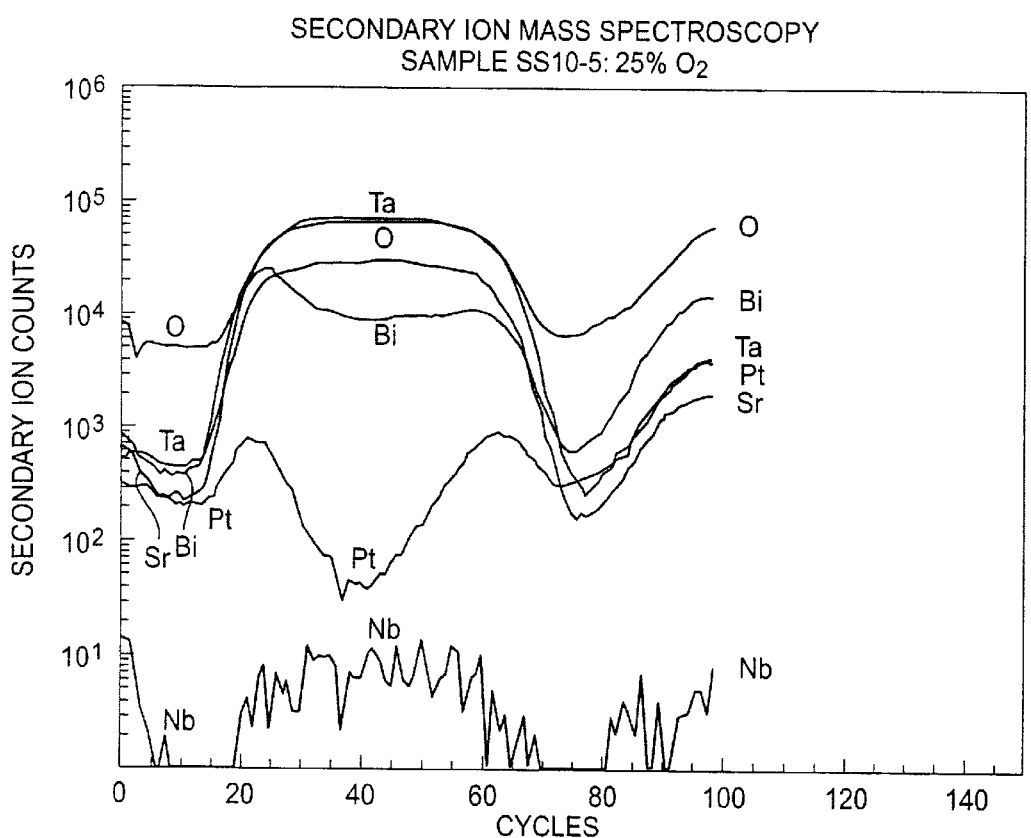
FIG. 42 presents secondary ion mass spectroscopic data taken from a sample corresponding to the sample of FIG. 32.

FIG. 41 is graph depicting auger electron spectroscopic data that was obtained from the sample #SS10-5, which was sputtered using 25% partial pressure of oxygen. FIG. 42 provides corresponding secondary ion mass spectroscopic data for sample #SS10-5. FIGS. 41 and 42 demonstrate a different atomic distribution than exists for the corresponding FIGS. 35–40, i.e., titanium from the bottom electrode diffused through the first conductive film to reach the interface of the ferroelectric layer. Also, the ferroelectric components of strontium, bismuth, niobium, and tantalum diffused into the electrodes for the SS10-5 sample. It is understood that the oxygen observed in electrodes region in the is from the metal oxide ferroelectric layer.

Figure 43:
FIG. 43 presents a transmission electron microscopic photograph taken from a sample corresponding to the sample of FIG. 32.

FIG. 43 provides a transmission electron microscopic photograph (TEM) of sample #SS10-5 demonstrating that the electrode had a small grain size that distinguishes the electrode shown in FIG. 37, and that the grain size is increasingly larger and has a greater number of defects that the electrode shown in FIG. 40.

Figure 44:
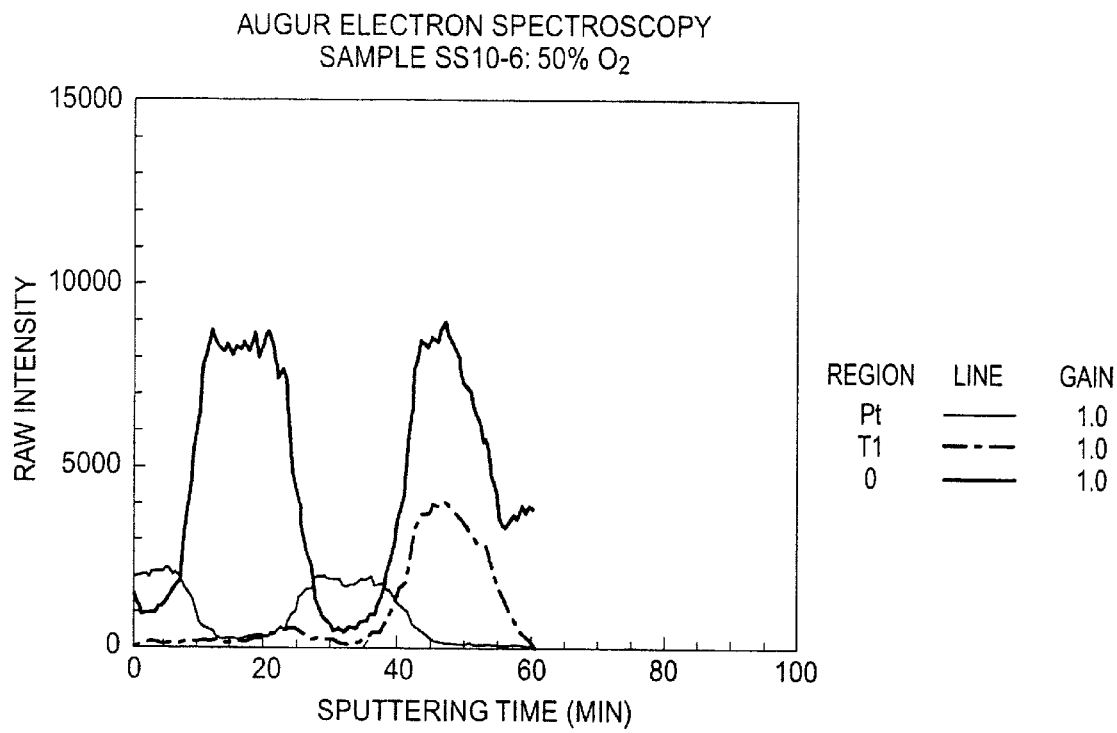
FIG. 44 presents auger electron spectroscopic data taken from a sample corresponding to the sample of FIG. 33.
Figure 45:
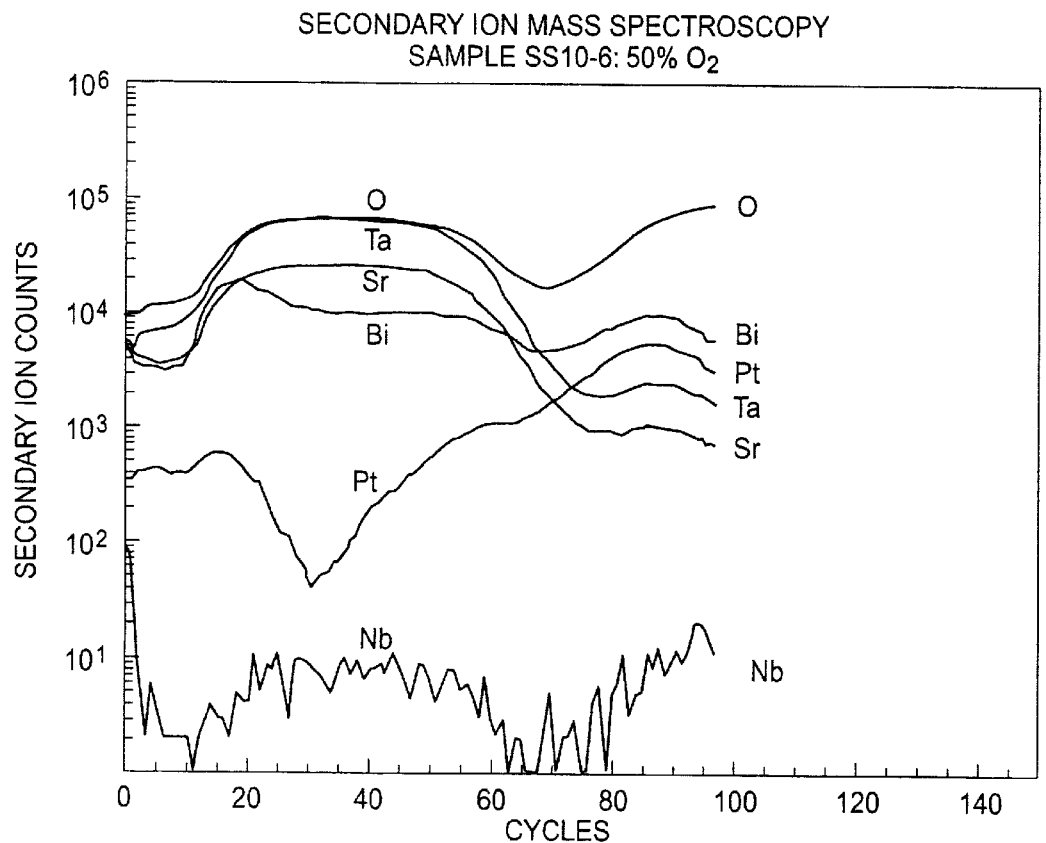
FIG. 45 presents secondary ion mass spectroscopic data taken from a sample corresponding to the sample of FIG. 33.

FIG. 44 is graph depicting auger electron spectroscopic data that was obtained from the sample #SS10-6, which was sputtered using 50% partial pressure of oxygen. FIG. 45 provides corresponding secondary ion mass spectroscopic data for sample #SS10-6. FIGS. 44 and 45 demonstrate a different atomic distribution than exists for the corresponding FIGS. 35–40, i.e., titanium from the bottom electrode diffused through the first conductive film to reach the interface of the ferroelectric layer. Also, the ferroelectric components of strontium, bismuth, niobium, and tantalum diffused into the electrodes for the SS10-6 sample. It is understood that the oxygen observed in electrodes region in the is from the metal oxide ferroelectric layer.

Figure 46:
FIG. 46 presents a transmission electron microscopic photograph taken from a sample corresponding to the sample of FIG. 33.

FIG. 46 provides a transmission electron microscopic photograph (TEM) of sample #SS10-6 demonstrating that the electrode had a small grain size that distinguishes the electrode shown in FIG. 37, and that the grain size is increasingly larger and has a greater number of defects that the electrodes shown in FIGS. 40 and 43.

Figure 47:
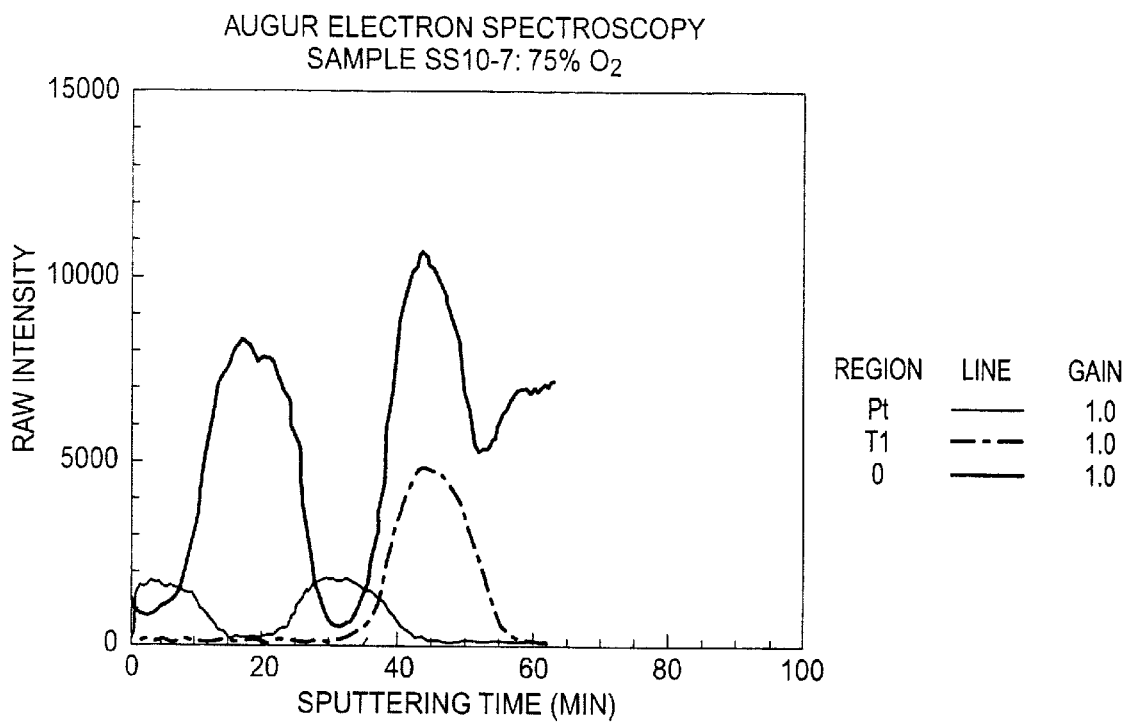
FIG. 47 presents auger electron spectroscopic data taken from a sample corresponding to the sample of FIG. 34.

FIG. 47 is graph depicting auger electron spectroscopic data that was obtained from the sample #SS10-7, which was sputtered using 75% partial pressure of oxygen. FIG. 48 provides corresponding secondary ion mass spectroscopic data for sample #SS10-7. FIGS. 47 and 48 demonstrate a different atomic distribution than exists for the corresponding FIGS. 35–40, i.e., titanium from the bottom electrode diffused through the first conductive film to reach the interface of the ferroelectric layer. Also, the ferroelectric components of strontium, bismuth, niobium, and tantalum diffused into the electrodes for the SS10-7 sample. It is understood that the oxygen observed in electrodes region in the is from the metal oxide ferroelectric layer.

Figure 49:
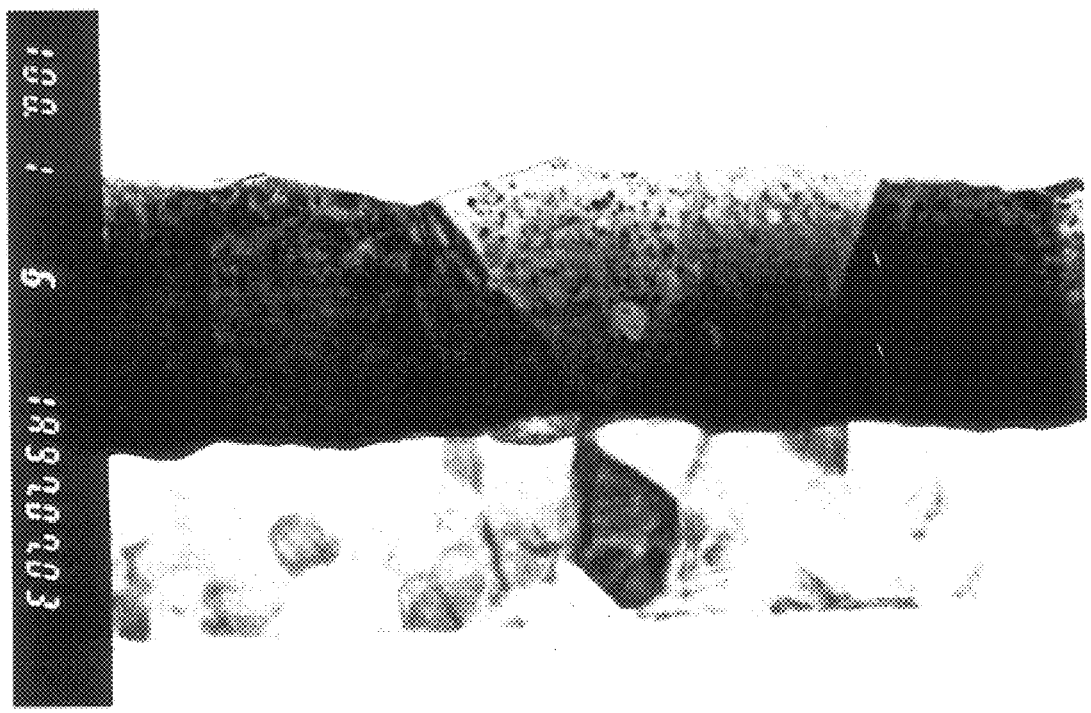
FIG. 49 presents a transmission electron microscopic photograph taken from a sample corresponding to the sample of FIG. 34.

FIG. 49 provides a transmission electron microscopic photograph (TEM) of sample #SS10-7 demonstrating that the electrode had a small grain size that distinguishes the electrode shown in FIG. 37, and that the grain size is increasingly larger and has a greater number of defects that the electrodes shown in FIGS. 40, 43, and 46.

Table 4 shows average secondary ion counts in platinum electrode by SIMS with $O_2$ as the primary ion for five samples based upon FIGS. 36, 39, 42, 45, and 48.

TABLE 4

| Sample | Average secondary ion counts |
|---|---|
| #SS10-3<br>0% $O_2$<br>Ar:9.7E-3 | $1.3 \times 10^1$ |
| #SS10-4<br>12.5% $O_2$<br>Ar:9.0E-3, $O_2$:1.3E-3 | $2.2 \times 10^1$ |
| #SS10-5<br>25% $O_2$<br>Ar:8.1E-3, $O_2$:2.7E-3 | $3.3 \times 10^2$ |
| #SS10-6<br>50% $O_2$<br>Ar:5.7E-3, $O_2$:5.7E-3 | $6.1 \times 10^3$ |
| #SS10-7<br>75% $O_2$<br>Ar:2.9E-3, $O_2$:8.0E-3 | $9.2 \times 10^3$ |

From this data, based upon the crystallinity and morphology analysis of the TEMs depicted in FIGS. 37, 40, 43, 46, and 49, oxygen inclusion in platinum electrode is preferably from $1.3 \times 10^1$ to $3.3 \times 10^2$.

Regarding crystallinity of platinum compared among these samples, FIG. 37 shows that platinum which was DC sputtered without oxygen partial pressure shows a typical columnar structure and the greatest grain size among all samples. FIG. 40 demonstrates that platinum which was DC sputtered with 12.5% oxygen partial pressure shows a granular-like structure and the smallest grain size. For the other DC sputtered samples that were sputtered with more than 25% oxygen partial pressure (see FIGS. 43, 46, and 49), grain size is still smaller than sample SS10-3; however, numerous lattice defects are observed in the grains and these defects are caused by diffusion from the ferroelelctric layer, as confirmed by the spectroscopy results from FIGS. 35, 36, 38, 39, 41, 42, 44, 45, 47, and 48.

EXAMPLE 8

Electrical Performance of Ultra Thin Films

A plurality of ferroelectric capacitor devices 400 were prepared on a 6" silicon wafer 402 using a layered superlattice material precursor solution that was purchased on commercial order from Kojundo Chemical Corporation of Saitama, Japan. Chemical analysis of the solution confirmed that it had a 0.2 moles per liter concentration of metal hexanoates in n-octanes based upon a molar concentration of the empirical formula $SrBi_{2.4}(Nb_{0.35}Ta_{1.65})O_{9.6}$. Thus, the solution had a stoichiometric excess amount of bismuth, as compared to a Class A Smolenskii formula (see above) wherein m=2. The discussion below makes reference to FIGS. 4 and 11.

Process step P1102 (see FIG. 11) was commenced by placing a commercially available silicon wafer placing in a diffusion furnace to grow oxide layer 404 (see FIG. 4). The substrate including oxide layer 404 was placed in a DC magnetron sputtering equipment of PVD-300 made by Unifilm Technology Corporation for completion of step P1104. An adhesion layer 406 of titanium oxide were formed in step P1104. A platinum metal layer 410 was DC sputtered to a thickness of 2793 Å. The carrier gas mixture in the vacuum chamber included a 1.3 E-3 Torr partial pressure of oxygen ($O_2$) and a 9.0 E-3 Torr partial pressure of argon, i.e., a 12.5% partial pressure of oxygen to stabilize plasma, and total pressure of these conditions is relatively high pressure compared to typical argon only plasma. Sputtering was performed using 153 V and 0.53 A over 3.8 minutes.

Step P1108 was performed by placing the wafer in a liquid source misted chemical deposition machine of Primaxx2F Standalone LSMCD System made by Submicron Systems Incorporation of Allentown, Pa., and depositing a liquid precursor film with rotating the wafer at 15 rpm while a venturi-type atomizer was used to form mist and then introduced into deposition chamber by carrier gas of nitrogen after charging the mist by corona system using oxygen gas with 4 kV of high voltage.

Figure 50:
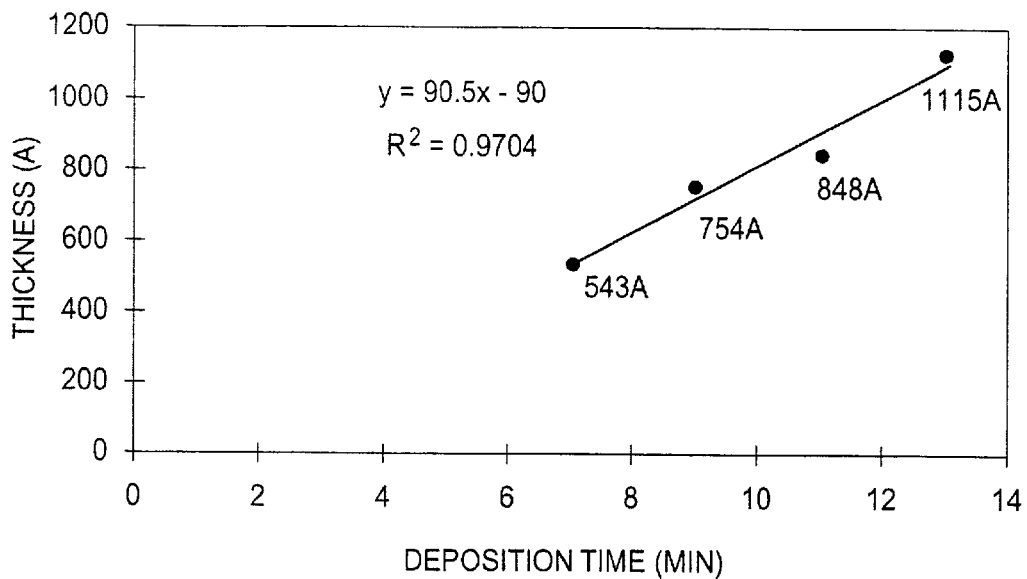
FIG. 50 depicts a deposition rate curve for liquid deposition of a layered superlattice material.

FIG. 50 depicts a layer growth from deposition rate requiring seven minutes to form a ferroelectric thin film equivalent to 543 Å after high temperature annealing. The subsequent data points represent different samples that were processed in an identical manner for different times. The resultant data points were subjected to a first order least squares linear fit, which developed the linear correlation $Y=90.5x-90$, wherein the curve fit had an $R^2$ correlation factor of 0.9704 indicating a very good first order linear fit to the data.

In step P1110, the wafer was moved into the low temperature processing module and placed on a 150° C. hot plate for two minutes in air then removed and immediately placed on a second hot plate at 260° C. for four minutes to dry the liquid precursor.

In step P1112, the dried liquid precursor residue was soft baked in oxygen-content atmosphere such as $O_2$, $N_2O$, or $O_3$, preferably under vacuum up to 1 Torr at rapid thermal processing module at 650° C. for sixty seconds. Prior to this soft baking, the wafer is more preferably soft baked in nitrogen-content atmosphere such as $N_2$ or $N_2O$ at 400° C. for sixty seconds just enough to start forming strontium bismuth niobium tantalate of metal oxide nuclei, and not to form metal carbonates to reduce thermal budget and suppress roughness.

A first anneal P1116 of the soft baked precursor residue was conducted in a diffusion furnace under an oxygen flow at 525° C. for one hundred and four minutes including a twenty-two minute ramp into the furnace and a twenty-two minute ramp out of the furnace. The wafer was removed from the furnace and stood to room temperature.

About 2000 Å thick platinum was sputtered into place during step P1118. DC sputtering was performed to deposit second conductive film 424 without depositing adhesion layer 426 to form top electrode 422. Platinum metal was DC sputtered using a carrier gas mixture including 9.0 E-3 Torr Ar and 1.3 E-3 Torr $O_2$. DC sputtering conditions included the use of 151 V and 0.53 A for 2.6 minutes to obtain a 1911 Å thickness of the sputter-deposited metal.

In step P1120, the top electrode 422 was covered with a conventional spin-on negative photoresist. The wafer including the resist was baked in air on a hot plate at 100° C. for five minutes, after which time the wafer was exposed to ultraviolet radiation under mask for 1.8 seconds to pattern the resist. The resist was developed for 1.5 minutes in an n-butyl acetate rinse under nitrogen atmosphere. The developed pattern was hard baked on a hot plate at 140° C. for five minutes. The wafer was next subjected to ion mill etching. The resist was removed by conventional plasma stripping.

Step P1122 included annealing the top electrode in an oxygen diffusion furnace at 750° C. for one hundred and four minutes including a twenty two minute ramp into the furnace and a twenty two minute ramp out of the furnace. As a result of this process, the final wafer held a plurality of square ferroelectric capacitors 400 each having a 6940 $\mu m^2$ surface area.

A representative test capacitor was selected from the wafer that was produced in the sample. An elipsometer was used to calculate thickness of the ferroelectric layer 420 at 543 Å. Polarization curves were measured using a triangular waveform having an amplitude of 1.5 V at 25° C., as were stored capacitors at 75° C. at initial, 1,10, and $10^2$ hours.

Figure 51:
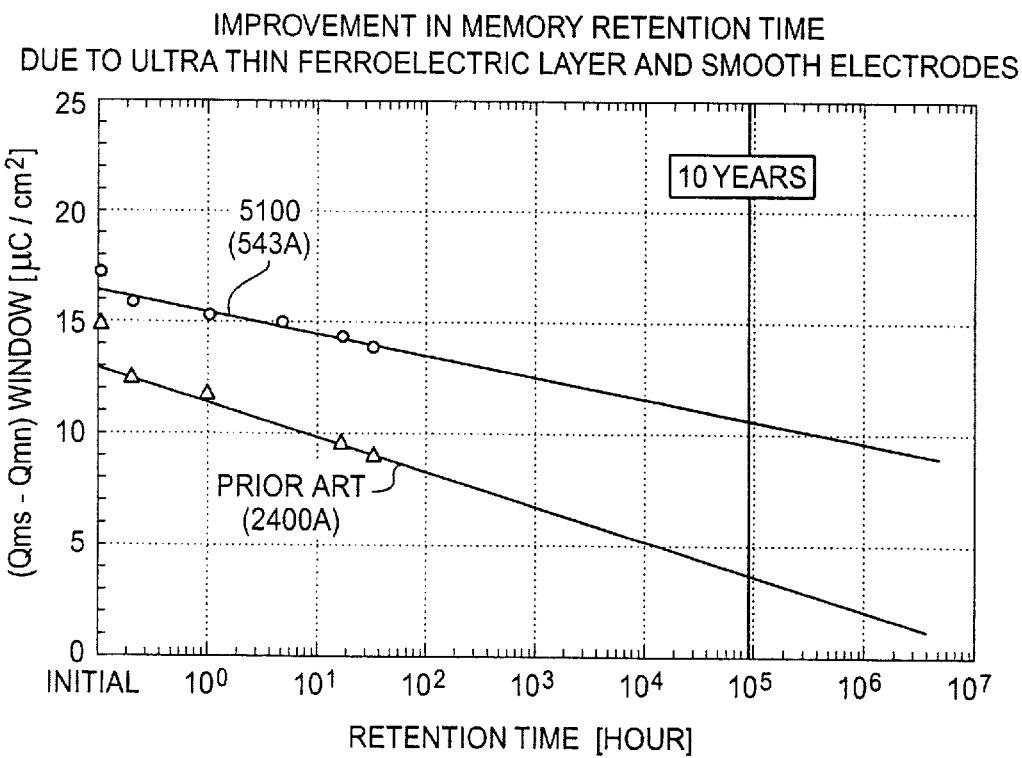
FIG. 51 presents a comparison showing improvement in memory retention time by use of the present invention including smooth electrodes and an ultra thin layered superlattice ferroelectric film versus a thicker thin film device that was made by prior art methods.

FIG. 51 shows the retention measurement results for an ultra thin ferroelectric layer corresponding to curve 5100, which represents remanent polarization data obtained from the 543 Å thick sample. The X-axis represents the stored time. The Y-axis represents remanent polarization. As compared to a prior art sample of comparable ferroelectric material 2400 Å thick, polarization retention characteristics improved both the initial value and degradation gradient. The virgin ferroelectric capacitor corresponding to curve 5100 at one cycle had a 2Pr polarization of 17 $\mu C/cm^2$. Polarization after 10 year of storage was extrapolated to a value of 11 $\mu C/cm^2$.

EXAMPLE 9

Electrical Performance of LSMCD Thin Films

A plurality of wafers were prepared in an identical manner with respect to Example 9, except that the deposition time of step P1108 was varied to form a ferroelectric thin film equivalent to 1400 Å after high temperature annealing.

A representative test capacitor was selected from the wafer that was produced in the sample. An elipsometer was used to calculate thickness of the ferroelectric layer 420 at 1400 Å. Time dependent dielectric breakdown ("TDDB") measurements were taken using applied electric fields of 360, 400, and 460 kV/cm having an amplitude of 1.5 V at 125° C.

Figure 52:
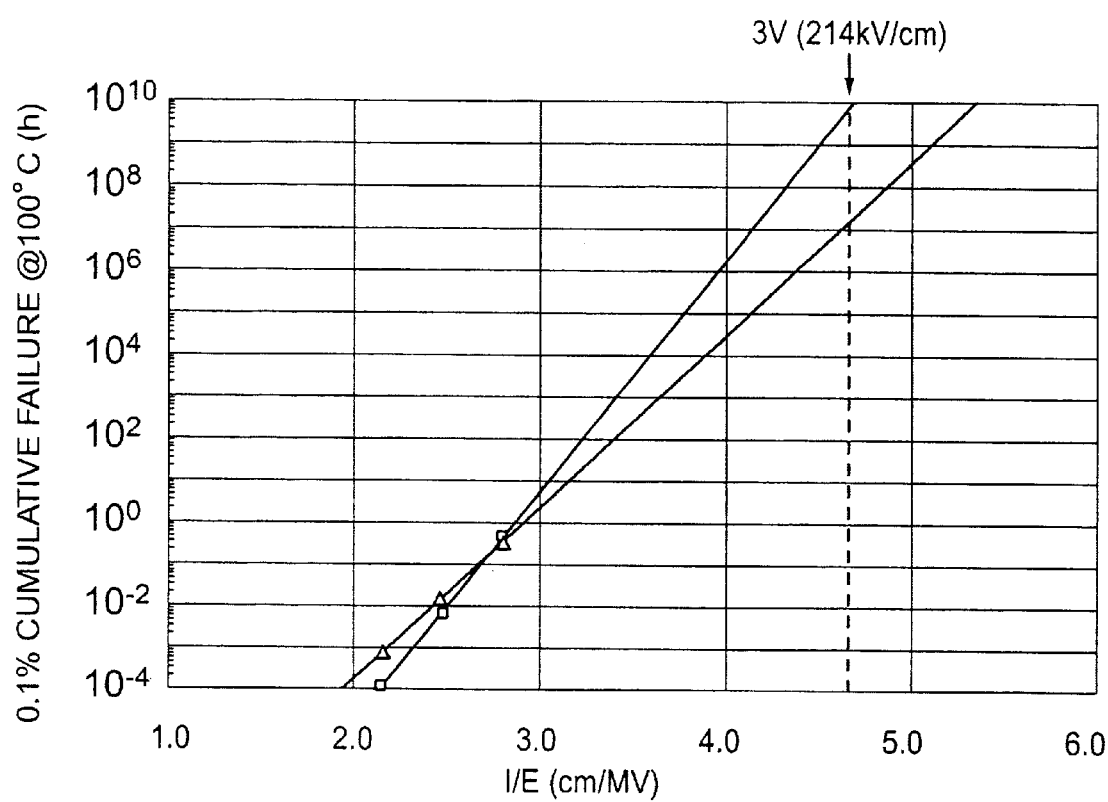
FIG. 52 presents a comparison showing improvement in time dependent dielectric breakdown data by use of the present invention including smooth electrodes and a layered superlattice ferroelectric film made by liquid source misted chemical deposition versus the same thick film device that was made by spin-on method.

FIG. 52 shows the TDDB characteristics for an LSMCD deposited ferroelectric layer corresponding to the sample. The X-axis represents the inverse of the electric field. The Y-axis represents the 0.1% cumulative failures. As compared to a prior art sample made by comparable ferroelectric material deposition method of spin-on, the LSMCD film has high reliability of 100 times longer life at 3 V, i.e., under an applied electric field of 214 kV/cm.

Those skilled in the art will understand that the preferred embodiments described above may be subjected to apparent modifications without departing from the true scope and spirit of the invention. The inventors, accordingly, hereby state their intention to rely upon the Doctrine of Equivalents, in order to protect their full rights in the invention.

What is claimed is:

1. A method of sputter depositing an essentially smooth electrode for use in integrated circuit thin film ferroelectric memory devices, said method comprising the steps of:

placing an integrated circuit substrate into a vacuum chamber in a DC sputtering device;

introducing a carrier gas mixture composed of a noble gas and a reactive gas species into said vacuum chamber; wherein said reactive gas species is twenty-five percent or less of said carrier gas;

using a DC glow discharge to sputter a conductive thin film using a target metal material onto said substrate in the presence of said carrier gas mixture, said target metal material being selected from the group consisting of platinum, palladium, rhodium, iridium, ruthenium, blends thereof, and oxides thereof; and completing said integrated circuit memory device to include said conductive thin film as a conductive element in said integrated circuit.

2. The method as set forth in claim 1 wherein said noble gas is argon.

3. The method as set forth in claim 1 wherein said reactive gas species is oxygen.

4. The method as set forth in claim 1 wherein said reactive gas species is ozone.

5. The method as set forth in claim 1 wherein said reactive gas species includes hydrogen and oxygen.

6. The method as set forth in claim 1 including a step of maintaining said carrier gas mixture ranging from $9 \times 10^{-3}$ to $2 \times 10^{-2}$ Torr during said step of using said DC glow discharge.

7. The method as set forth in claim 1 including a step of forming a adhesion layer underneath said conductive film.

8. The method as set forth in claim 7 wherein said forming said adhesion layer comprising the steps of:

placing an integrated circuit substrate into a vacuum chamber in a DC sputtering device;

introducing a carrier gas mixture comprised of a noble gas and a reactive gas species into said vacuum chamber;

using a DC glow discharge to sputter an adhesion layer using a target metal selected from said group onto said substrate in the presence of said carrier gas mixture.

9. The method as set forth in claim 8 wherein said noble gas is argon.

10. The method as set forth in claim 8 wherein said reactive gas species is oxygen.

11. The method as set forth in claim 8 wherein said reactive gas species is ozone.

12. The method as set forth in claim 8 wherein said reactive gas species includes hydrogen and oxygen.

13. The method as set forth in claim 8 wherein said reactive gas species has a partial pressure ranging from 1.5% to 50% of said carrier gas.

14. The method as set forth in claim 8 including a step of maintaining said carrier gas mixture ranging from $9 \times 10^{-3}$ to $2 \times 10^{-2}$ Torr during said step of using said glow discharge.

15. The method as set forth in claim 1 including a step of forming a barrier layer underneath said conductive film.

16. The method as set forth in claim 15 wherein said forming said barrier layer comprising the steps of:

placing an integrated circuit substrate into a vacuum chamber in a DC sputtering device;

introducing a second carrier gas mixture comprised of a second noble gas and a second reactive gas species into said vacuum chamber;

using a second DC glow discharge to sputter a barrier layer using a target metal onto said substrate in the presence of said second carrier gas mixture, said target metal being selected from the group consisting of titanium, titanium tungstate, tantalum, tantalum silicide, tungsten, tungsten silicide, molybdenum, molybdenum silicide, palladium, rhodium, iridium, and ruthenium.

17. The method as set forth in claim 16 wherein said second noble gas is argon.

18. The method as set forth in claim 16 wherein said second reactive gas species is nitrogen.

19. The method as set forth in claim 16 wherein said second reactive gas species is $N_2O$.

20. The method as set forth in claim 16 wherein said second reactive gas species is oxygen.

21. The method as set forth in claim 16 wherein said second reactive gas species is ozone.

22. The method as set forth in claim 16 wherein said second reactive gas species is a mixture of hydrogen and oxygen.

23. The method as set forth in claim 16 wherein said second reactive gas species being selected at least two from the group consisting of nitrogen, $N_2O$, oxygen, ozone, and hydrogen.

24. The method as set forth in claim 17 wherein said second reactive gas species is less than 70% of said second carrier gas.

25. The method as set forth in claim 17 including a step of maintaining said second carrier gas mixture ranging from $9 \times 10^{-3}$ to $2 \times 10^{-2}$ Torr during said step of using said second glow discharge.

26. The method as set forth in claim 1 including a step of forming a ferroelectric layer over said conductive film.

27. The method as set forth in claim 26 wherein said ferroelectric layer is a layered superlattice material.

28. The method as set forth in claim 26 wherein said step of forming said ferroelectric layer includes depositing a liquid precursor to form a film of said precursor on said integrated circuit substrate.

29. The method as set forth in claim 28 wherein said step of depositing said liquid precursor is followed by a step of drying said precursor film at a temperature less than 400° C. to provide a dried precursor residue.

30. The method as set forth in claim 29 wherein said step of drying baking said film of said precursor is followed by steps of soft baking said dried precursor residue using RTP at an RTP temperature ranging from 525° C. to 675° C. for a period of time ranging from thirty seconds to five minutes to provide a soft baked precursor residue; and annealing said soft baked precursor residue in a diffusion furnace under oxygen at an anneal temperature ranging from 450° C. to 650° C.

31. The method as set forth in claim 26 including, after said step of forming said ferroelectric layer, the steps of:

introducing a third carrier gas mixture comprised of a third noble gas and a third reactive gas species into said vacuum chamber; and using a third DC glow discharge to sputter a second conductive film using a target metal material selected from said group onto said substrate in the presence of said third carrier gas mixture.

32. The method as set forth in claim 31 wherein said third noble gas is argon.

33. The method as set forth in claim 31 wherein said third reactive gas species is oxygen.

34. The method as set forth in claim 31 wherein said third reactive gas species is ozone.

35. The method as set forth in claim 31 wherein said third reactive gas species is a mixture of hydrogen and oxygen.

36. The method as set forth in claim 31 including a step of maintaining said third carrier gas mixture ranging from $9 \times 10^{-3}$ to $2 \times 10^{-2}$ Torr during said step of using said third glow discharge.

37. The method as set forth in claim 31 including, after said step of forming said second conductive film, the steps of:

introducing a fourth carrier gas mixture comprised of a fourth noble gas and a fourth reactive gas species into said vacuum chamber;

using a fourth DC glow discharge to sputter a second adhesion layer from a target metal onto said substrate in the presence of said fourth carrier gas mixture, said target metal being selected from the group consisting of titanium, tantalum, palladium, rhodium, iridium, and ruthenium.

38. The method as set forth in claim 37 wherein said fourth noble gas is argon.

39. The method as set forth in claim 37 wherein said fourth reactive gas species is oxygen.

40. The method as set forth in claim 37 wherein said fourth reactive gas species is ozone.

41. The method as set forth in claim 37 wherein said fourth reactive gas species is a mixture of hydrogen and oxygen.

42. The method as set forth in claim 37 wherein said fourth reactive gas species ranges from twenty-five to fifty percent of said fourth carrier gas.

43. The method as set forth in claim 37 including a step of maintaining said fourth carrier gas mixture ranging from $9 \times 10^{-3}$ to $2 \times 10^{-2}$ Torr during said step of using said fourth glow discharge.

44. An integrated circuit device produced according to the method of claim 1.

45. A method of making a ferroelectric capacitor with sputter deposition of essentially smooth electrodes for use in integrated circuit memory devices, said method comprising the steps of;

placing an integrated circuit substrate into a vacuum chamber in a DC sputtering device;

introducing a carrier gas mixture comprised of a noble gas and a reactive gas species into said vacuum chamber; wherein said reactive gas species is twenty-five percent or less of said carrier gas;

using a DC glow discharge to sputter a first conductive thin film using a first target metal material onto said substrate in the presence of said carrier gas mixture, said first target metal material being selected from the group consisting of platinum, palladium, rhodium, iridium, ruthenium, blends thereof, and oxides thereof, coating said conductive film with a liquid precursor capable of yielding a layered superlattice material upon drying and rapid thermal processing of said liquid precursor:

drying said liquid precursor at a temperature of less than 400° C. to provide a dried precursor residue;

rapid thermal processing said dried precursor residue at an RTP temperature ranging from 525° C. to 675° C. for a period of time ranging from thirty seconds to five minutes to provide a smooth surface atop said dried precursor residue;

using a DC glow discharge to sputter a second conductive thin film using a second target metal material onto said substrate in the presence of said carrier gas mixture, said second target metal material being selected from the group consisting of platinum, palladium, rhodium, iridium, ruthenium, blends thereof, and oxides thereof;

annealing layers resulting from said above steps;

patterning layers resulting from said above steps to provide a ferroelectric capacitor; and thereafter completing said integrated circuit memory device to include said first and second conductive thin films as conductive elements in said Integrated circuit.

46. The method as set forth in claim 45 wherein said step of coating is performed by liquid source misted chemical deposition.

47. The method as set forth in claim 45 wherein said step of coating said conductive film includes coating said conductive film with a sufficient amount of liquid precursor to yield a layered superlattice material having a thickness ranging from 300 Å to 2500 Å.

48. The method as set forth in claim 45 wherein said step of coating said conductive film includes coating said conductive film with a sufficient amount of liquid precursor to yield a layered superlattice material having a thickness ranging from 300 Å to 1100 Å.

49. The method as set forth in claim 45 wherein said step of coating said conductive film includes coating said conductive film with a sufficient amount of liquid precursor to yield a layered superlattice material having a thickness ranging from 400 Å to 1000 Å.

50. The method as set forth in claim 45 wherein said step of coating said conductive film includes coating said conductive film with a sufficient amount of liquid precursor to yield a layered superlattice material having a thickness ranging from 500 Å to 800 Å.

51. The method as set forth in claim 45 wherein said step of rapid thermal processing said dried precursor residue is preformed at an RTP temperature ranging from 625° C. to 650° C.

52. The method as set forth in claim 45 wherein said step of rapid thermal processing said dried precursor residue is preformed at an RTP temperature of 650° C.

53. The method as in claim 45 wherein said step of annealing precedes said step of patterning.

54. The method as in claim 45 wherein said step of annealing follows said step of patterning.

55. The method as in claim 45 wherein said step of annealing includes a furnace anneal step.

56. The method as in claim 45 wherein said step of annealing comprises heating to a temperature higher than the temperature of said rapid thermal processing step.

57. The method as in claim 45 wherein said step of annealing comprises a plurality of anneals at different temperatures.

58. The method as in claim 57 wherein said plurality of anneals are performed before said step of sputtering a second conductive thin film.

59. The method as in claim 57 wherein one of said anneals is performed before said step of sputtering said second conductive thin film and one of said anneals is performed after said step of sputtering said second conductive thin film.

60. The method of claim 57 wherein said anneal steps include a lower temperature anneal at a temperature lower than the temperature of said rapid thermal processing step and a higher temperature anneal at a temperature higher than said rapid thermal processing step.

61. The method of claim 60 wherein said lower temperature anneal is performed before said step of sputtering a second conductive thin film and said higher temperature anneal is performed after said step of sputtering said second conductive thin film.

62. The method as in claim 26 wherein said step of forming a ferroelectric layer includes the steps of rapid thermal processing said ferroelectric layer, annealing said ferroelectric layer, and patterning said ferroelectric layer.

63. The method as in claim 62 wherein said step of annealing precedes said step of patterning.

64. The method as in claim 62 wherein said step of annealing follows said step of patterning.

65. The method as in claim 62 wherein said step of annealing includes a furnace anneal step.

66. The method as in claim 62 wherein said step of annealing comprises heating to a temperature higher than the temperature of said rapid thermal processing step.

67. The method as in claim 62 wherein said step of annealing comprises a plurality of anneals at different temperatures.

68. The method as in claim 67 and further including the step of forming a second conductive thin film over said ferroelectric layer, and wherein said plurality of anneals are performed before said step of forming a second conductive thin film.

69. The method as in claim 67 and further including the step of forming a second conductive thin film over said ferroelectric layer, and wherein one of said plurality of anneals is performed before said step of forming said second conductive thin film and one of said plurality of anneals is performed after said step of forming said second conductive thin film.

70. The method of claim 67 wherein said plurality of anneal steps include a lower temperature anneal at a temperature lower than the temperature of said rapid thermal processing step and a higher temperature anneal at a temperature higher than said rapid thermal processing step.

71. The method of claim 70 and further including the step of forming a second conductive thin film over said ferroelectric layer, and wherein said lower temperature anneal is performed before said step of forming a second conductive thin film and said higher temperature anneal is performed after said step of forming said second conductive thin film.

* * * * *